(12) United States Patent
Kim et al.

(10) Patent No.: US 9,741,947 B2
(45) Date of Patent: Aug. 22, 2017

(54) ORGANOMETALLIC COMPLEX AND ORGANIC LIGHT-EMITTING DEVICE INCLUDING THE SAME

(71) Applicants: Samsung Display Co., Ltd., Yongin, Gyeonggi-Do (KR); Korea Advanced Institute of Science and Technology, Daejeon (KR)

(72) Inventors: Youn-Sun Kim, Yongin (KR); Yun-Ho Lee, Daejeon (KR); Seul-Ong Kim, Yongin (KR); Dong-Woo Shin, Yongin (KR); Jung-Sub Lee, Yongin (KR); Naoyuki Ito, Yongin (KR); Chang-Woong Chu, Yongin (KR); Yeong-Eun Kim, Daejeon (KR)

(73) Assignees: Samsung Display Co., Ltd., Yongin-si (KR); Korea Advanced Institute of Science and Technology, Daejeon (KR)

( * ) Notice: Subject to any disclaimer, the term of this patent is extended or adjusted under 35 U.S.C. 154(b) by 708 days.

(21) Appl. No.: 14/231,224

(22) Filed: Mar. 31, 2014

(65) Prior Publication Data
US 2015/0162553 A1    Jun. 11, 2015

(30) Foreign Application Priority Data
Dec. 9, 2013    (KR) .................. 10-2013-0152639

(51) Int. Cl.
| | | |
|---|---|---|
| H01L 51/54 | (2006.01) | |
| C09K 11/06 | (2006.01) | |
| H01L 51/00 | (2006.01) | |
| H01L 51/50 | (2006.01) | |

(52) U.S. Cl.
CPC .......... *H01L 51/0091* (2013.01); *C09K 11/06* (2013.01); *C09K 2211/188* (2013.01); *H01L 51/0058* (2013.01); *H01L 51/0061* (2013.01); *H01L 51/0085* (2013.01); *H01L 51/0087* (2013.01); *H01L 51/5016* (2013.01)

(58) Field of Classification Search
CPC .................................................. H01L 51/0091
See application file for complete search history.

(56) References Cited

U.S. PATENT DOCUMENTS

| | | | |
|---|---|---|---|
| 2005/0221115 A1 | 10/2005 | Tsuboyama et al. | |
| 2006/0172146 A1* | 8/2006 | Igarashi et al. | C07D 471/22 428/690 |
| 2007/0111026 A1 | 5/2007 | Deaton et al. | |
| 2007/0267959 A1 | 11/2007 | Ragini et al. | |
| 2008/0064893 A1 | 3/2008 | Peters et al. | |
| 2008/0199731 A1 | 8/2008 | Vogler et al. | |
| 2010/0041880 A1* | 2/2010 | Becker et al. | C07D 487/18 540/471 |
| 2010/0217023 A1 | 8/2010 | Peters et al. | |
| 2011/0009605 A1* | 1/2011 | De Leon-Rodriguez | A61K 49/0002 534/10 |
| 2011/0089818 A1 | 4/2011 | Peters et al. | |
| 2012/0056162 A1 | 3/2012 | Wada et al. | |
| 2014/0091264 A1* | 4/2014 | Pan et al. | H01L 51/0059 252/519.21 |

FOREIGN PATENT DOCUMENTS

| | | | |
|---|---|---|---|
| JP | 2007-324309 A | 12/2007 | |
| JP | 2011-213643 A | 10/2011 | |
| KR | 10-2012-0025366 A | 3/2012 | |
| WO | WO 2012/163480 A1 | * 12/2012 | |

OTHER PUBLICATIONS

Shakir et al., "Synthesis, characterization of complexes of Co(II), Ni(II), Cu(II) and Zn(II) with 12-membered Schiff base tetraazomacrocyclic ligand . . . ", Spectrochimica Acta Part A, vol. 65, pp. 490-496 (2006).*

Harkins, Seth B., et al., A Highly Emissive $Cu_2N_2$ Diamond Core Complex Supported by a [PNP]⁻ Ligand, J. Am. Chem. Soc. 2005, 127, American Chemical Society, published on Jan. 27, 2005, received in Nov. 16, 2004, pp. 2030-2031.

Igawa, Satoshi, et al., Highly Efficient green organic light-emitting diodes containing luminescent tetrahedral copper complexes, J. Mater. Chem. C, 2013, 1, Journal of Materials Chemistry C, The Royal Society of Chemistry, received on Sep. 25, 2012, accepted on Oct. 31, 2012, DOI 10.1039/c2tc00263a, pp. 542-551.

Baldo, M.A. et al., Excitonic Singlet-Triplet Ratio in a Semiconducting Organic Thin Film, The American Physical Society, Physical Review B, vol. 60, No. 20, Nov. 15, 1999, pp. 14422-14428.

* cited by examiner

*Primary Examiner* — Marie R. Yamnitzky
(74) *Attorney, Agent, or Firm* — Lewis Roca Rothgerber Christie LLP

(57) ABSTRACT

An organometallic complex represented by Formula 1 below and an organic light-emitting device including the same:

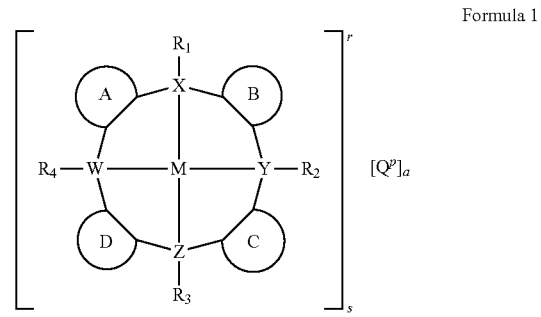

Formula 1

Formula 1 is as defined in the specification.

15 Claims, 1 Drawing Sheet

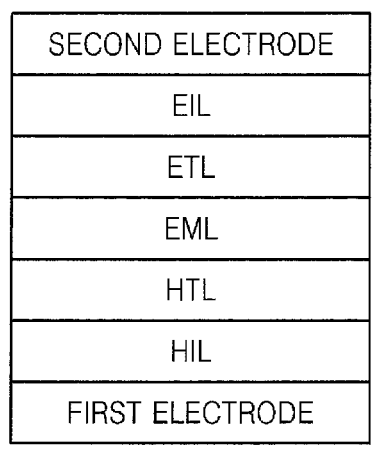

ORGANOMETALLIC COMPLEX AND ORGANIC LIGHT-EMITTING DEVICE INCLUDING THE SAME

CROSS-REFERENCE TO RELATED APPLICATION

This application claims priority to and the benefit of Korean Patent Application No. 10-2013-0152639, filed on Dec. 9, 2013, in the Korean Intellectual Property Office, the disclosure of which is incorporated herein in its entirety by reference.

BACKGROUND

1. Field

The following description relates to an organometallic complex and an organic light-emitting device including the same.

2. Description of the Related Art

Organic light-emitting devices, which are self-emitting devices, have the characteristics of a wide viewing angle, excellent contrast, quick response, high brightness, and excellent driving voltage, and can provide multicolored images.

A general organic light-emitting device has a structure including a substrate, and an anode, a hole transport layer (HTL), an emission layer (EML), an electron transport layer (ETL), and a cathode which are sequentially stacked on the substrate. Here, the HTL, the EML, and the ETL are organic thin films respectively formed of organic compounds.

Driving principle of the organic light-emitting device having the structure as described above is as follows.

When a voltage is applied between the anode and the cathode, holes injected from the anode move to the EML via the HTL, and electrons injected from the cathode move to the EML via the ETL. Carriers (such as holes and electrons) recombine in the EML to generate excitons. When the excitons drop from an excited state to a ground state, light is emitted.

There is still a need to develop a material having excellent electrical stability, higher charge transporting ability or higher light-emitting capability, and higher glass transition temperature and capable of preventing crystallization compared to conventional organic single-molecule materials.

SUMMARY

Aspects according to one or more embodiments of the present invention are directed toward compounds suitable for a light-emitting material having excellent electrical properties, light-emitting capability and high glass transition temperature, and capable of preventing crystallization; and organic light-emitting devices having high luminous efficiency, low driving voltage, high brightness, and long lifespan.

Additional aspects will be set forth in part in the description which follows and, in part, will be apparent from the description, or may be learned by practice of the presented embodiments.

According to one or more embodiments of the present invention, an organometallic complex is represented by Formula 1 below.

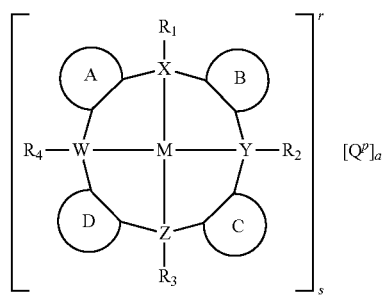

Formula 1

In Formula 1,

M is a metal;

A, B, C, and D are each independently a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group;

X, Y, Z, and W are each independently C, O, N, P, S, or As;

$R_1$ to $R_4$ are each independently a lone pair electron; =O (i.e., the organometallic complex may not include each or any of $R_1$ to $R_4$); a hydrogen atom; a deuterium atom; a halogen atom; formaldehyde; a cyano group; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a substituted or unsubstituted $C_1$-$C_{60}$ heteroaryl group; an amino group substituted with a $C_6$-$C_{60}$ aryl group or a $C_1$-$C_{60}$ heteroaryl group; a $C_3$-$C_{60}$ alkylsilyl group; a $C_3$-$C_{60}$ arylsilyl group; a $C_3$-$C_{60}$ alkylarylsilyl group; or a substituted or unsubstituted $C_6$-$C_{60}$ condensed polycyclic group;

Q is a counter ion;

a is an integer from 0 to 4;

p is a charge number of Q and an integer from −4 to 4;

r is a charge number of the complex of Formula 1 and an integer from −4 to 4; and s is an integer from 1 to 4.

According to one or more embodiments of the present invention, an organic light-emitting device includes a first electrode, a second electrode, and an organic layer between the first electrode and the second electrode, wherein the organic layer includes the organometallic complex.

According to one or more embodiments of the present invention, a flat panel display device includes the organic light-emitting device, wherein the first electrode of the organic light-emitting device is electrically connected to a source electrode or a drain electrode of a thin-film transistor.

BRIEF DESCRIPTION OF THE DRAWINGS

These and/or other aspects will become apparent and more readily appreciated from the following description of the embodiments, taken in conjunction with the accompanying drawing in which:

The drawing is a schematic cross-sectional view of an organic light-emitting device according to an embodiment of the present invention.

DETAILED DESCRIPTION

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

An organometallic complex according to an embodiment of the present invention is represented by Formula 1 below.

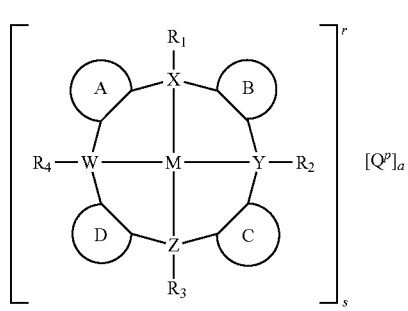

Formula 1

In Formula 1,

M is a metal;

A, B, C, and D are each independently a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group;

X, Y, Z, and W are each independently C, O, N, P, S, or As;

$R_1$ to $R_4$ are each independently a lone pair electron; =O; a hydrogen atom; a deuterium atom; a halogen atom; formaldehyde; a cyano group; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a substituted or unsubstituted $C_1$-$C_{60}$ heteroaryl group; an amino group substituted with a $C_6$-$C_{60}$ aryl group or a $C_1$-$C_{60}$ heteroaryl group; a $C_3$-$C_{60}$ alkylsilyl group; a $C_3$-$C_{60}$ arylsilyl group; a $C_3$-$C_{60}$ alkylarylsilyl group; or a substituted or unsubstituted $C_6$-$C_{60}$ condensed polycyclic group;

Q is a counter ion;

a is an integer from 0 to 4;

p is a charge number of Q and an integer from −4 to 4;

r is a charge number of the complex of Formula 1 and an integer from −4 to 4; and s is an integer from 1 to 4.

Light-emitting materials are classified into fluorescent materials using (utilizing) excitons in a singlet state (S1) and phosphorescent materials using (utilizing) excitons in a triplet state (T1) depending on light emission mechanism thereof. These light-emitting materials are used (utilized) to form an emission layer alone or in a state of being doped in a host material, and a statistical generation ratio between the singlet excitons and triplet excitons is 1:3 (as disclosed in Baldo, et al., Phys. Rev. B, 1999, 60, 14422, the entire content of which is incorporated herein by reference).

In addition, there is a delayed fluorescent material that is a light-emitting material in which triplet excitons are converted into singlet excitons, while energy gaps between excitons in the singlet or triplet state is reduced or minimized, thereby contributing to the overall light emission.

An organic light-emitting device including an iridium complex phosphorescent dopant has a high external quantum efficiency (EQE(%)) of 20% or higher. However, since much research has been carried out using (utilizing) Group IV and Group V transition metals, development of materials is limited, and heavy metal contained in organometallic phosphorescent materials is expensive and may cause environmental pollution. A copper complex that emits both phosphorescence and delayed fluorescence may replace a noble metal complex and is expected to exhibit high efficiency in an organic light-emitting device. However, although some organic light-emitting devices using (utilizing) a copper complex having similar properties as those using (utilizing) an iridium complex have been reported recently, external quantum efficiency (EQE(%)) is less than 5% due to a low photoluminescence quantum efficiency (PLAY) of the copper complex. Thus, there is still a need to develop various economical and highly efficient organometallic complexes including Cu as a core metal.

An organic light-emitting device including the organometallic complex of Formula 1 according to an embodiment of the present invention has high efficiency.

Substituents of Formula 1 will be described in more detail.

According to an embodiment of the present invention, M of Formula 1 may be a transition metal. The transition metal is not particularly limited and may be a Group 3 to 12 transition metal. For example, M may be copper (Cu), gold (Au), or silver (Ag).

According to another embodiment of the present invention, A, B, C, and D of Formula 1 may be each independently one of Formulae 2a to 2f below.

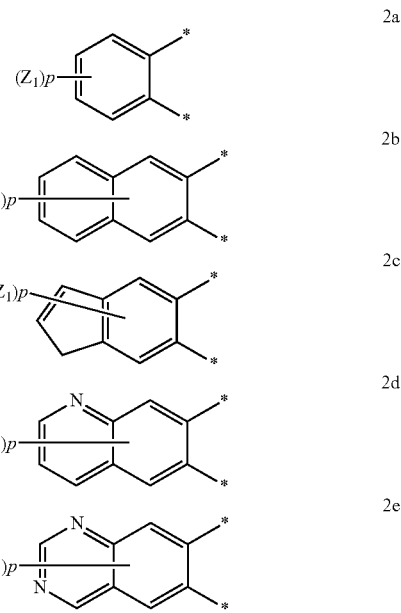

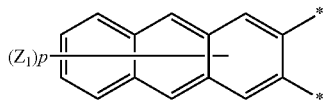

In Formulae 2a and 2f, $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxyl group, or a carboxyl group;

p is an integer from 1 to 8; and * is a binding site with X, Y, Z, or W.

According to another embodiment of the present invention, X, Y, Z, and W of Formula 1 may be each independently N or P.

According to another embodiment of the present invention, $R_1$ to $R_4$ of Formula 1 may be each independently a lone pair electron or one of Formulae 3a to 3f below.

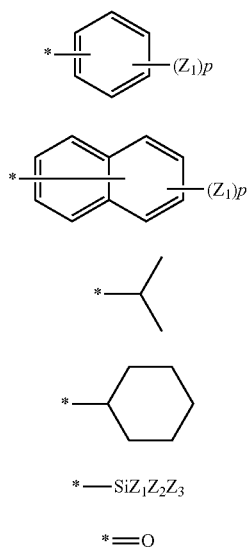

In Formulae 3a and 3f, $Z_1$ to $Z_3$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxyl group, or a carboxyl group;

p is an integer from 1 to 7; and * is a binding site.

According to another embodiment of the present invention, both a and r of Formula 1 may be 0.

According to another embodiment of the present invention, the organometallic complex of Formula 1 may be represented by Formula 2 below.

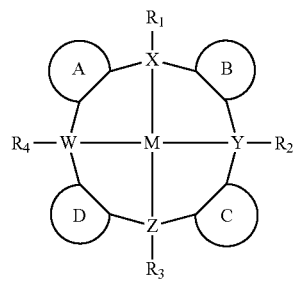

In Formula 2, M, A, B, C, D, X, Y, Z, W, and $R_1$ to $R_4$ are as defined above.

According to another embodiment of the present invention, the organometallic complex of Formula 1 may be a delayed fluorescent material.

Delayed fluorescent material is a light-emitting material in which triplet excitons are converted into singlet excitons, while energy gaps between excitons in the singlet or triplet state is reduced or minimized, thereby contributing overall light emission.

Hereinafter, substituents used (utilized) herein will now be described in more detail. In this regard, the numbers of carbon atoms in the substituents are presented only for illustrative purposes and do not limit the characteristics of the substituents.

Substituents that are not defined herein are defined as known in the art.

The unsubstituted $C_1$-$C_{60}$ alkyl group may be linear or branched. Examples of the alkyl group include, but are not limited to, methyl, ethyl, propyl, isobutyl, sec-butyl, pentyl, iso-amyl, hexyl, heptyl, octyl, nonanyl, and dodecyl. At least one hydrogen atom of the alkyl group may be substituted with a deuterium atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, a $C_4$-$C_{16}$ heteroaryl group, or an organosilyl group.

The unsubstituted $C_2$-$C_{60}$ alkenyl group refers to a hydrocarbon group having at least one carbon-carbon double bond within or at a terminal position of the alkyl group. Examples of the $C_2$-$C_{60}$ alkenyl group include ethenyl, propenyl, and butenyl. At least one hydrogen atom of the unsubstituted $C_2$-$C_{60}$ alkenyl group may be substituted with the same substituents as described above with reference to the alkyl group.

The unsubstituted $C_2$-$C_{60}$ alkynyl group refers to a hydrocarbon group having at least one carbon-carbon triple bond within or at a terminal position of the alkyl group. Examples of the unsubstituted $C_2$-$C_{60}$ alkynyl group include acetylene, propylene, phenylacetylene, naphthylacetylene, isopropylacetylene, t-butylacetylene, and diphenylacetylene. At least one hydrogen atom of the unsubstituted $C_2$-$C_{60}$ alkynyl group may be substituted with the same substituents as described above with reference to the alkyl group.

The unsubstituted $C_3$-$C_{60}$ cycloalkyl group refers to a $C_3$-$C_{60}$ cyclic alkyl group. At least one hydrogen atom of the cycloalkyl group may be substituted with the same substituent group described above with reference to the $C_1$-$C_{60}$ alkyl group.

The unsubstituted $C_1$-$C_{60}$ alkoxy group refers to a group having a structure of —OA in which A is an unsubstituted $C_1$-$C_{60}$ alkyl group as described above. Examples of the $C_1$-$C_{60}$ alkoxy group include methoxy, ethoxy, propoxy, isopropyloxy, butoxy, and pentoxy. At least one hydrogen atom of the unsubstituted $C_1$-$C_{60}$ alkoxy group may be substituted with the same substituents as described above with reference to the alkyl group.

The unsubstituted $C_6$-$C_{60}$ aryl group refers to a carbocyclic aromatic system containing at least one ring. Two or more rings may be fused to each other or linked to each other via a single bond. The term 'aryl' refers to an aromatic system, such as phenyl, naphthyl, or anthracenyl. At least one hydrogen atom of the aryl group may be substituted with the same substituents described with reference to the $C_1$-$C_{60}$ alkyl group.

Examples of the substituted or unsubstituted $C_6$-$C_{60}$ aryl group include a phenyl group, a $C_1$-$C_{10}$ alkylphenyl group (for example, ethylphenyl group), a halophenyl group (for example, o-, m-, and p-fluorophenyl group, and dichlorophenyl group), a cyanophenyl group, a dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, an o-, m-, and p-tolyl group, an o-, m-, and p-cumenyl group, a mesityl group, a phenoxyphenyl group, an ($\alpha,\alpha$-dimethylbenzene) phenyl group, an (N,N'-dimethyl)aminophenyl group, an (N,N'-diphenyl)aminophenyl group, a pentalenyl group, an indenyl group, a naphthyl group, a halonaphthyl group (for example, fluoronaphthyl group), a $C_1$-$C_{10}$ alkylnaphthyl group (for example, methylnaphthyl group), a $C_1$-$C_{10}$ alkoxynaphthyl group (for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted $C_1$-$C_{60}$ heteroaryl group includes one, two, three, or four hetero atoms selected from the group consisting of N, O, P and S. Two or more rings may be fused to each other or linked to each other via a single bond. Examples of the unsubstituted $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. In addition, at least one hydrogen atom of the heteroaryl group may be substituted with the same substituents described with reference to the $C_1$-$C_{60}$ alkyl group.

Examples of the unsubstituted $C_6$-$C_{60}$ aryloxy group is a group represented by —OA$_1$. Here, A$_1$ is a $C_6$-$C_{60}$ aryl group. Examples of the aryloxy group include a phenoxy group. In addition, at least one hydrogen atom of the aryloxy group may be substituted with the same substituents described above with reference to the $C_1$-$C_{60}$ alkyl group.

Examples of the unsubstituted $C_6$-$C_{60}$ arylthio group is a group represented by —SA$_1$. Here, A$_1$ is a $C_6$-$C_{60}$ aryl group. Examples of the arylthio group include a benzenethio group and a naphthylthio group. In addition, at least one hydrogen atom of the arylthio group may be substituted with the same substituents described with reference to the $C_1$-$C_{60}$ alkyl group.

The unsubstituted $C_6$-$C_{60}$ condensed polycyclic group is a substituent including at least two rings in which at least one aromatic ring and at least one non-aromatic ring are fused to each other or a substituent including an unsaturated ring without having a conjugation structure. The condensed polycyclic group is distinguished from the aryl group or heteroaryl group since the condensed polycyclic group does not have an orientation.

Examples of the organometallic compound of Formula 1 may include the following compounds without being limited thereto.

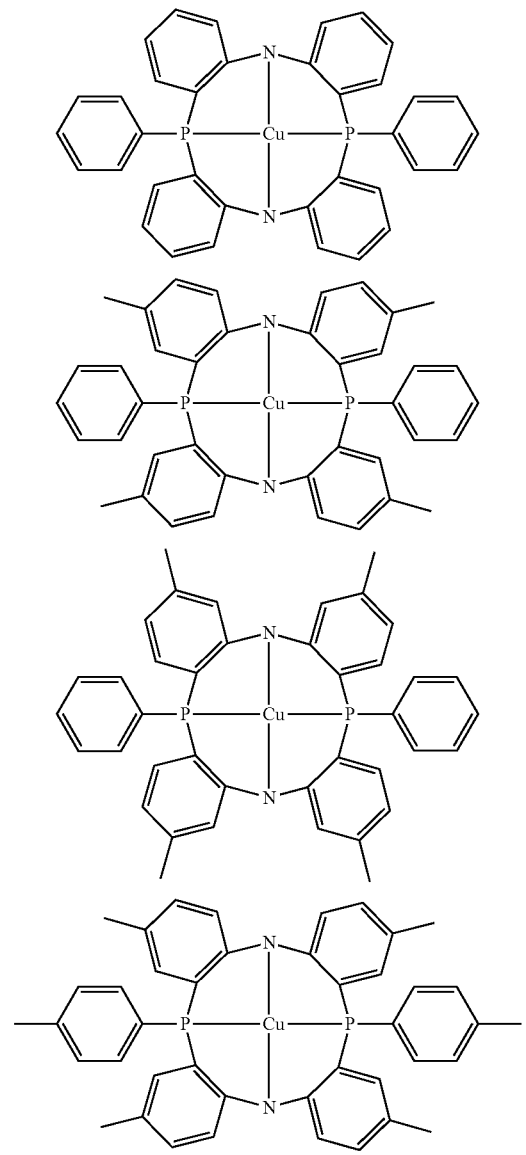

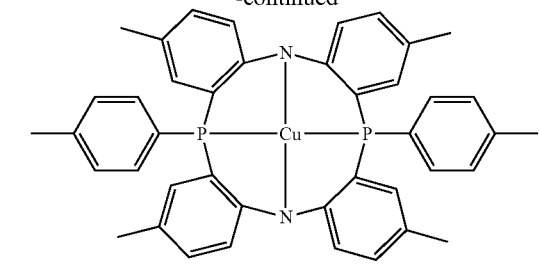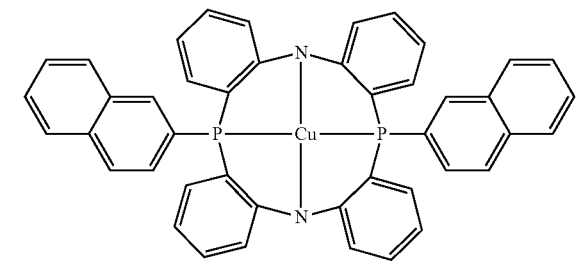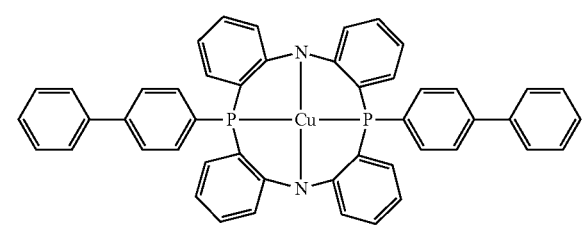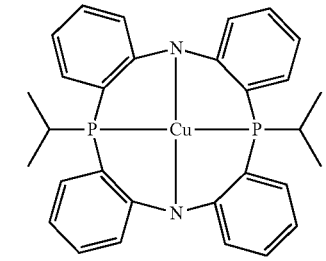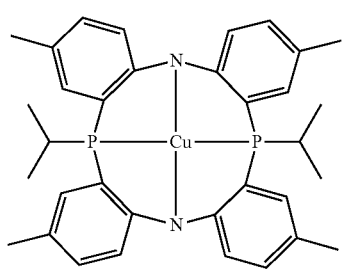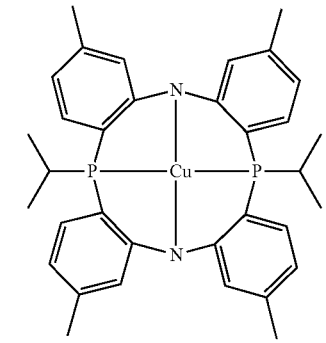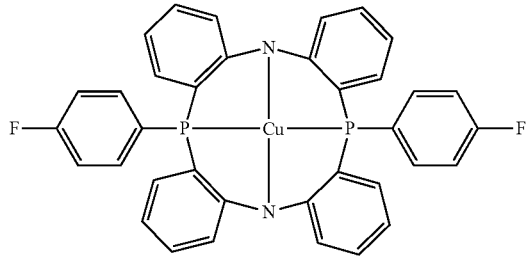

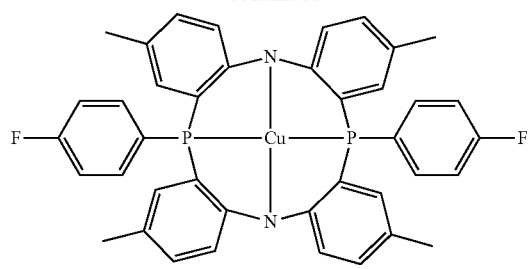
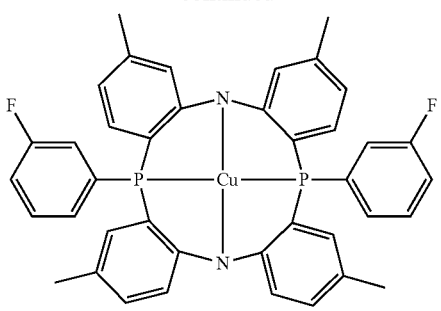
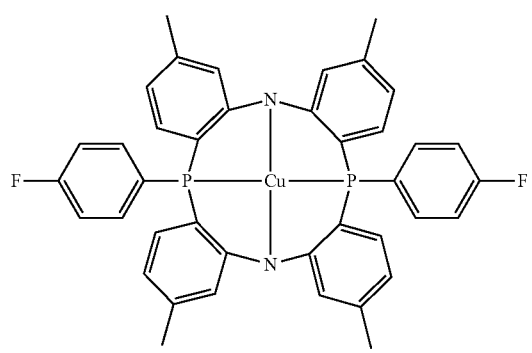
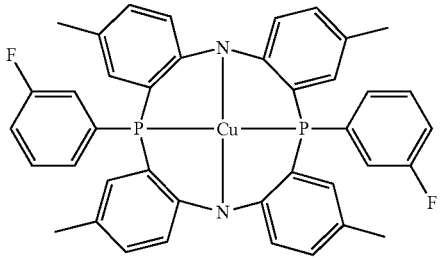
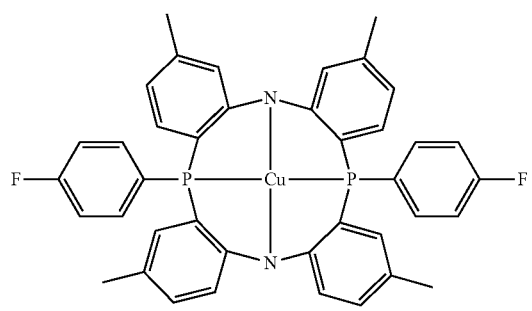
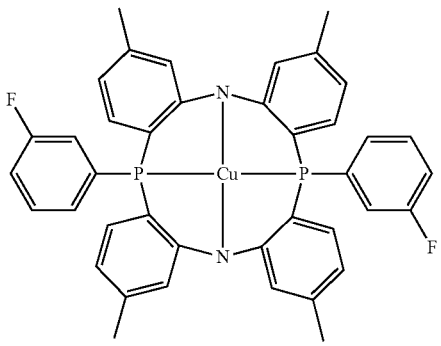
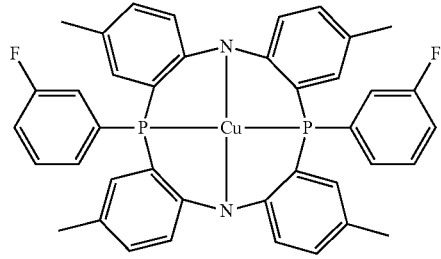
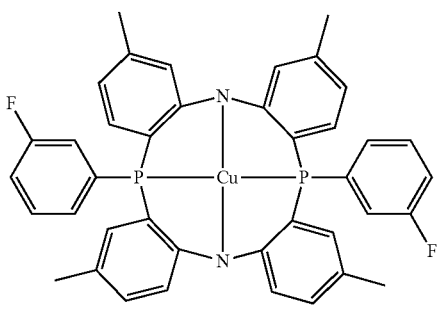
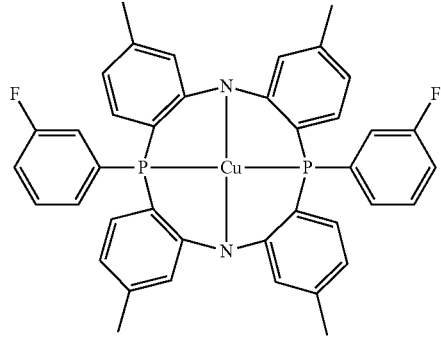
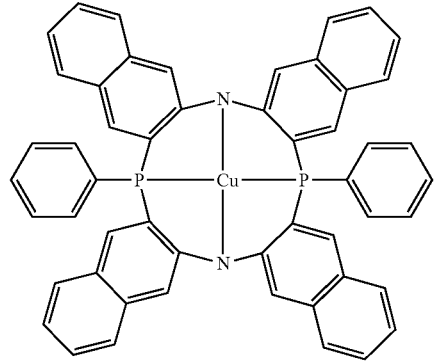

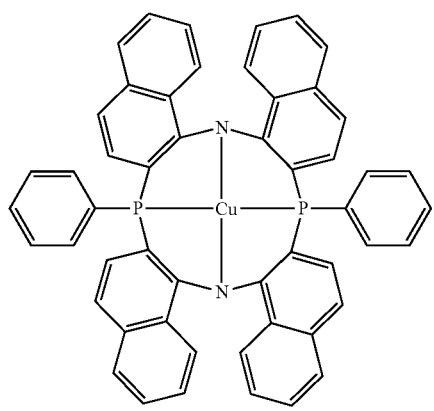
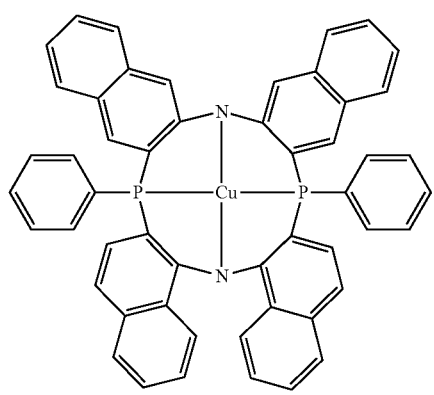
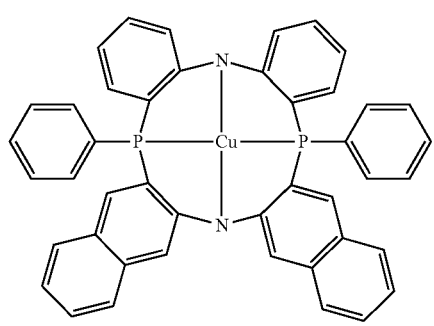
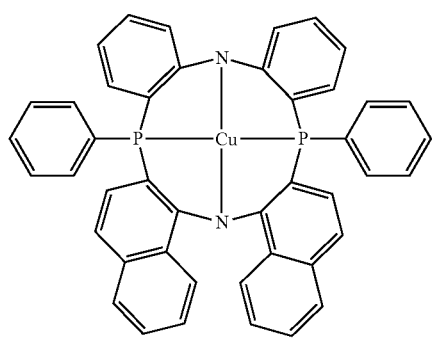
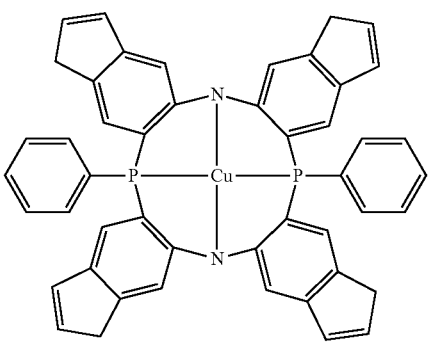
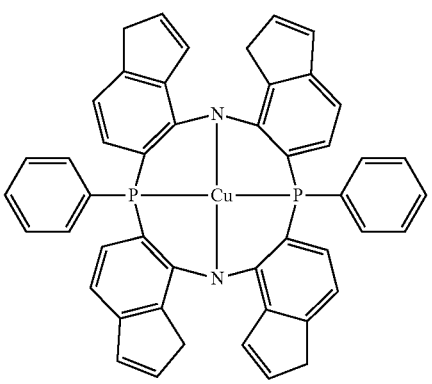
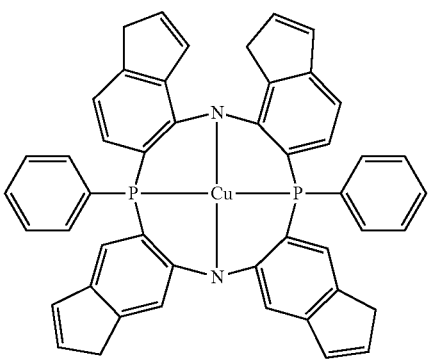
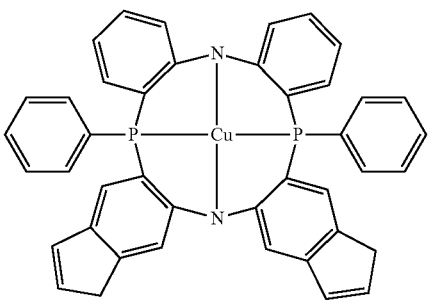
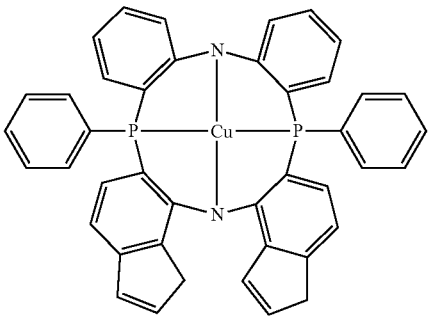

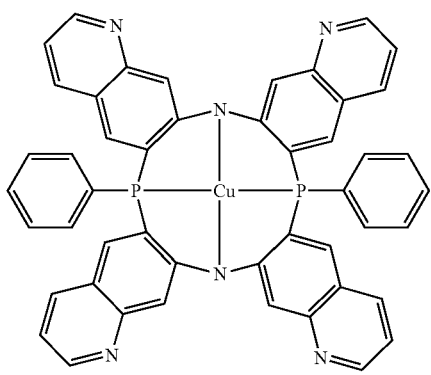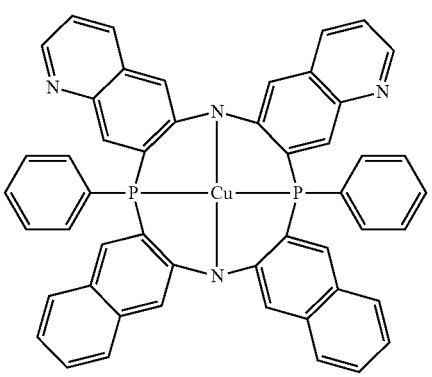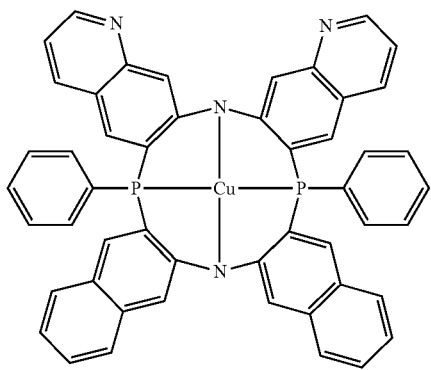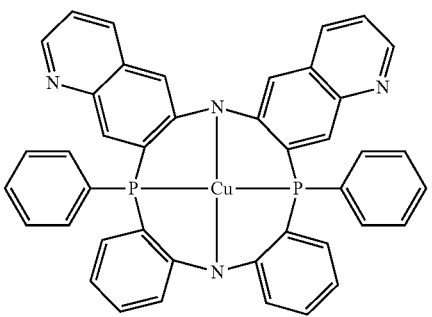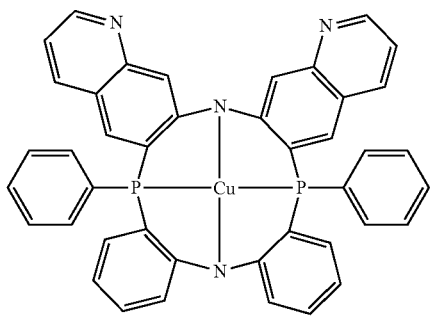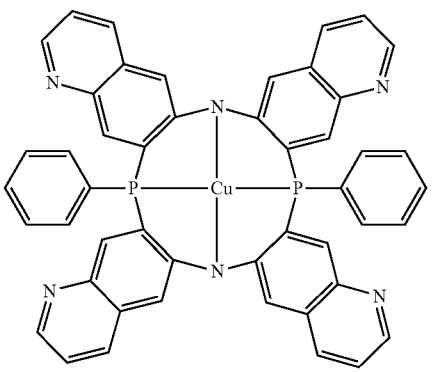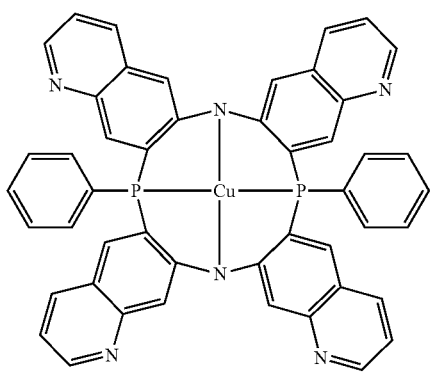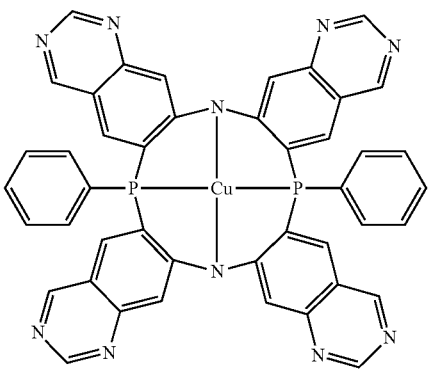

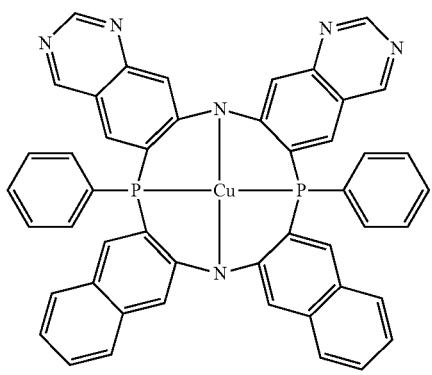
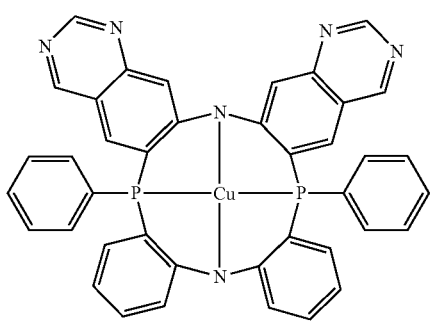
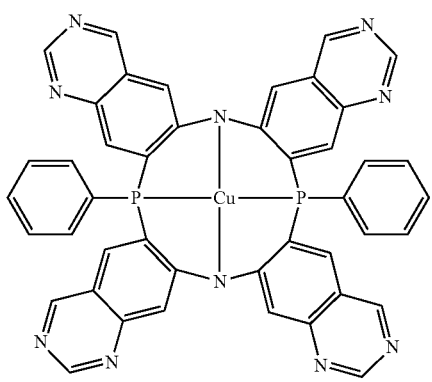
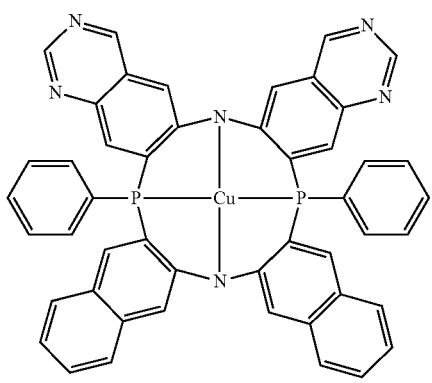
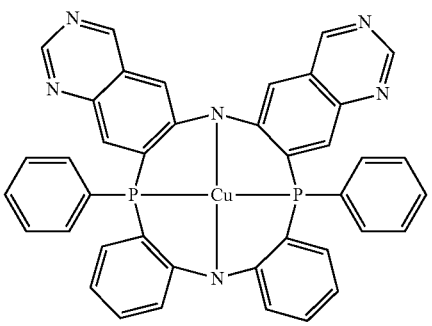
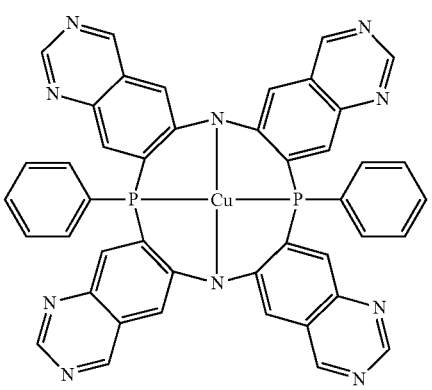
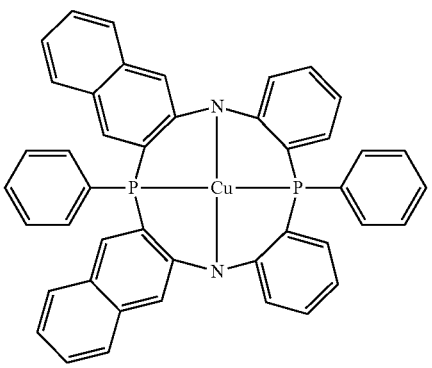
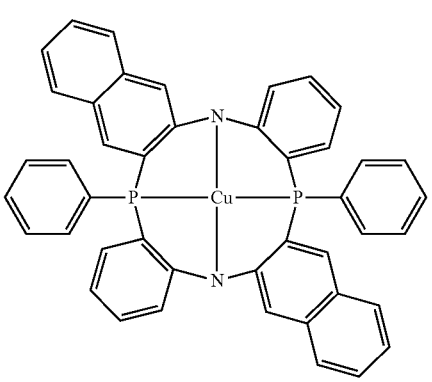

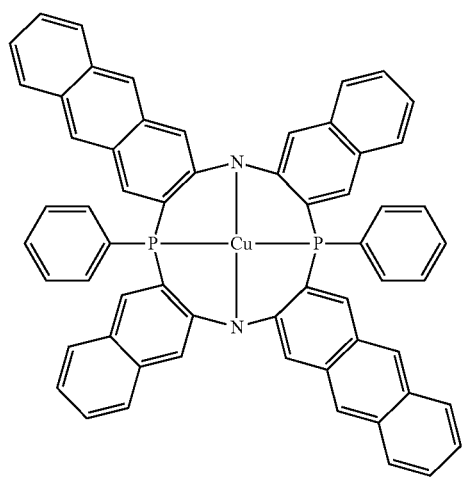
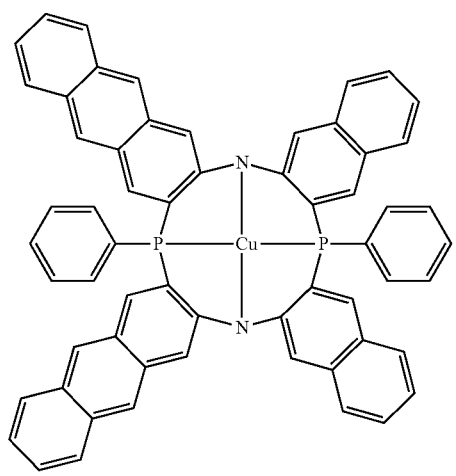
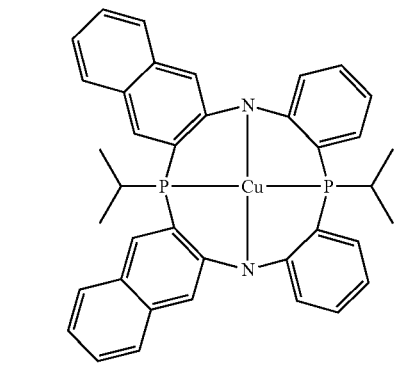
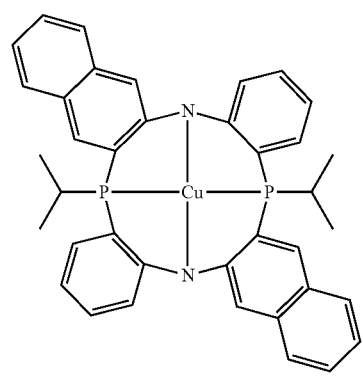
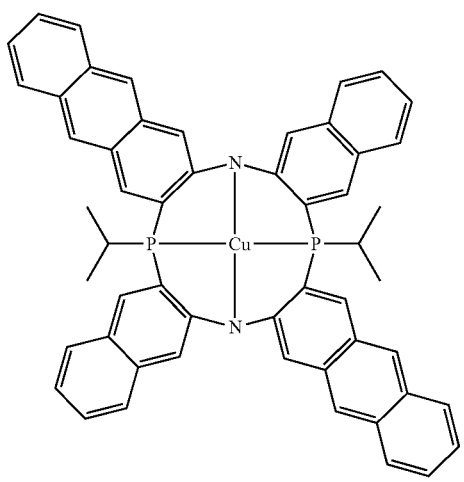
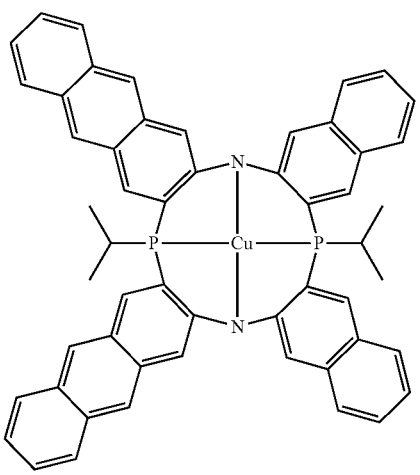
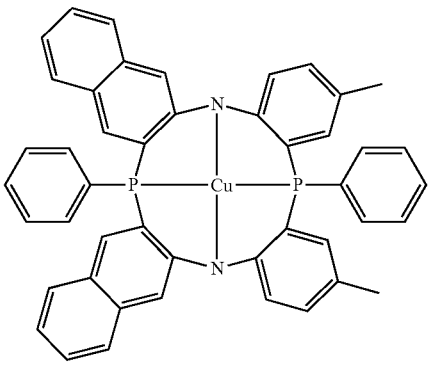
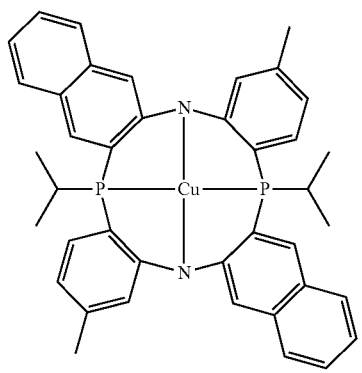

-continued
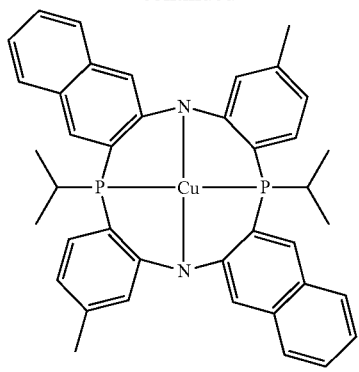
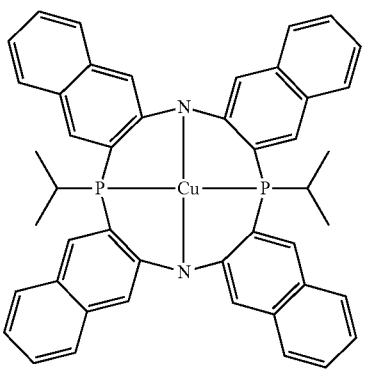
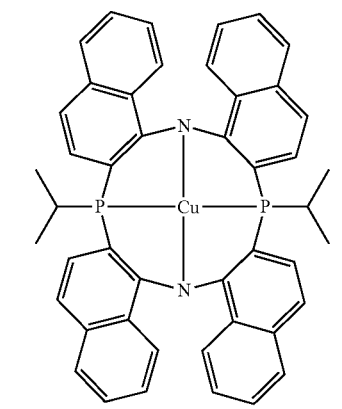
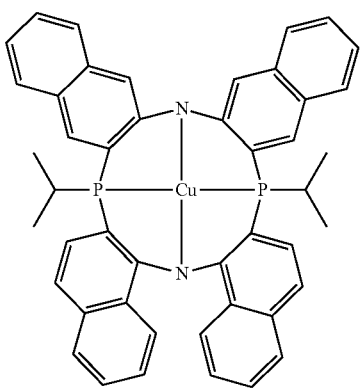
-continued
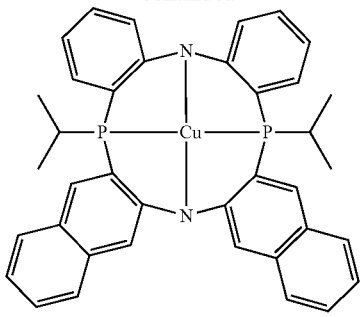
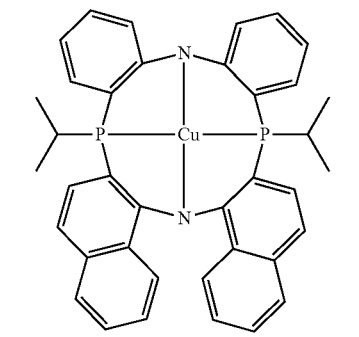
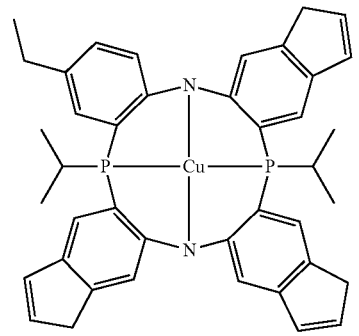
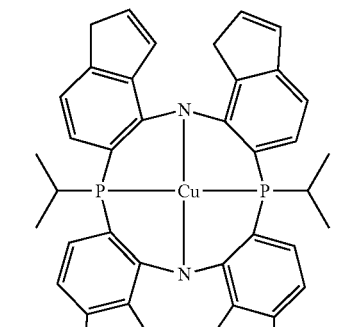
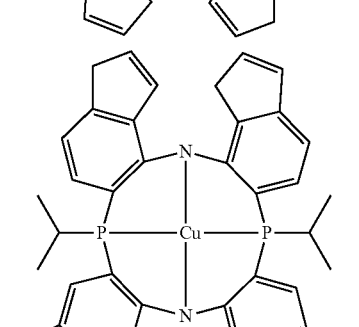

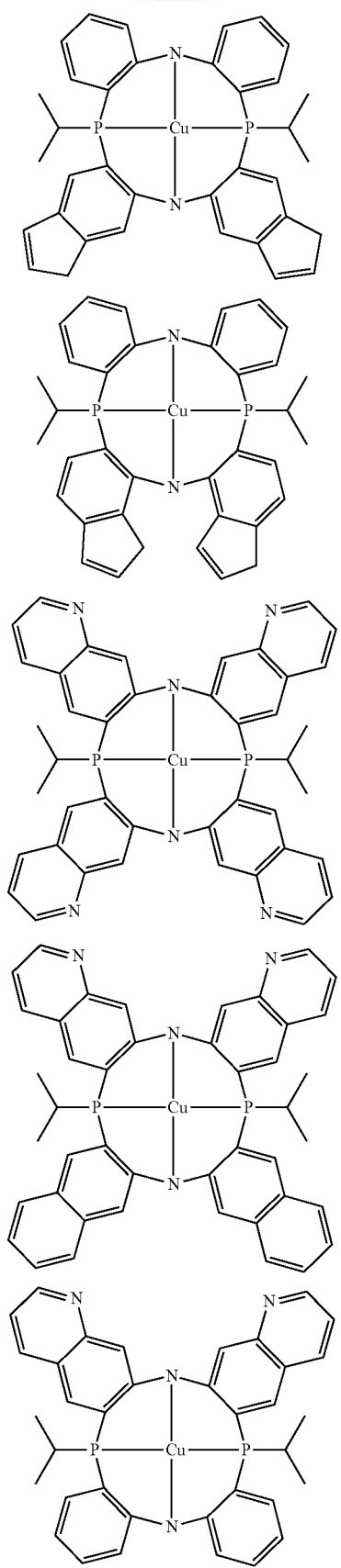
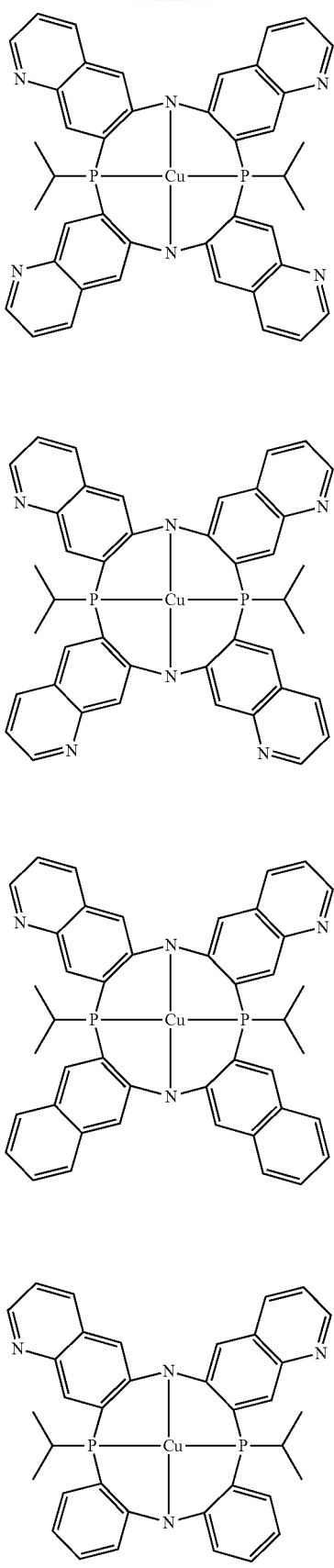

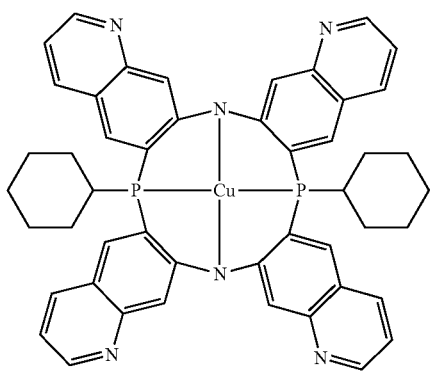
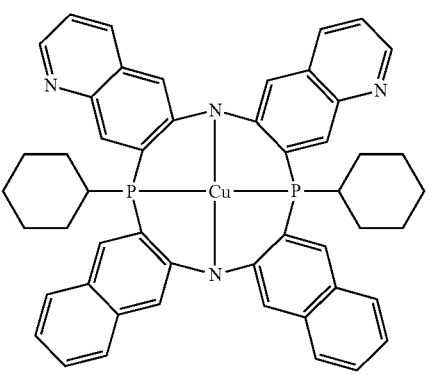
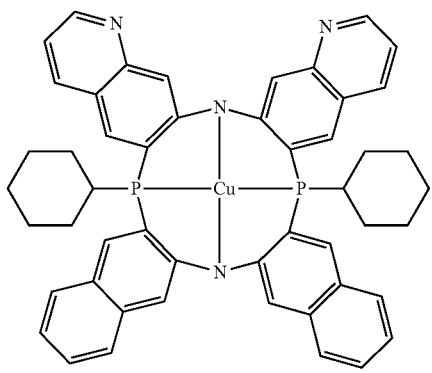
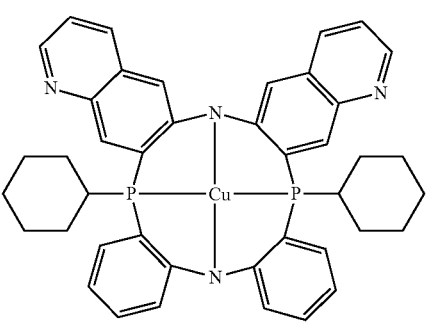
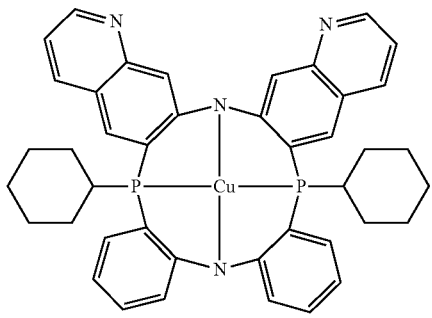
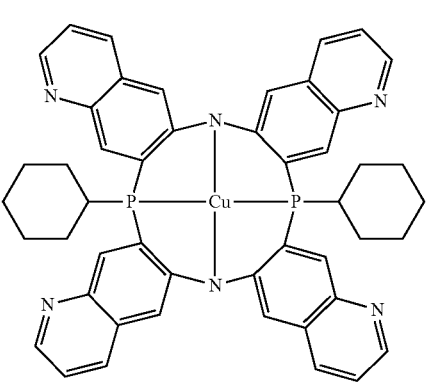
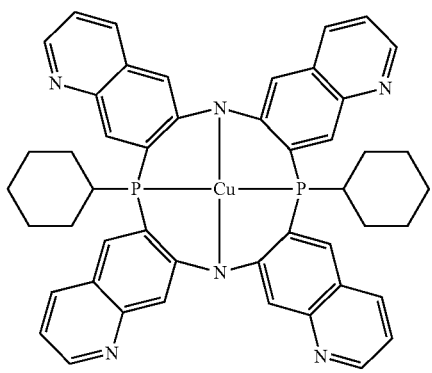
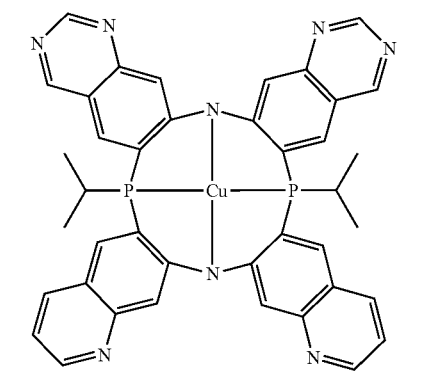

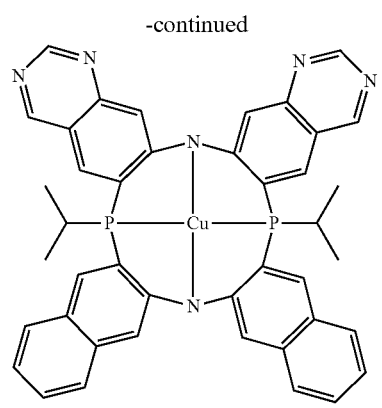
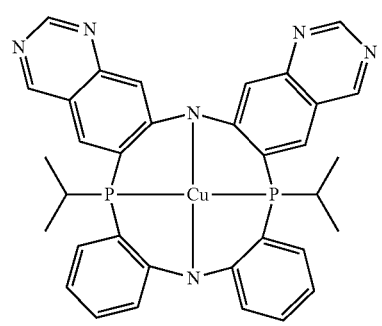
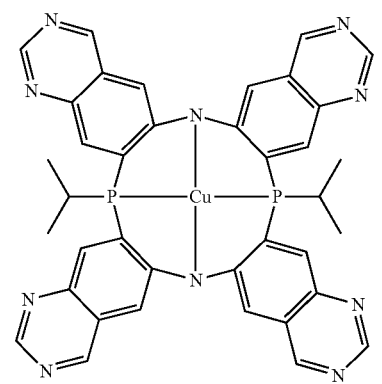
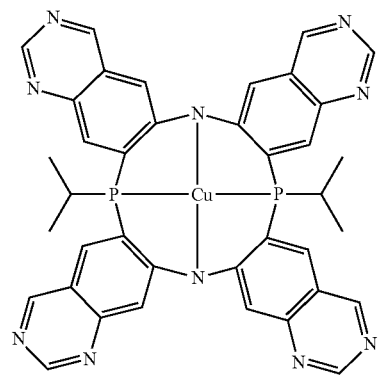
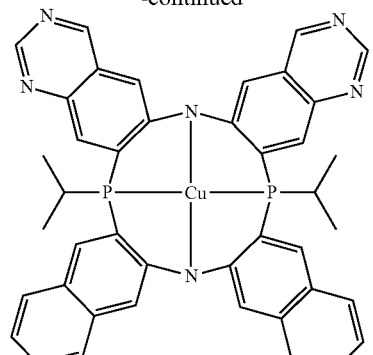
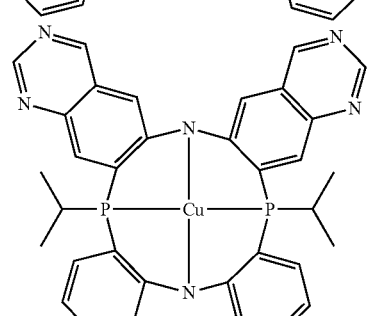
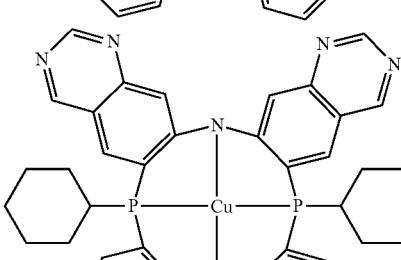
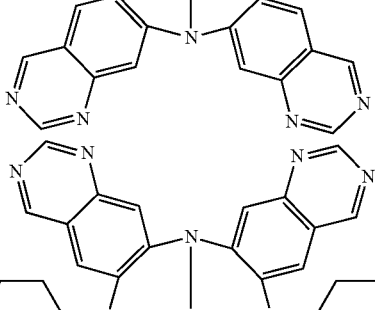
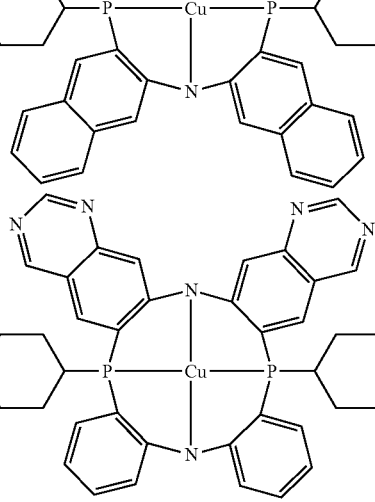

-continued
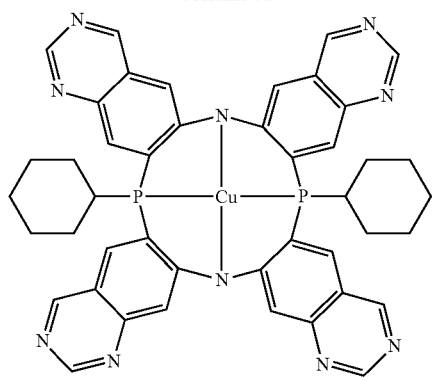
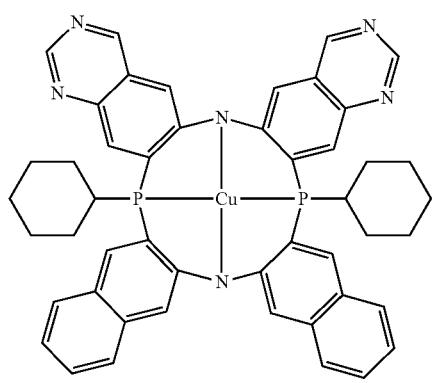
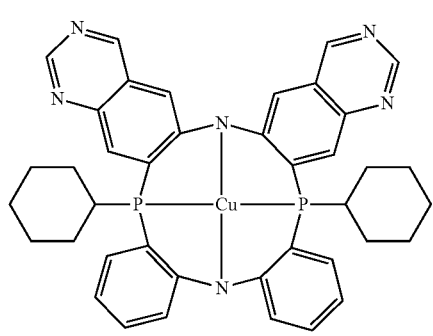
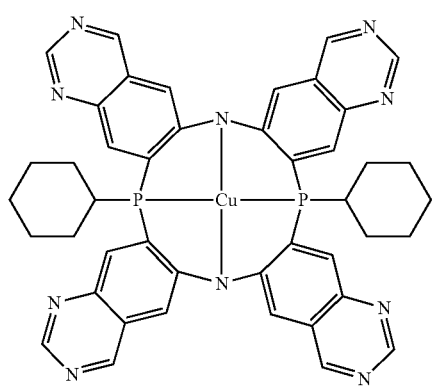
-continued
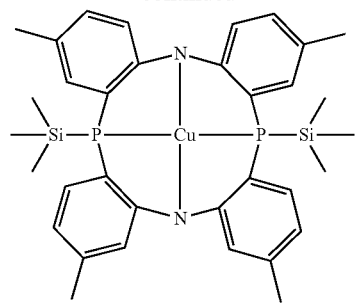
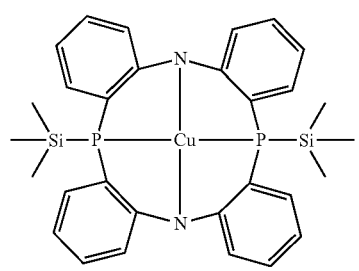
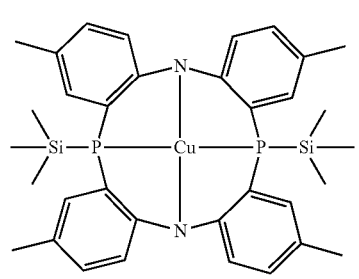
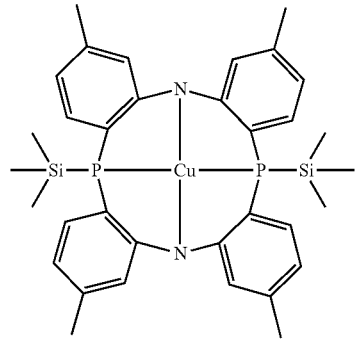
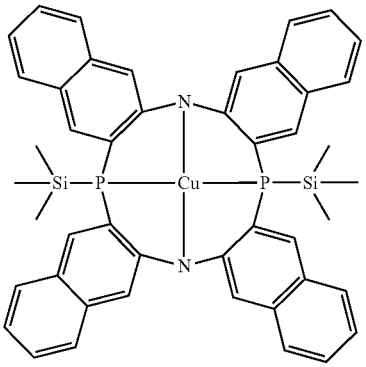

31
-continued
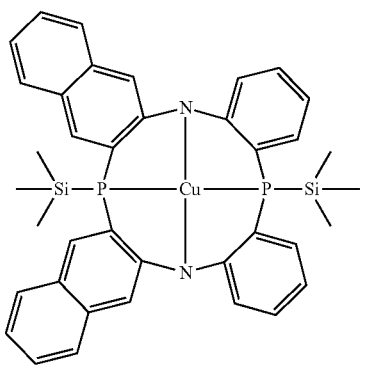
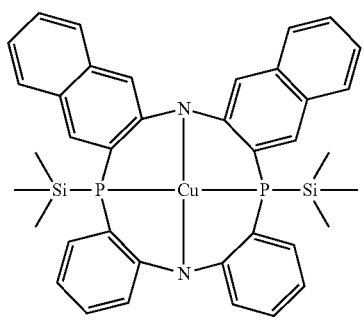
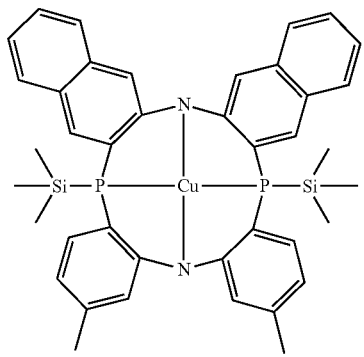
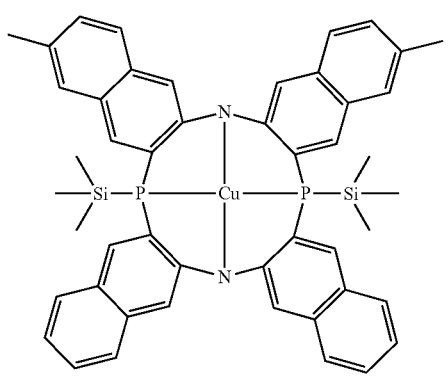
32
-continued
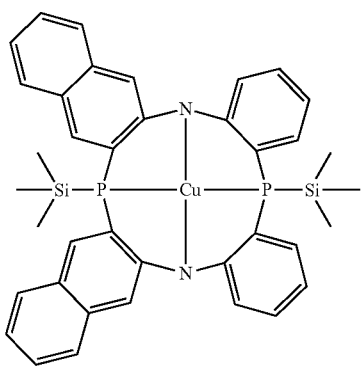
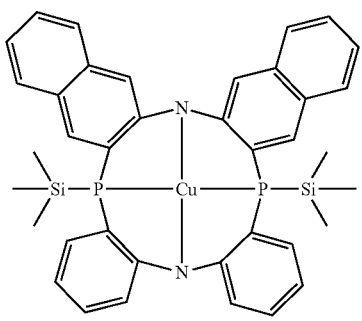
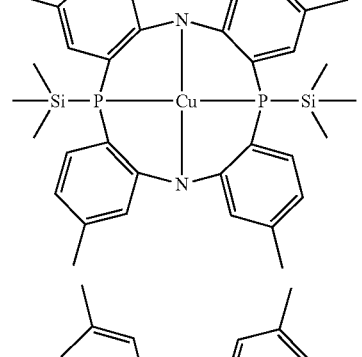
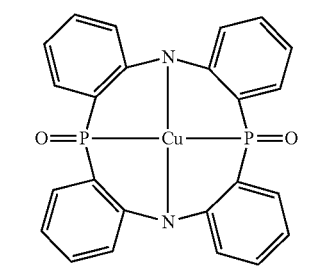

33
-continued
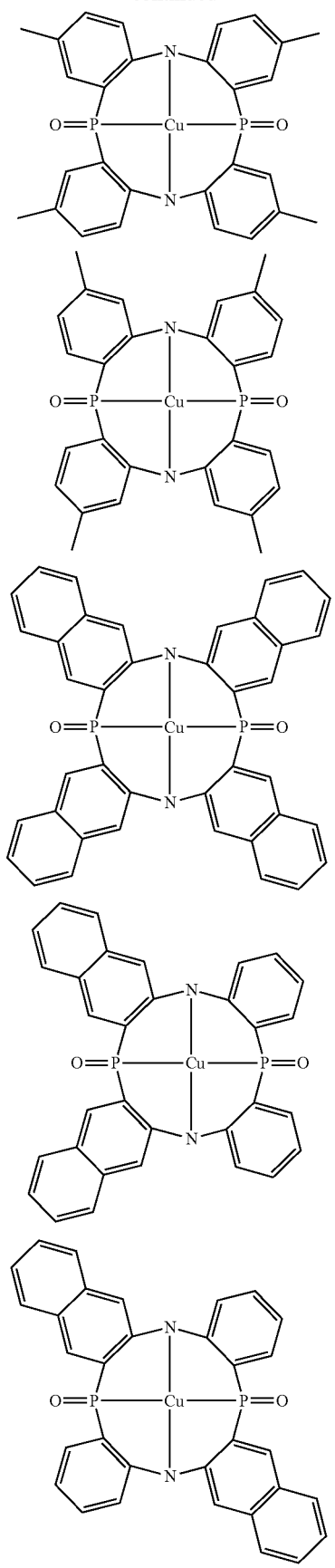
34
-continued
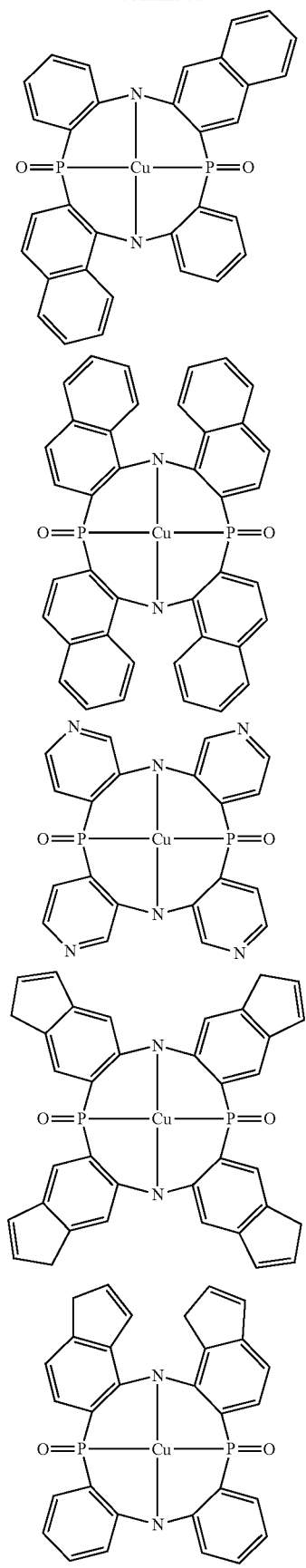

-continued
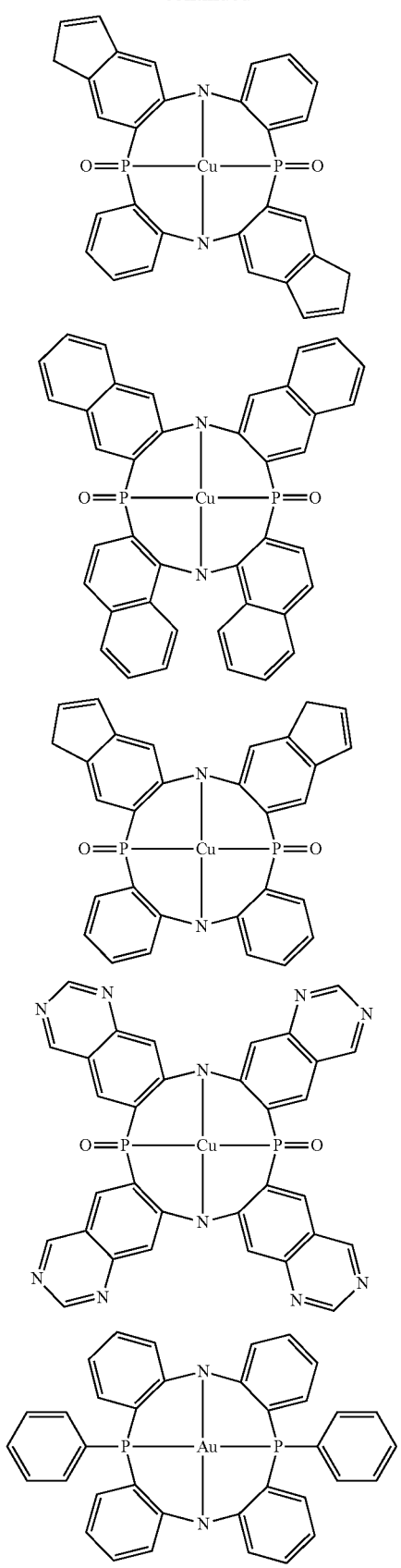
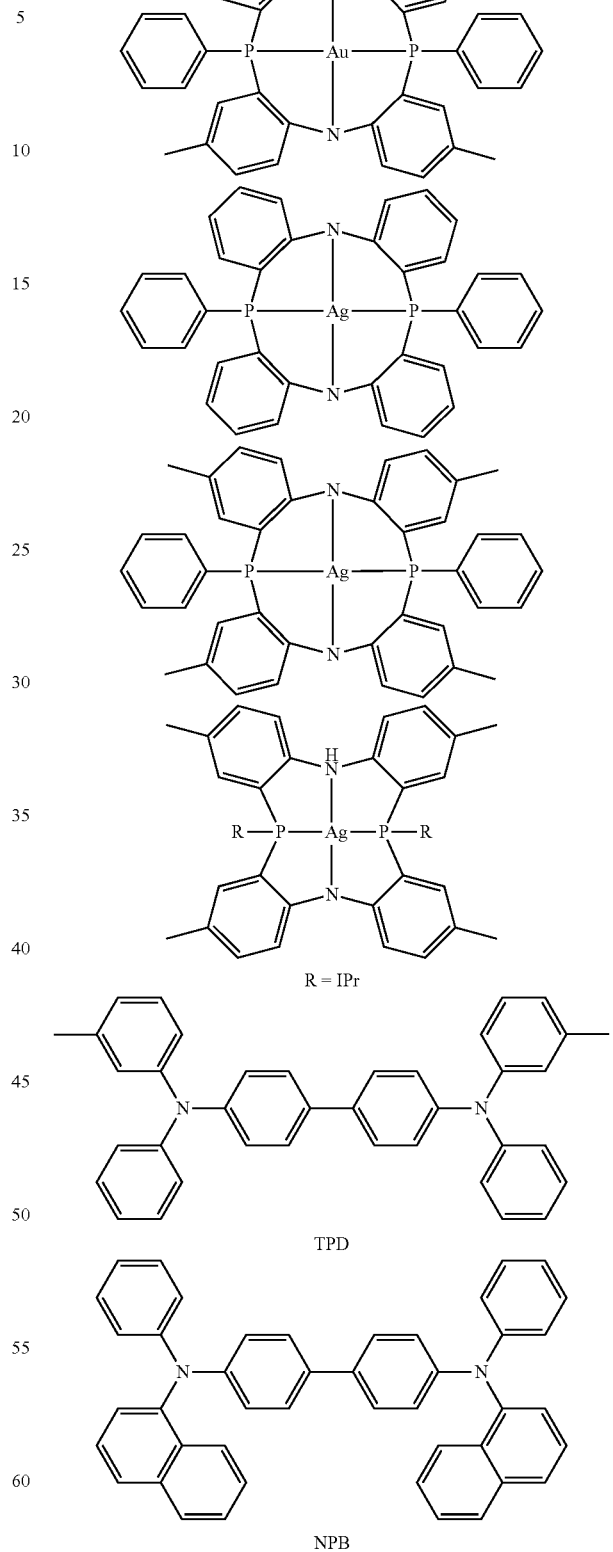
R = IPr
TPD
NPB
An organic light-emitting device according to another embodiment of the present invention includes: a first electrode; a second electrode; and an organic layer interposed between the first electrode and the second electrode. The organic layer includes the organometallic complex represented by Formula 1 above.

The organic layer may include at least one layer selected from the group consisting of a hole injection layer (HIL), a hole transport layer (HTL), a functional layer having both hole injecting and hole transporting capabilities (H-functional layer), a buffer layer, an electron blocking layer (EBL), an emission layer (EML), a hole blocking layer (HBL), an electron transport layer (ETL), an electron injection layer (EIL), and a functional layer having both electron injecting and electron transporting capabilities (E-functional layer).

For example, the organic layer may be an EML, e.g., a green EML.

According to an embodiment, the organic light-emitting device may include an EIL, an ETL, an E-functional layer, an EML, an HIL, an HTL, and/or an H-functional layer. The EML may include an anthracene-based compound, an arylamine-based compound, or a styryl-based compound.

According to another embodiment, the organic light-emitting device may include an EIL, an ETL, an E-functional layer, an EML, an HIL, an HTL, and/or anH-functional layer. One of a red layer, a green layer, a blue layer, and a white layer of the EML may include a phosphorescent compound. The HIL, the HTL, and/or the H-functional layer may include a charge-generating material.

Meanwhile, the charge-generating material may be a p-dopant. The p-dopant may be a quinone derivative, a metal oxide, or a cyano group-containing compound.

According to another embodiment of the present invention, the organic layer may include an ETL that includes a metal complex in addition to an electron transporting material. The metal complex may be a Li complex.

The term "organic layer" used herein refers to a single layer and/or a multiple layer structure interposed between the first and second electrodes of the organic light-emitting device.

The organic layer includes an EML that includes the organometallic compound. Alternatively, the organic layer may include at least one of the HIL, the HTL, and the H-functional layer, and the at least one of the HIL, the HTL, and the H-functional layer may include the organometallic compound.

The drawing is a schematic cross-sectional view of an organic light-emitting device according to an embodiment of the present invention. Hereinafter, a structure of the organic light-emitting device and a method of fabricating the organic light-emitting device will be described with reference to the drawing.

A substrate, which may be any suitable substrate that is commonly used (utilized) in organic light-emitting devices, may be a glass substrate or a transparent plastic substrate with excellent mechanical strength, thermal stability, transparency, surface smoothness, handling convenience, and waterproofness.

A first electrode may be formed on the substrate by depositing or sputtering a material that is used (utilized) using (utilizing) to form the first electrode. When the first electrode constitutes an anode, the material used (utilized) to form the first electrode may be a high work function material so as to facilitate hole injection. The first electrode may be a reflective electrode or a transmissive electrode. Transparent and conductive materials such as indium tin oxide (ITO), indium zinc oxide (IZO), tin oxide ($SnO_2$), or zinc oxide (ZnO) may be used (utilized) to form the first electrode 13. The first electrode may also be formed as a reflective electrode using (utilizing) magnesium (Mg), aluminum (Al), aluminum-lithium (Al—Li), calcium (Ca), magnesium-indium (Mg—In), magnesium-silver (Mg—Ag), or the like.

The first electrode may have a single-layered or a multi-layered structure. For example, the first electrode may have a triple-layered structure of ITO/Ag/ITO, but is not limited thereto.

An organic layer is disposed on the first electrode.

The organic layer may include an HIL, an HTL, a buffer layer, an EML, an ETL, and/or an EIL.

The HIL may be formed on the first electrode by vacuum deposition, spin coating, casting, Langmuir-Blodgett (LB) deposition, or the like.

When the HIL is formed using (utilizing) vacuum deposition, the deposition conditions may vary according to a compound that is used (utilized) to form the HIL, and the structure and thermal characteristics of the HIL to be formed. For example, the deposition conditions may include a deposition temperature of 100 to 500° C., a vacuum pressure of $10^{-8}$ to $10^{-3}$ torr, and a deposition rate of about 0.01 to about 100 Å/sec, but are not limited thereto.

When the HIL is formed by spin coating, coating conditions may vary according to a compound that is used (utilized) to form the HIL, and the structure and thermal characteristics of the HIL to be formed. For example, the coating conditions may include a coating speed of about 2000 rpm to about 5000 rpm, and a thermal treatment temperature of about 80° C. to about 200° C. for removing a solvent after coating. However, the coating conditions are not limited thereto.

Any suitable hole injecting materials may be used (utilized), and examples of the suitable hole injecting material include N,N'-diphenyl-N,N'-bis-[4-(phenyl-m-tolyl-amino)-phenyl]-biphenyl-4,4'-diamine (DNTPD), a phthalocyanine compound (such as copperphthalocyanine), 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline)/poly(4-styrene-sulfonate) (PANI/PSS), but are not limited thereto.

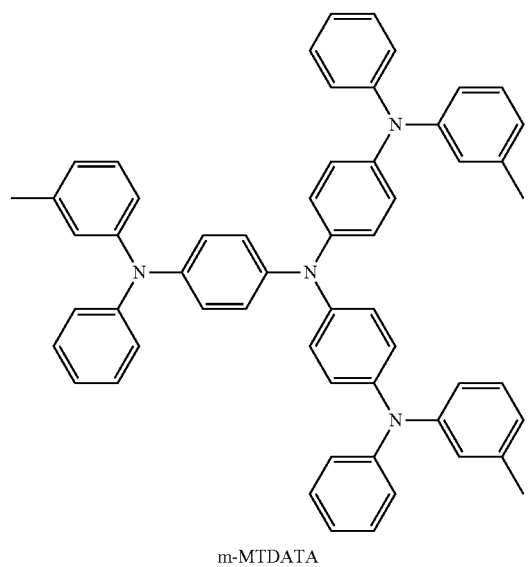

m-MTDATA

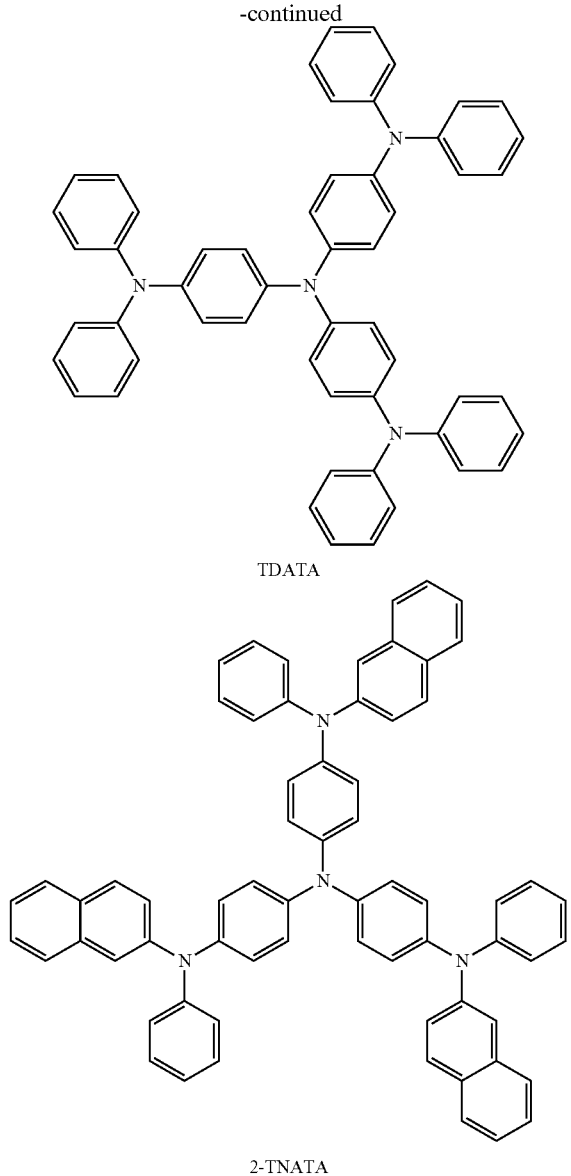

2-TNATA

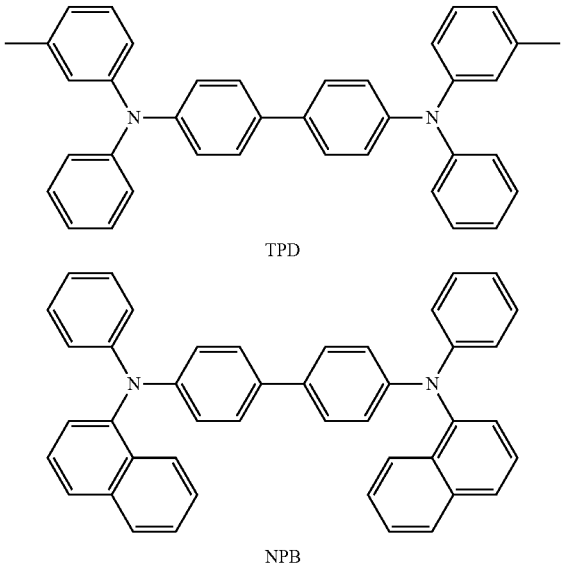

TPD

NPB

The thickness of the HTL may be about 50 to about 2,000 Å, and for example, about 100 to about 1,500 Å. In one embodiment, when the thickness of the HTL is within this range, the HTL has excellent hole transporting ability without a substantial increase in driving voltage.

The H-functional layer may include at least one of the hole injecting materials and at least one of the hole transporting materials as described above, and the thickness of the H-functional layer may be in the range of about 100 Å to about 10,000 Å, for example, about 100 Å to about 1,000 Å. In one embodiment, when the thickness of the H-functional layer is within this range, the H-functional layer has excellent hole injecting and transporting abilities without a substantial increase in driving voltage.

Meanwhile, at least one of the HIL, the HTL, and the H-functional layer may include at least one of the compounds represented by Formulae 300 and 350 below.

The thickness of the HIL may be about 100 to about 10,000 Å, and for example, about 100 to about 1,000 Å. In one embodiment, when the thickness of the HIL is within this range, the HIL has excellent hole injecting ability without a substantial increase in driving voltage.

Then, the HTL may be formed on the HIL by using (utilizing) vacuum deposition, spin coating, casting, LB deposition, or the like. When the HTL is formed by vacuum deposition or spin coating, the conditions for deposition and coating may be similar to those for the formation of the HIL, although the conditions for the deposition and coating may vary according to the material that is used (utilized) to form the HTL.

Any suitable hole transporting materials may be used (utilized), and examples of the suitable hole transporting material include a carbazole derivative (such as N-phenylcarbazole or polyvinyl carbazole), N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB), but are not limited thereto.

Formula 300

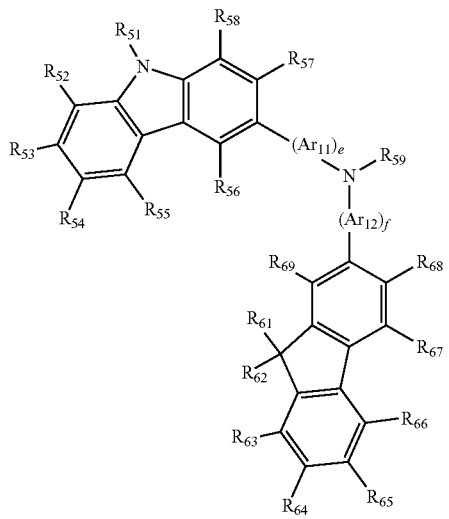

Formula 350

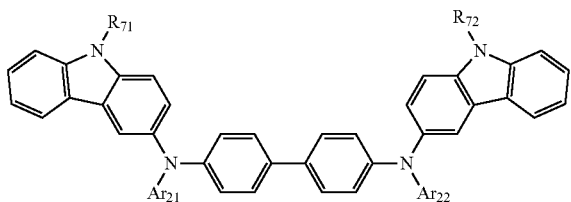

In Formulae 300 and 350, $Ar_{11}$, $Ar_{12}$, $Ar_{21}$, and $Ar_{22}$ are each independently a substituted or unsubstituted $C_6$-$C_{60}$ arylene group.

In Formula 300, e and f are each independently an integer from 0 to 5, or 0, 1, or 2. For example, e may be 1, and f may be 0, without being limited thereto.

In Formulae 300 and 350, $R_{51}$ to $R_{58}$, $R_{61}$ to $R_{69}$, and $R_{71}$ and $R_{72}$ may be, each independently, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. For example, $R_{51}$ to $R_{58}$, $R_{61}$ to $R_{69}$ and $R_{71}$ and $R_{72}$ may be each independently a hydrogen atom; a deuterium atom; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid group or a salt thereof; a $C_1$-$C_{10}$ alkyl group (e.g., a methyl group, an ethyl group, a propyl group, a butyl group, a pentyl group, or a hexyl group); a $C_1$-$C_{10}$ alkoxy group (e.g., a methoxy group, an ethoxy group, a propoxy group, a butoxy group, or a pentoxy group); a $C_1$-$C_{10}$ alkyl group or a $C_1$-$C_{10}$ alkoxy group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; or a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group without being limited thereto.

In Formula 300, $R_{59}$ may be selected from the group consisting of: a phenyl group; a naphthyl group; an anthryl group; a biphenyl group; a pyridyl group; and a phenyl group, a naphthyl group, an anthryl group, a biphenyl group, or a pyridyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to an embodiment of the present invention, the compound of Formula 300 may be represented by Formula 300A below, but is not limited thereto.

Formula 300A

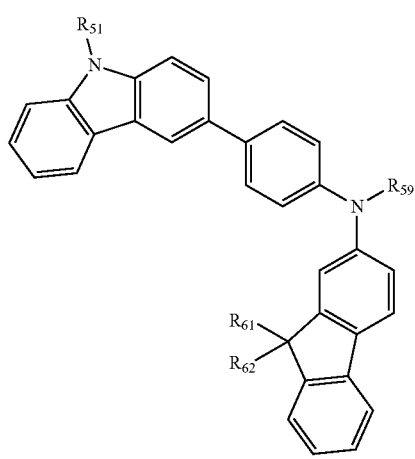

In Formula 300A, $R_{51}$, $R_{62}$, $R_{61}$, and $R_{59}$ are as defined above.

For example, at least one of the HIL, the HTL, and the H-functional layer may include at least one of Compounds 301 to 320 below, but is not limited thereto:

301

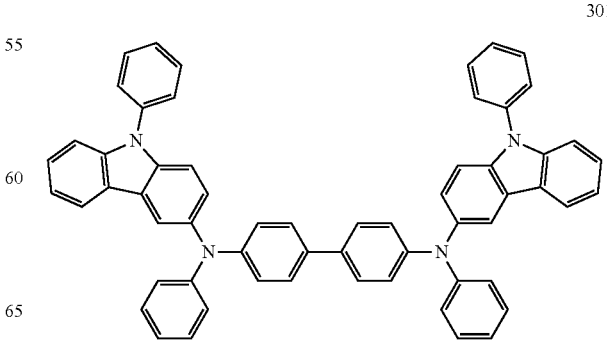

-continued
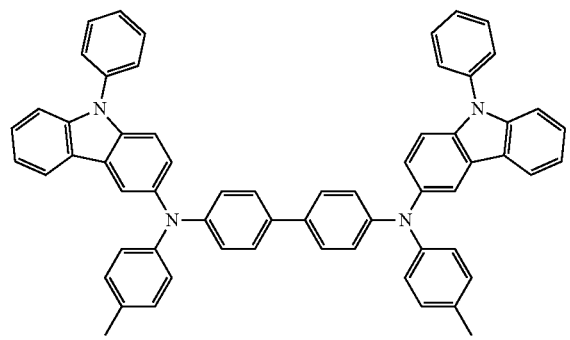
302
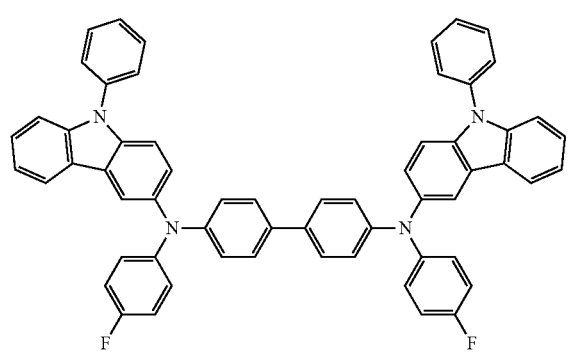
303
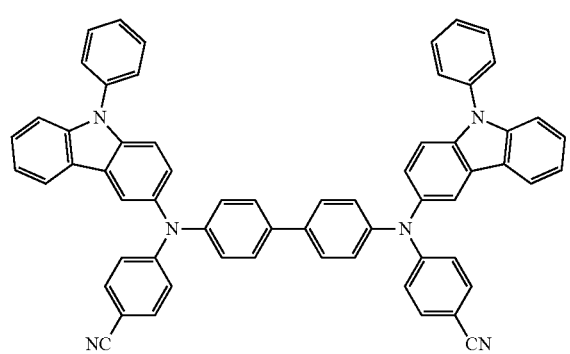
304
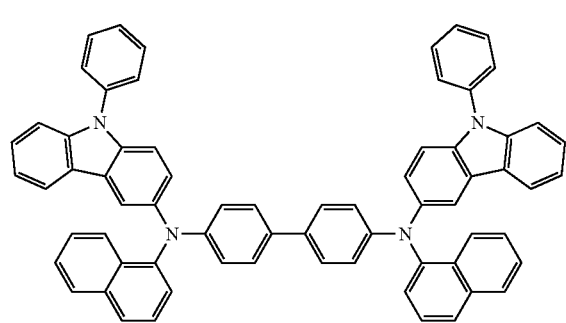
305
-continued
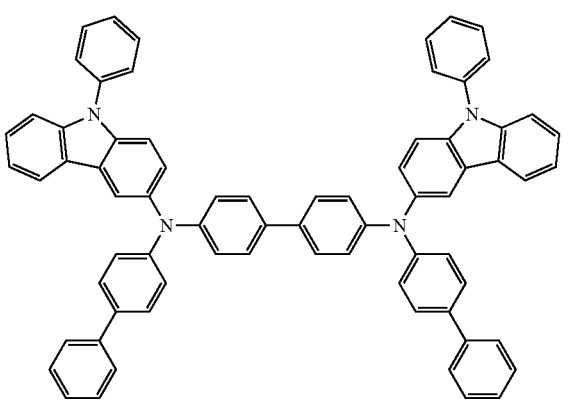
306
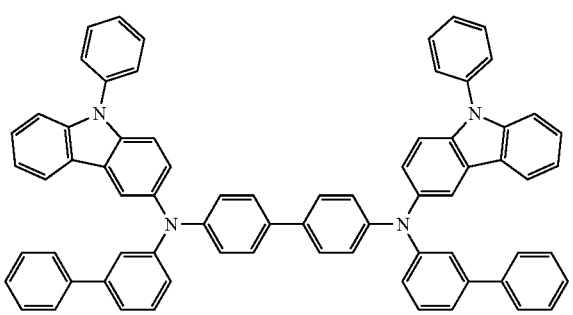
307
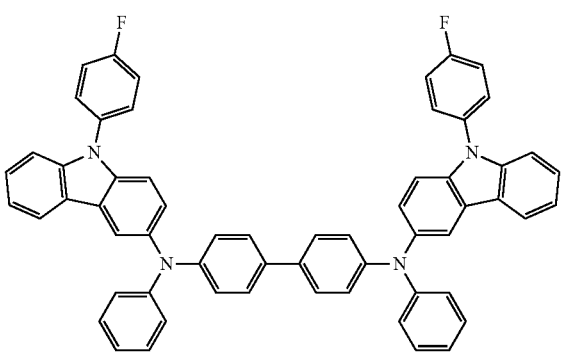
308
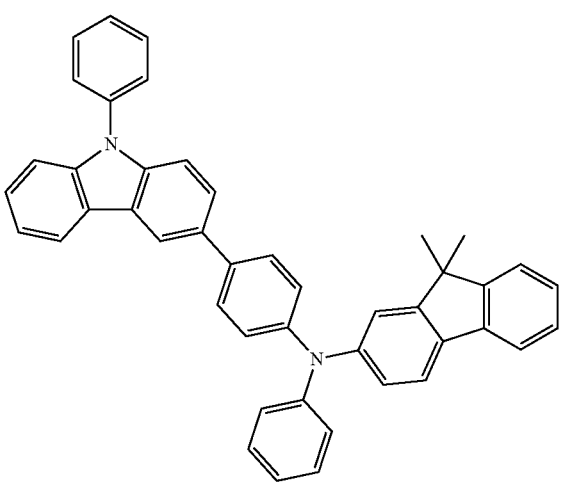
309

310
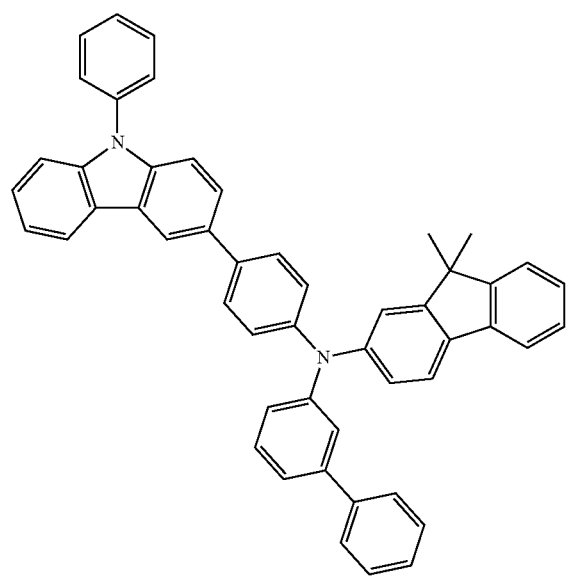
311
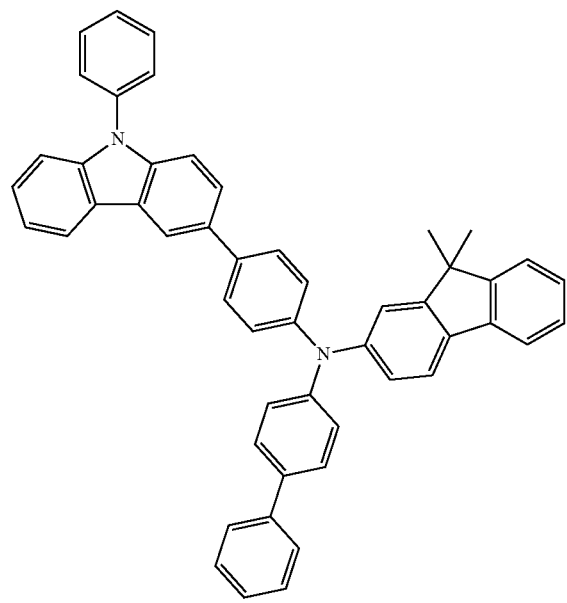
312
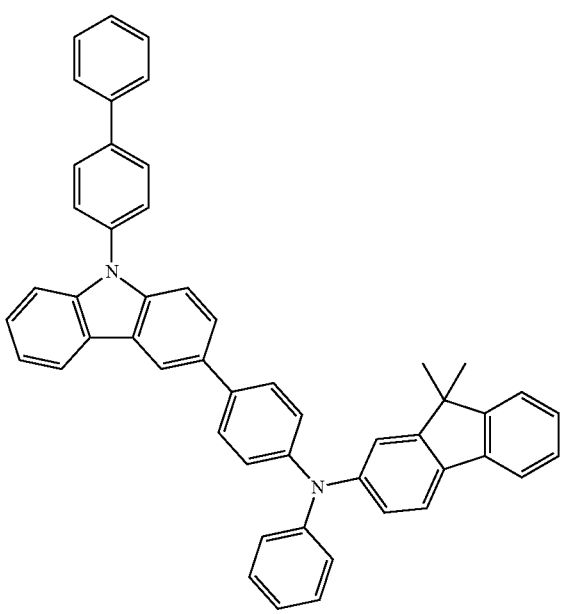
313
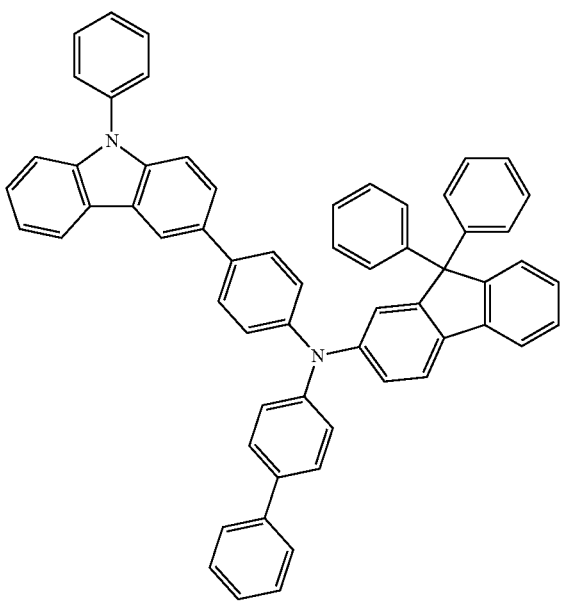

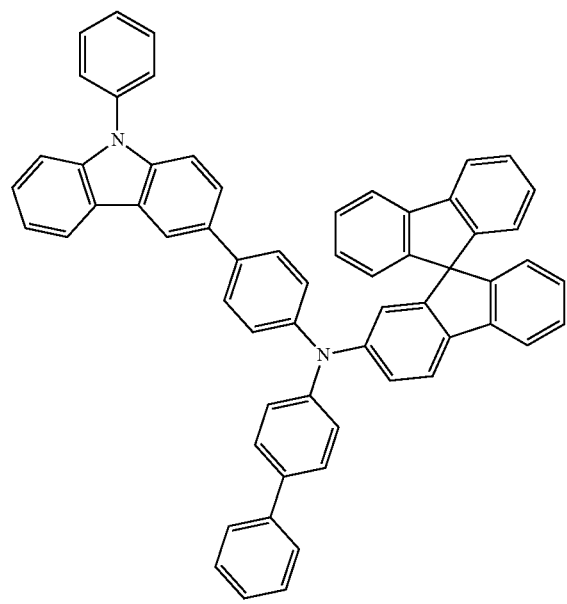
314
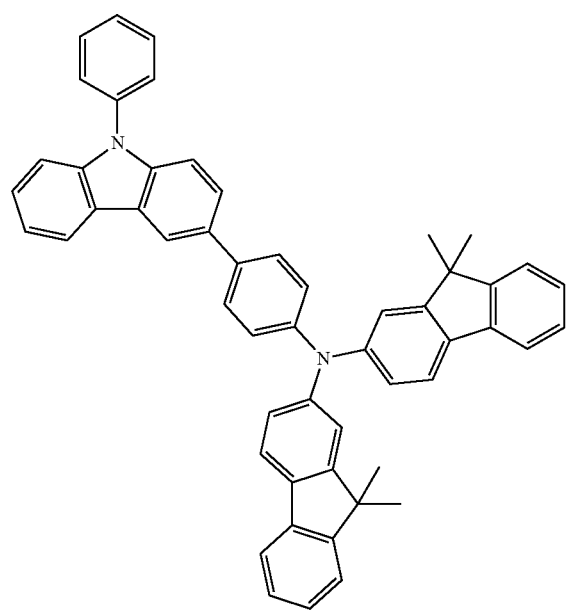
315
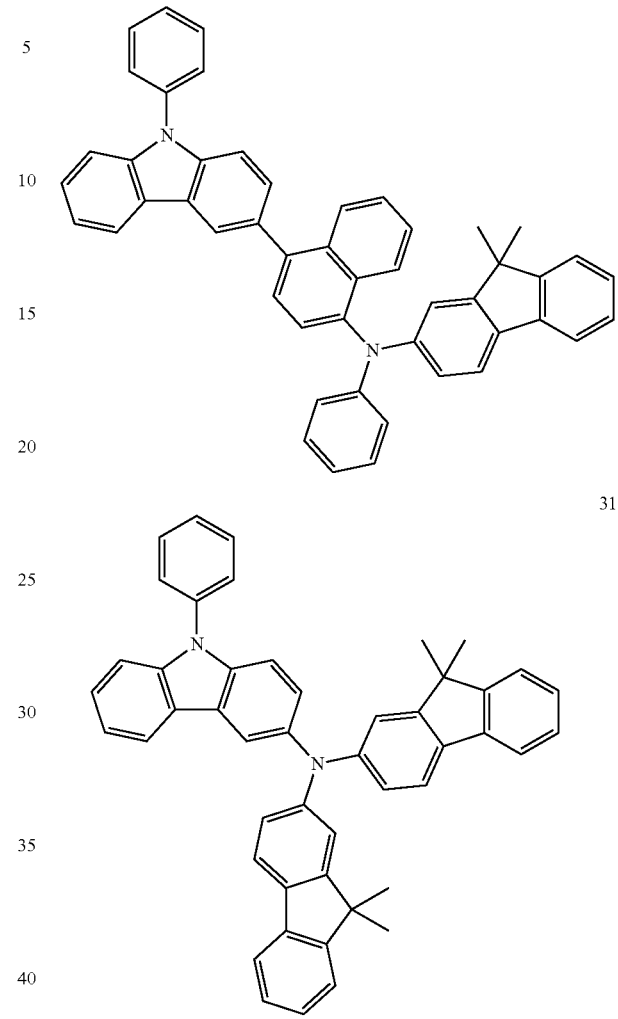
316
317
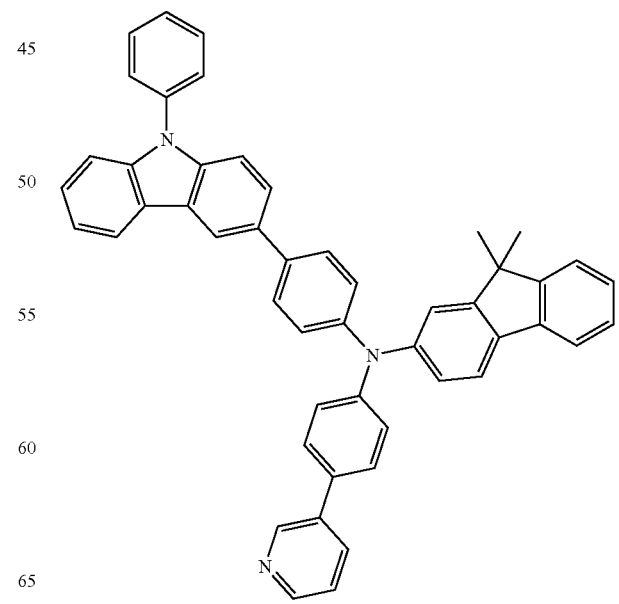
318

-continued

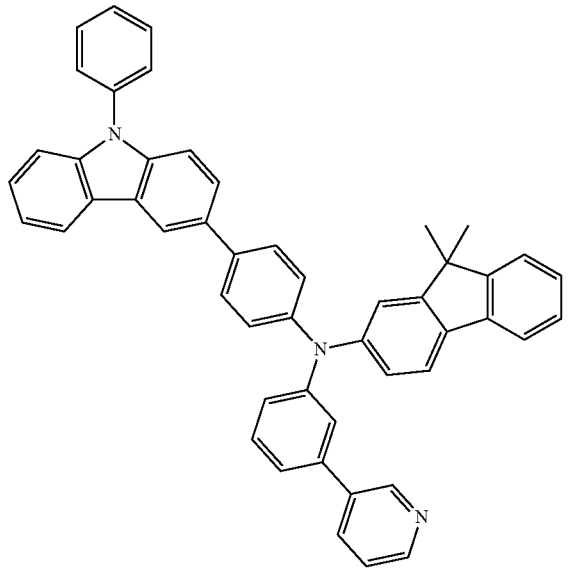
319

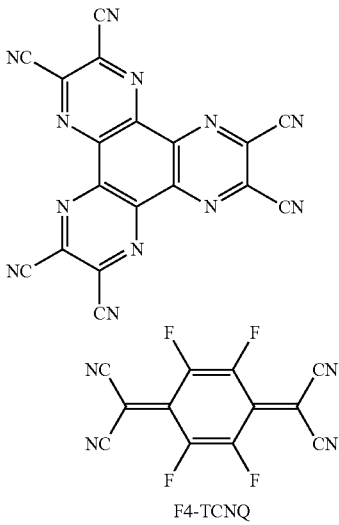
Compound 200

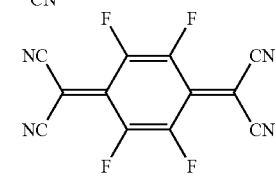
F4-TCNQ

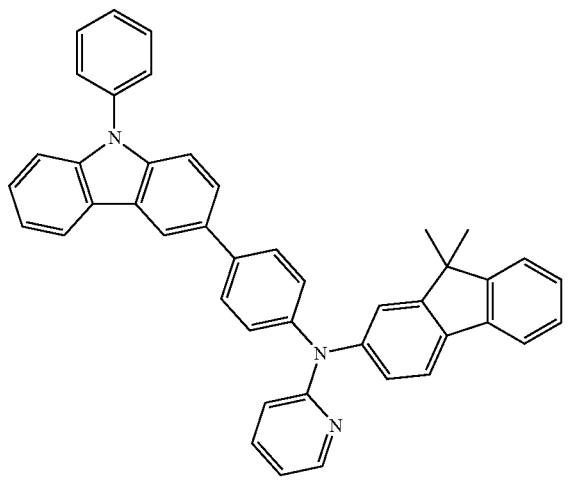
320

At least one of the HIL, the HTL, and the H-functional layer may further include a charge-generating material in addition to the suitable hole injecting materials, the suitable hole transporting materials, and/or materials having both hole injecting and hole transporting capabilities in order to improve the conductivity of the layer.

The charge-generating material may be a p-dopant. The p-dopant may be a quinone derivative, a metal oxide, or a cyano group-containing compound, but is not limited thereto. Examples of the p-dopant include: a quinine derivative (such as tetracyanoquinonedimethane (TCNQ) or 2,3,5,6-tetrafluoro-tetracyano-1,4-benzoquinonedimethane (F4-TCNQ)); a metal oxide (such as tungsten oxide or molybdenum oxide); and a cyano group-containing compound (such as Compound 200 below), but are not limited thereto.

If the HIL, the HTL, or the H-functional layer further includes the charge-generating material, the charge-generating material may be homogeneously or non-homogeneously dispersed in the HIL, the HTL, or the H-functional layer, or a variety of modifications may be possible.

A buffer layer may be interposed between the EML and at least one of the HIL, the HTL, and the H-functional layer. The buffer layer may increase efficiency by compensating an optical resonance distance according to a wavelength of light emitted from the EML. The buffer layer may include suitable hole injecting materials and suitable hole transporting materials. The buffer layer may also include a material that is the same as one of the materials contained in the HIL, the HTL, and the H-functional layer disposed under the buffer layer.

The EML may be formed on the HTL, the H-functional layer, or the buffer layer by vacuum deposition, spin coating, casting, LB deposition, or the like. When the EML is formed by using (utilizing) vacuum deposition or spin coating, the deposition and coating conditions may be similar to those used (utilized) to form the HIL, although the deposition and coating conditions may vary according to a compound that is used (utilized) to form the EML.

The EML may be formed by using (utilizing) the organometallic complex according to an embodiment of the present invention as a dopant material and a compound represented by Formula 3 below as a host material.

According to an embodiment, the compound of Formula 3 contained in the EML has the following structure.

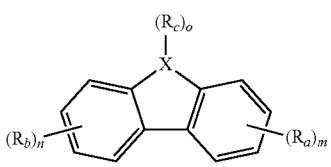
Formula 3

In Formula 3,
X is C, O, N, P, S, As, or Se;
$R_a$, $R_b$, and $R_c$ are each independently a hydrogen atom, a deuterium atom, a halogen atom, a nitro group, a cyano group, a substituted or unsubstituted $C_6$-$C_{60}$ aryl group, a substituted or unsubstituted $C_2$-$C_{60}$ alkenyl group, a substituted or unsubstituted $C_1$-$C_{60}$ heteroaryl group, a substituted or unsubstituted $C_6$-$C_{60}$ arylamino group, or a substituted or unsubstituted $C_6$-$C_{60}$ condensed polycyclic group;

a plurality of $R_a$s or $R_b$s, which are adjacent to each other, are optionally linked to form a ring; and m, n, and o are each independently an integer from 0 to 4.

According to an embodiment of the present invention, $R_a$ and $R_b$ of Formula 3 may be each independently a hydrogen atom, a deuterium atom, a substituted or unsubstituted $C_2$-$C_{30}$ alkenyl group, a substituted or unsubstituted $C_1$-$C_{30}$ heteroaryl group, a substituted or unsubstituted $C_6$-$C_{30}$ arylamino group, or a compound represented by Formula 4a below.

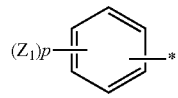

4a

In Formula 4a, $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxyl group, or a carboxyl group;

p is an integer from 1 to 5; and * is a binding site.

According to an embodiment of the present invention, $R_c$ of Formula 3 may be represented by any one of Formulae 5a to 5c below.

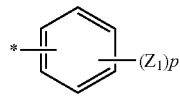

5a

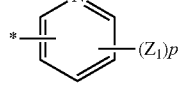

5b

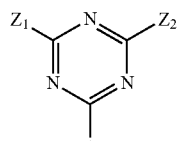

5c

In Formulae 5a, 5b, and 5c, $Z_1$ and $Z_2$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_6$-$C_{20}$ arylsilyl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxyl group, or a carboxyl group;

p is an integer from 1 to 5; and * is a binding site.

According to an embodiment of the present invention, X may be N.

According to an embodiment of the present invention, the compound of Formula 3 may be used (utilized) as a host material.

Examples of the compound of Formula 3 may include compounds represented by the following formulae without being limited thereto.

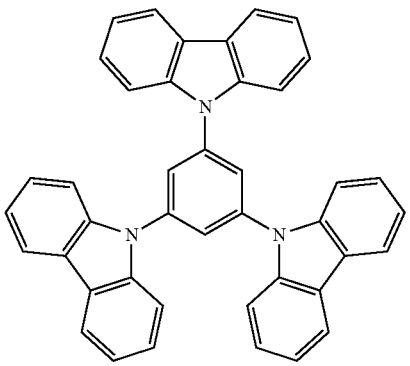

(1)

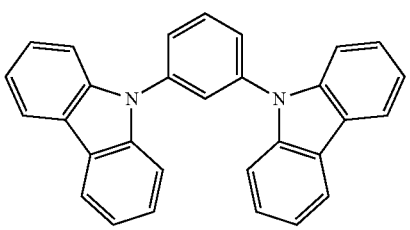

(2)

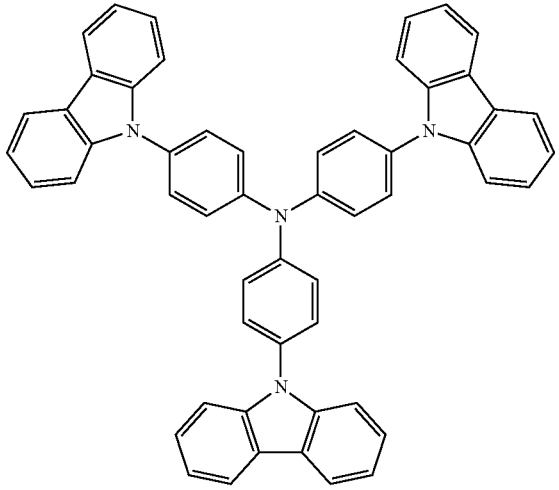

(3)

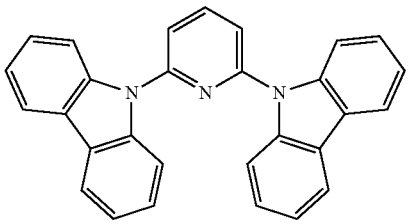

(4)

(5)
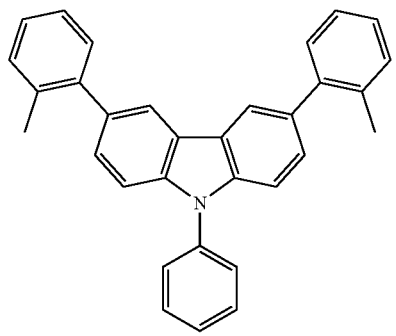
(8)
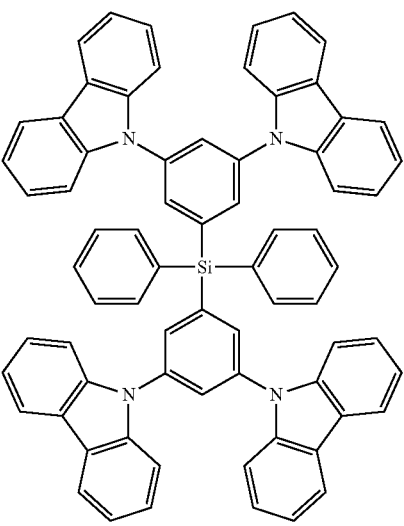
(6)
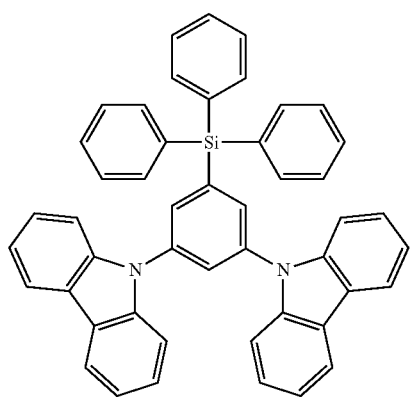
(9)
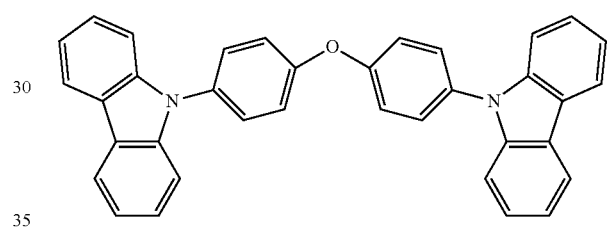
(10)
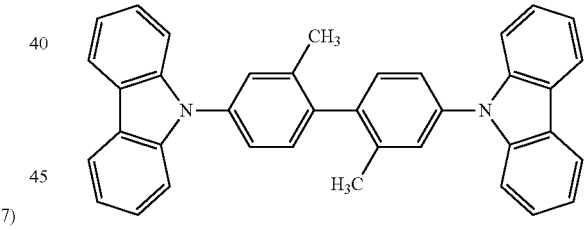
(11)
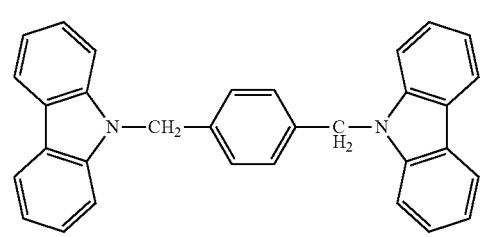
(7)
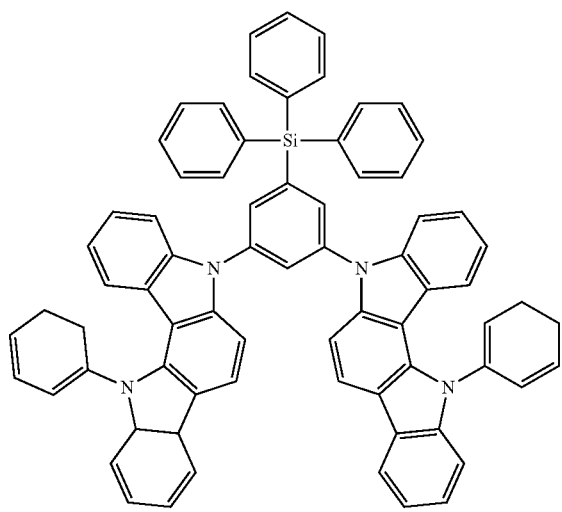
(12)
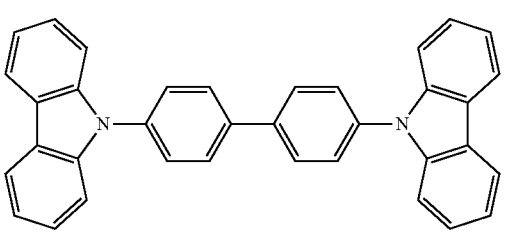

(13)
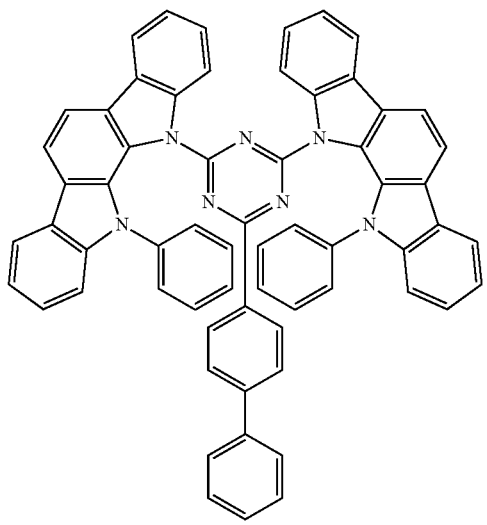
(14)
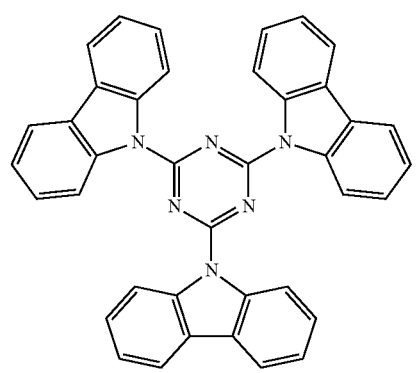
(15)
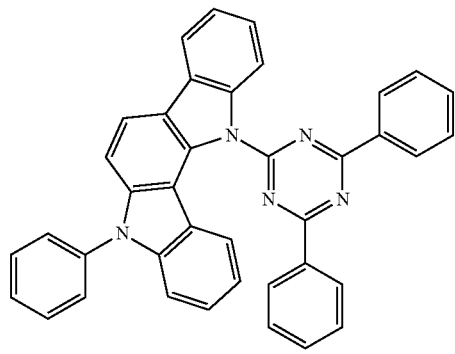
(16)
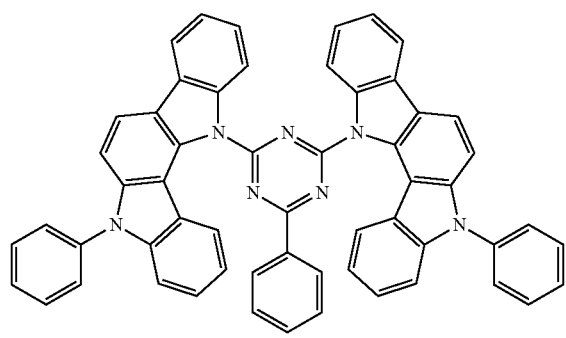
(17)
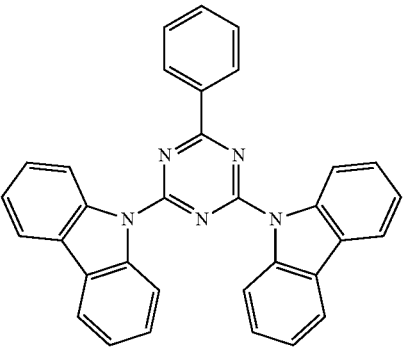
(18)
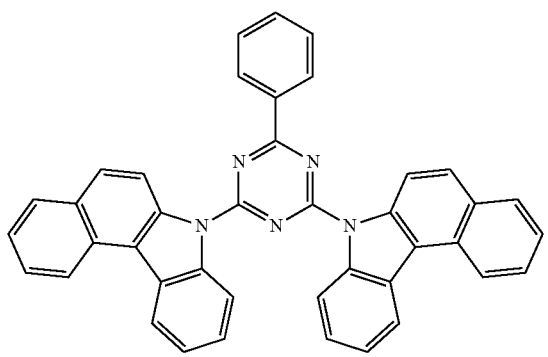
(19)
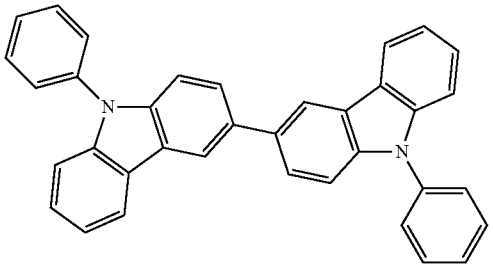
(20)
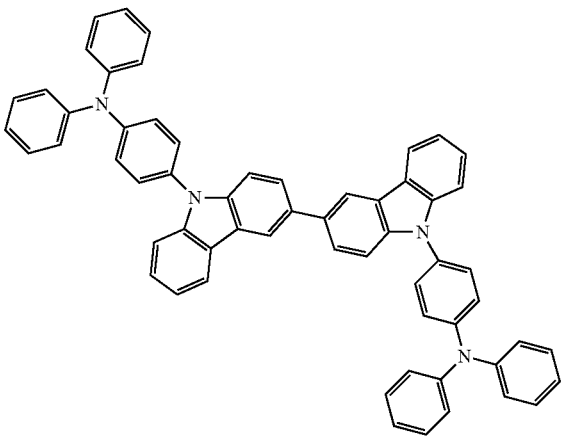

-continued (21)

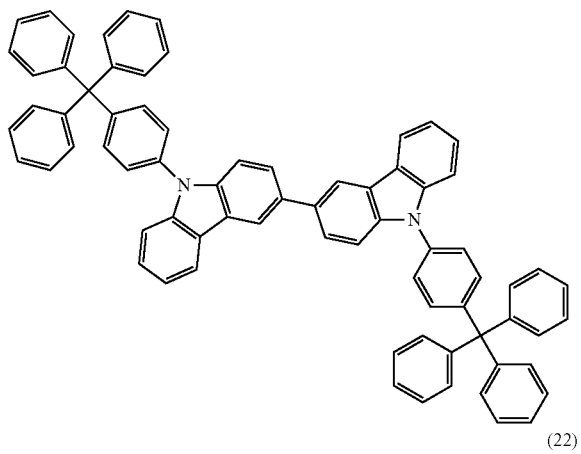

(22)

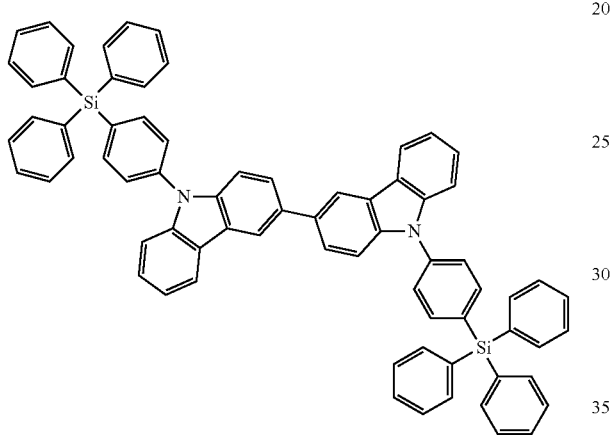

Alternatively, the EML may be formed using (utilizing) other suitable hosts and dopants. The dopant may include either a fluorescent dopant or a phosphorescent dopant, which are known in the art.

Suitable host materials may include Alq$_3$, 4,4'-N,N'-dicarbazol-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (refer to the following formula), and Compounds 501 to 509 below, but are not limited thereto.

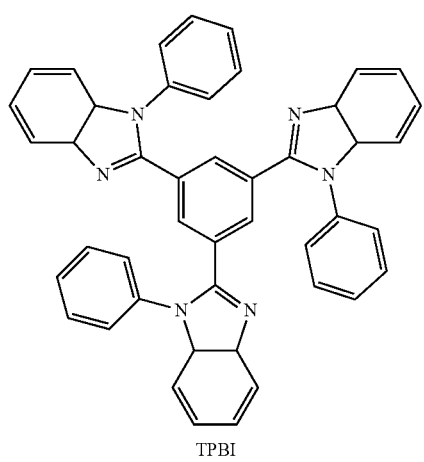

TPBI

-continued

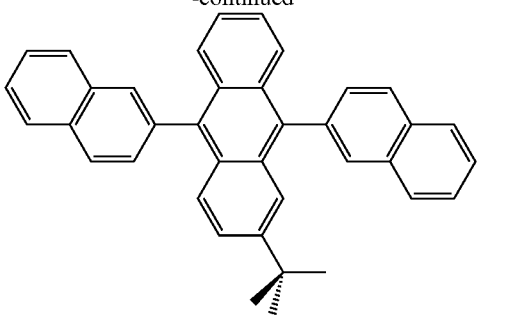

TBADN

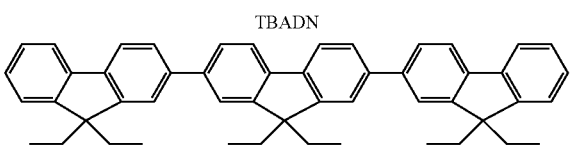

E3

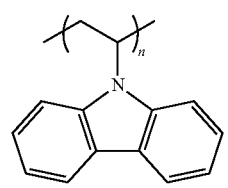

PVK

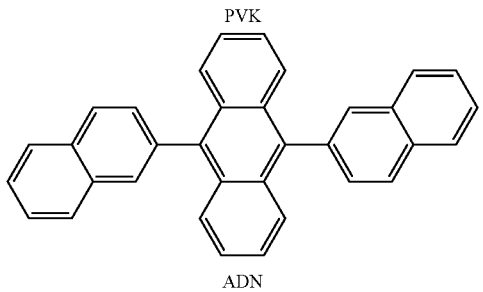

ADN

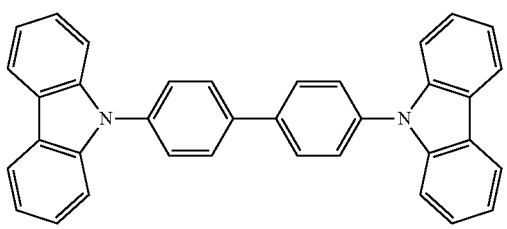

CBP

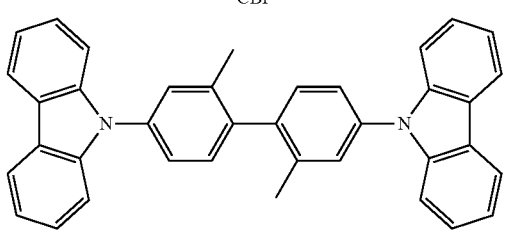

dmCBP

501

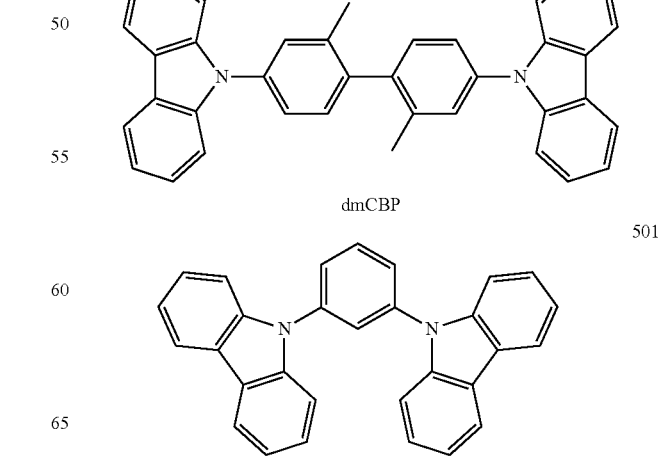

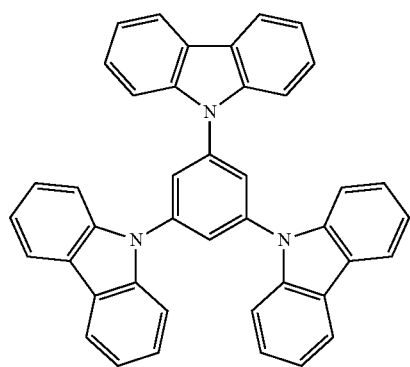
502
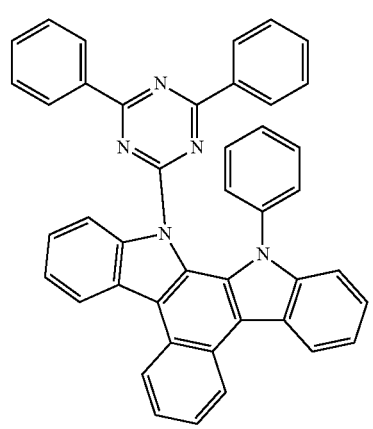
503
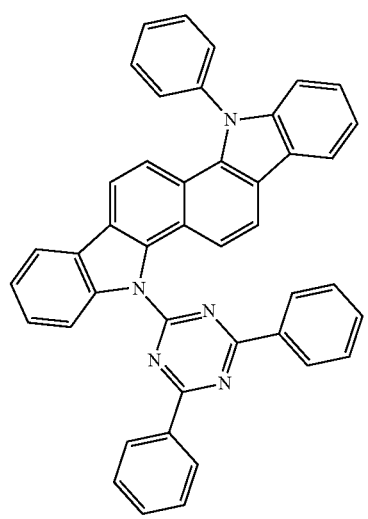
504
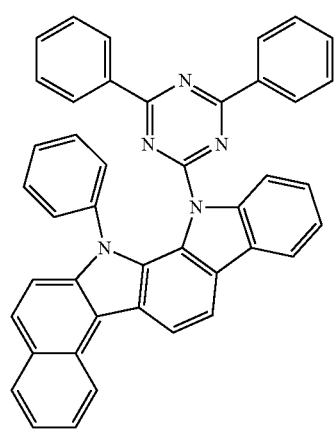
505
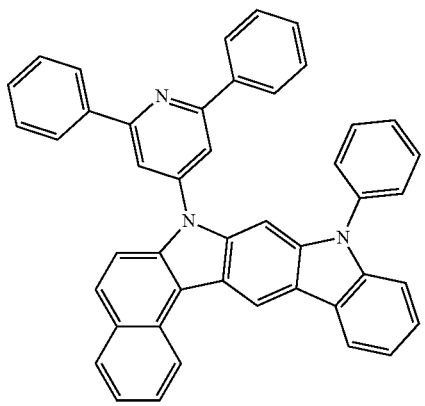
506
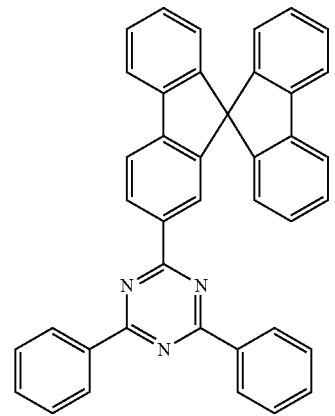
507
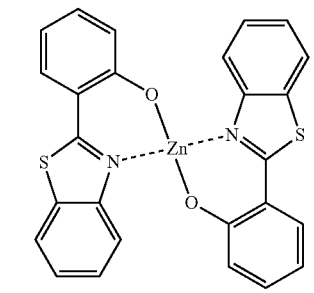
508

-continued

509

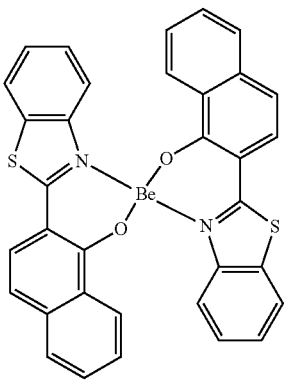

Alternatively, the host may be an anthracene-based compound represented by Formula 400 below.

Formula 400

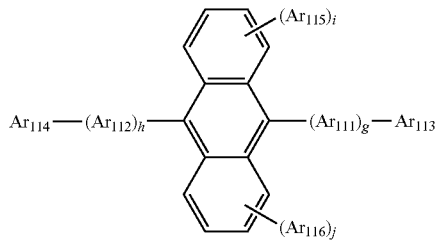

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

For example, in Formula 400, $Ar_{111}$ and $Ar_{112}$ may be a phenylene group, a naphthylene group, a phenanthrenylene group, or a pyrenylene group; or a phenylene group, a naphthylene group, a phenathrenylene group, a fluorenyl group, or a pyrenylene group, substituted with at least one selected from the group consisting of a phenyl group, a naphthyl group, and an anthryl group, but are not limited thereto.

In Formula 400, g, h, i, and j are each independently 0, 1, or 2.

In Formula 400, $Ar_{113}$ to $Ar_{116}$ may be each independently selected from the group consisting of: a $C_1$-$C_{10}$ alkyl group substituted with at least one selected from the group consisting of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, or a fluorenyl group, substituted with at least one selected from the group consisting of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

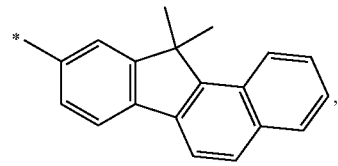 [SMILES: Cc1ccc2c(c1)C(C)(C)c1c-2ccc2ccccc12]

without being limited thereto.

For example, the anthracene-based compound represented by Formula 400 may be one or the following compounds, but is not limited thereto.

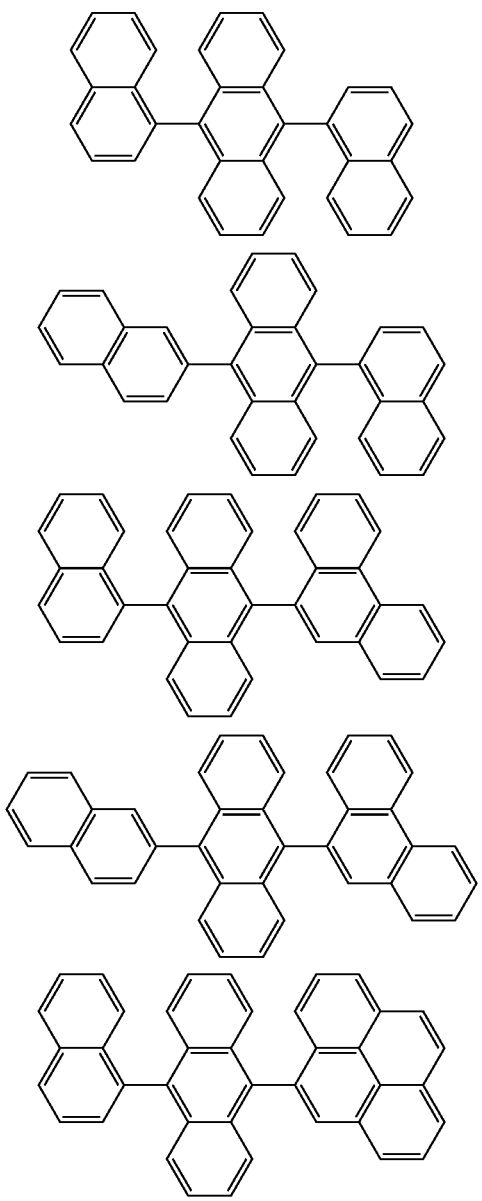

-continued
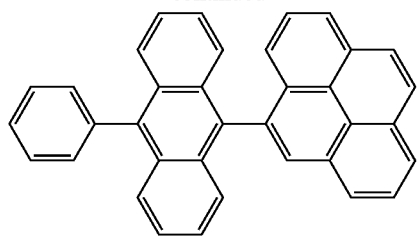
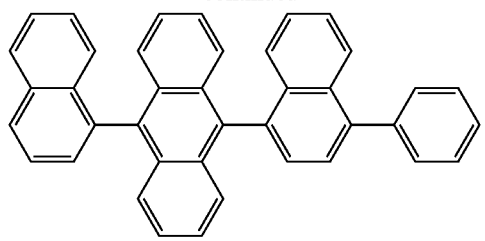
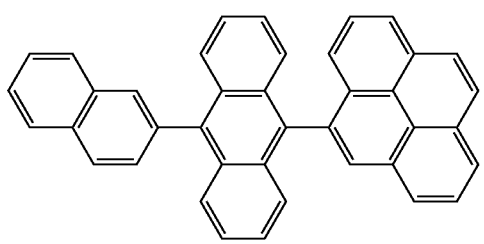
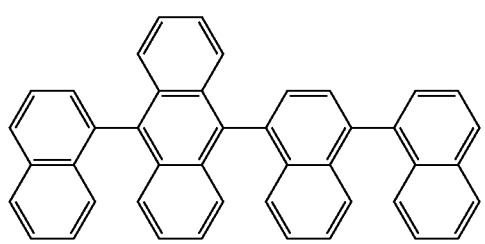
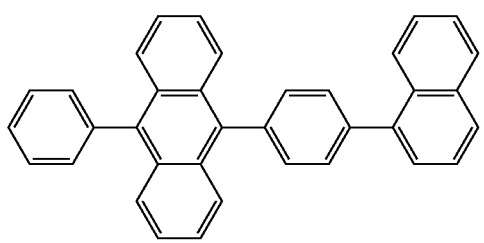
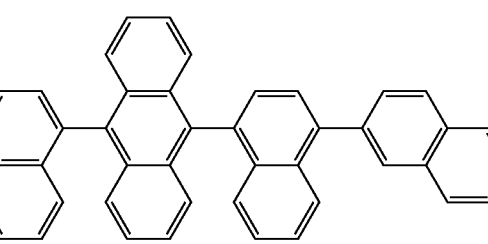
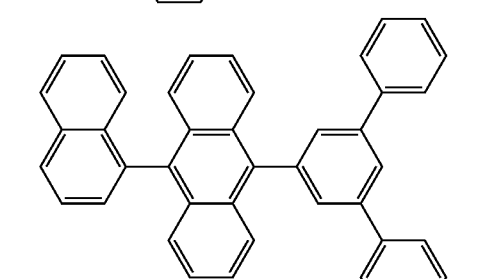
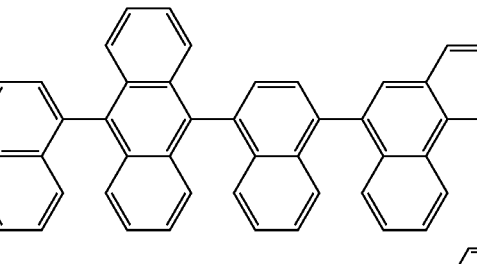
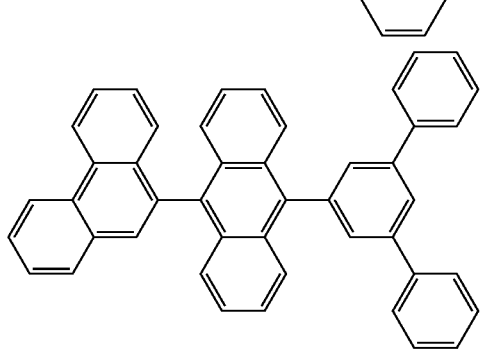
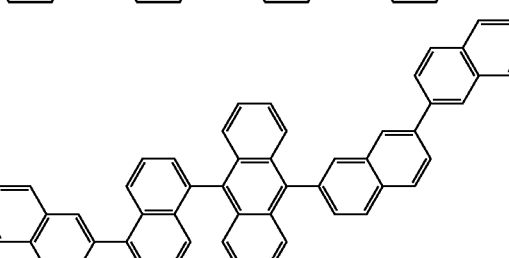
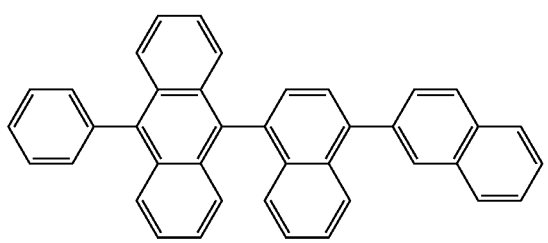
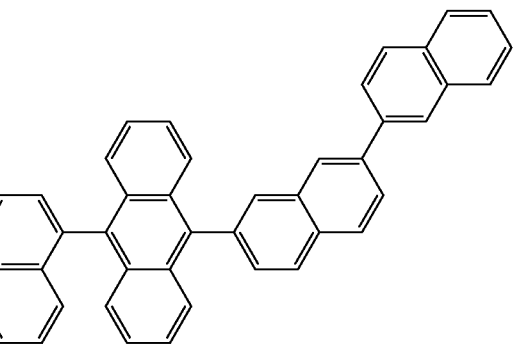

65
-continued
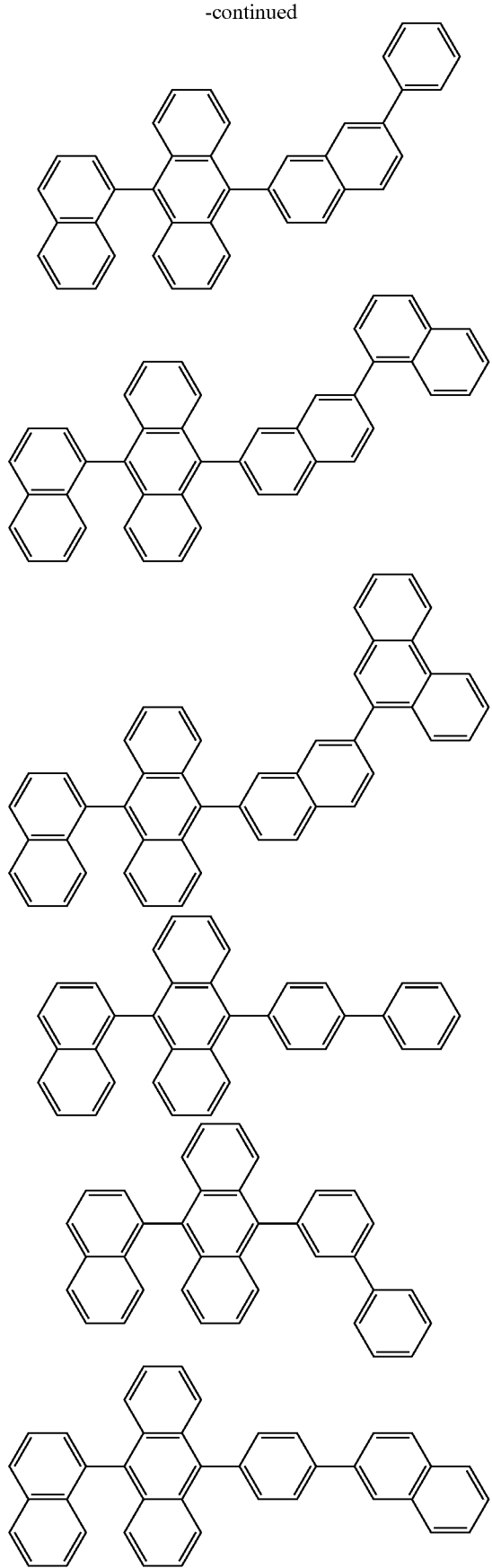
66
-continued
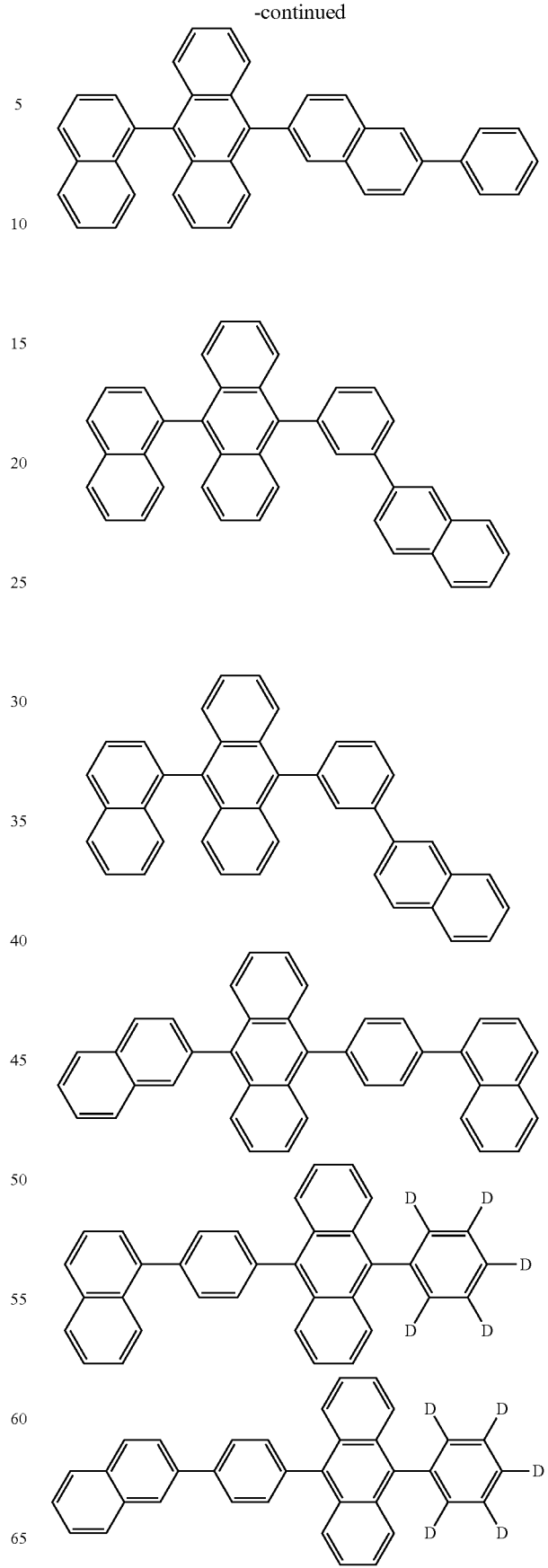

67
-continued
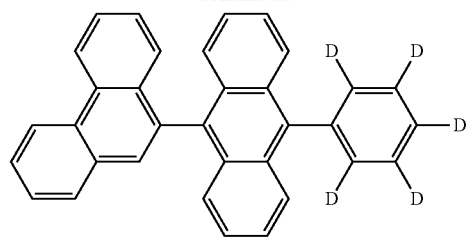
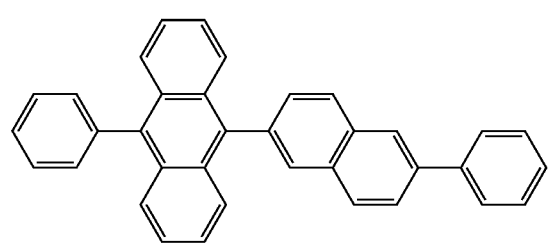
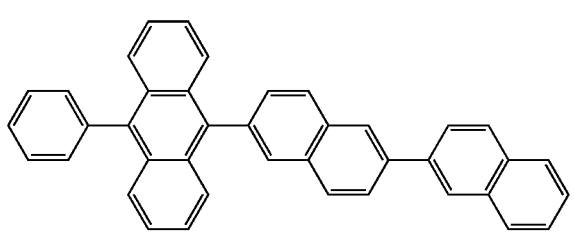
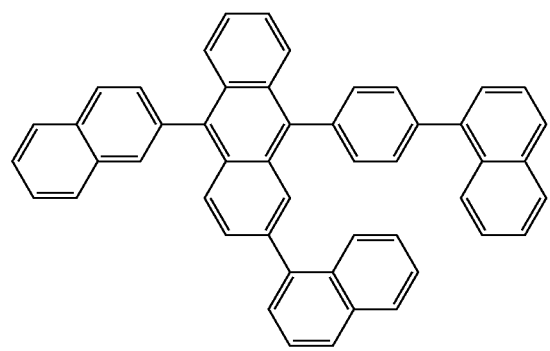
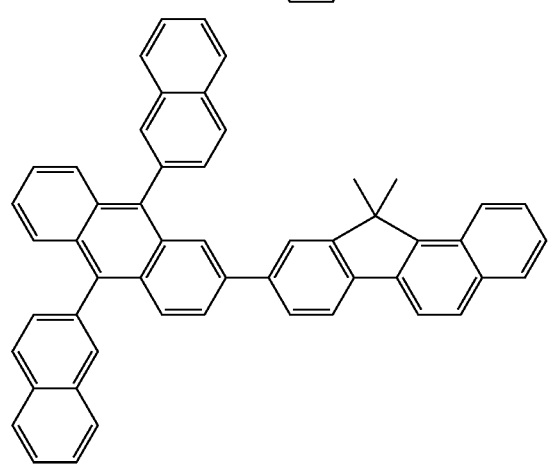
68
-continued
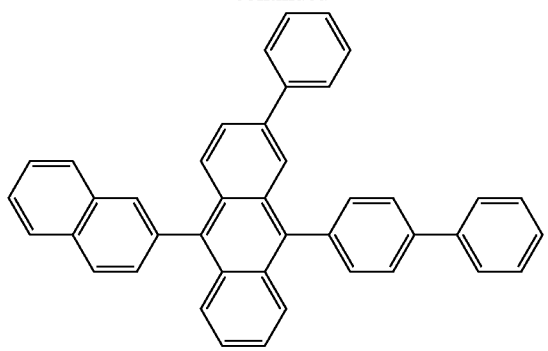
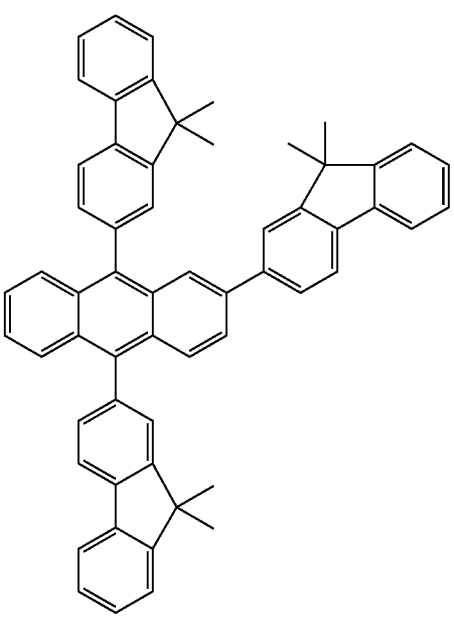
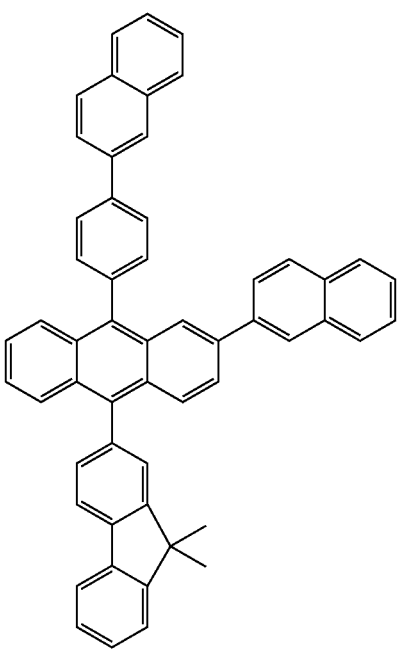

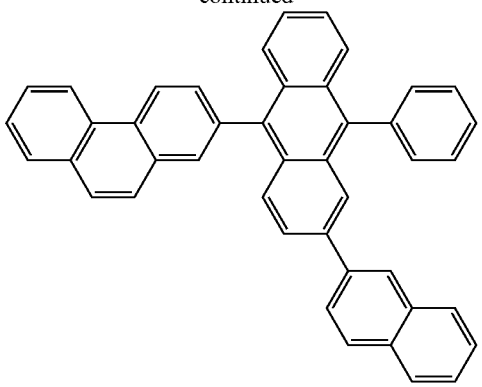

Alternatively, the host may be an anthracene-based compound represented by Formula 400 below.

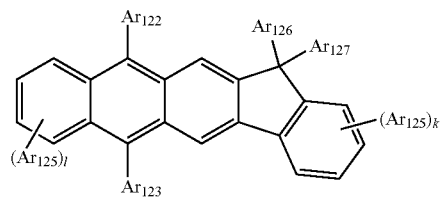

Formula 401

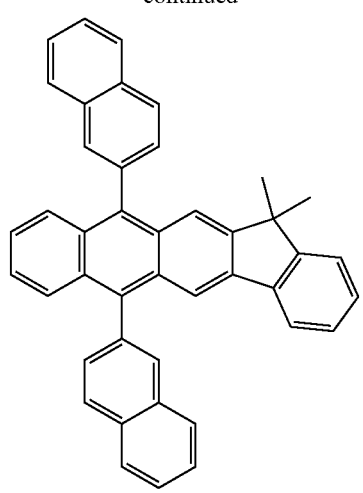

In Formula 401, $Ar_{122}$ to $Ar_{125}$ are defined as described above with reference to $Ar_{113}$ of Formula 400.

In Formula 401, $Ar_{126}$ and $Ar_{127}$ may be each independently a $C_1$-$C_{10}$ alkyl group (e.g., a methyl group, an ethyl group, or a propyl group).

In Formula 401, k and l may be each independently an integer from 0 to 4. For example, k and l may be 0, 1, or 2, respectively.

For example, the anthracene-based compound represented by Formula 401 may be one of the following compounds, but is not limited thereto.

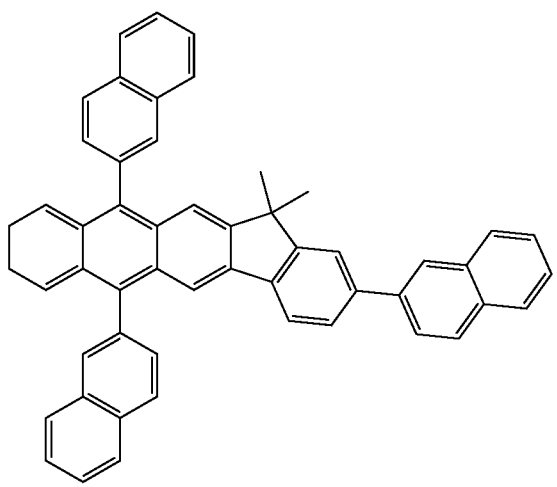

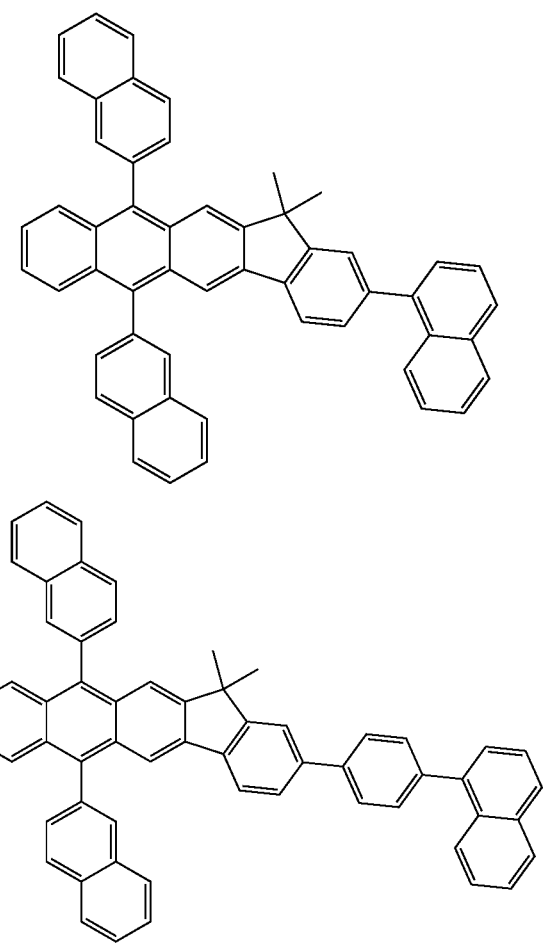

If the organic light-emitting device is a full-color organic light-emitting device, the EML may be patterned to a red EML, a green EML, and a blue EML.

Meanwhile, at least one of the red EML, the green EML, and the blue EML may include the organometallic complex according to the above described embodiment as a dopant, or a known dopant material below (ppy=phenylpyridine).

For example, the following compounds may be used (utilized) as a blue dopant, without being limited thereto.

71 72
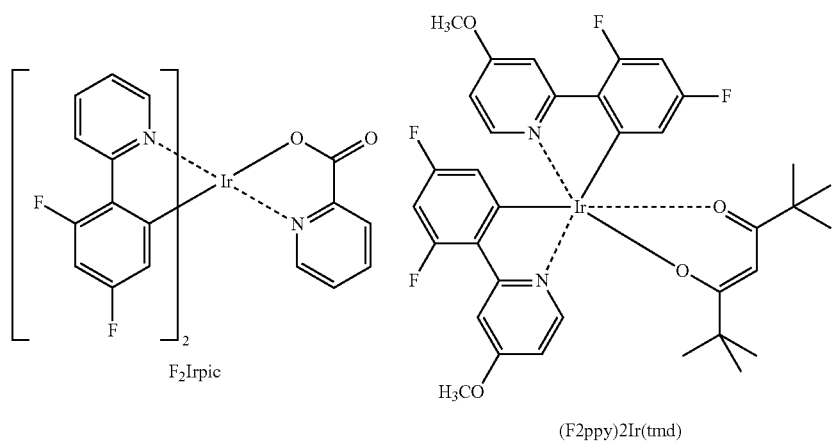
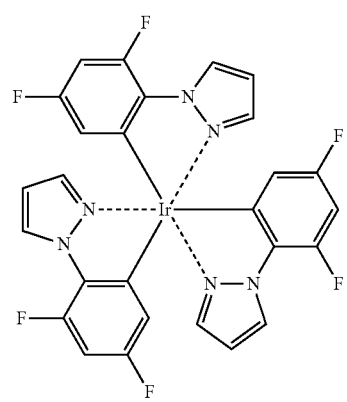
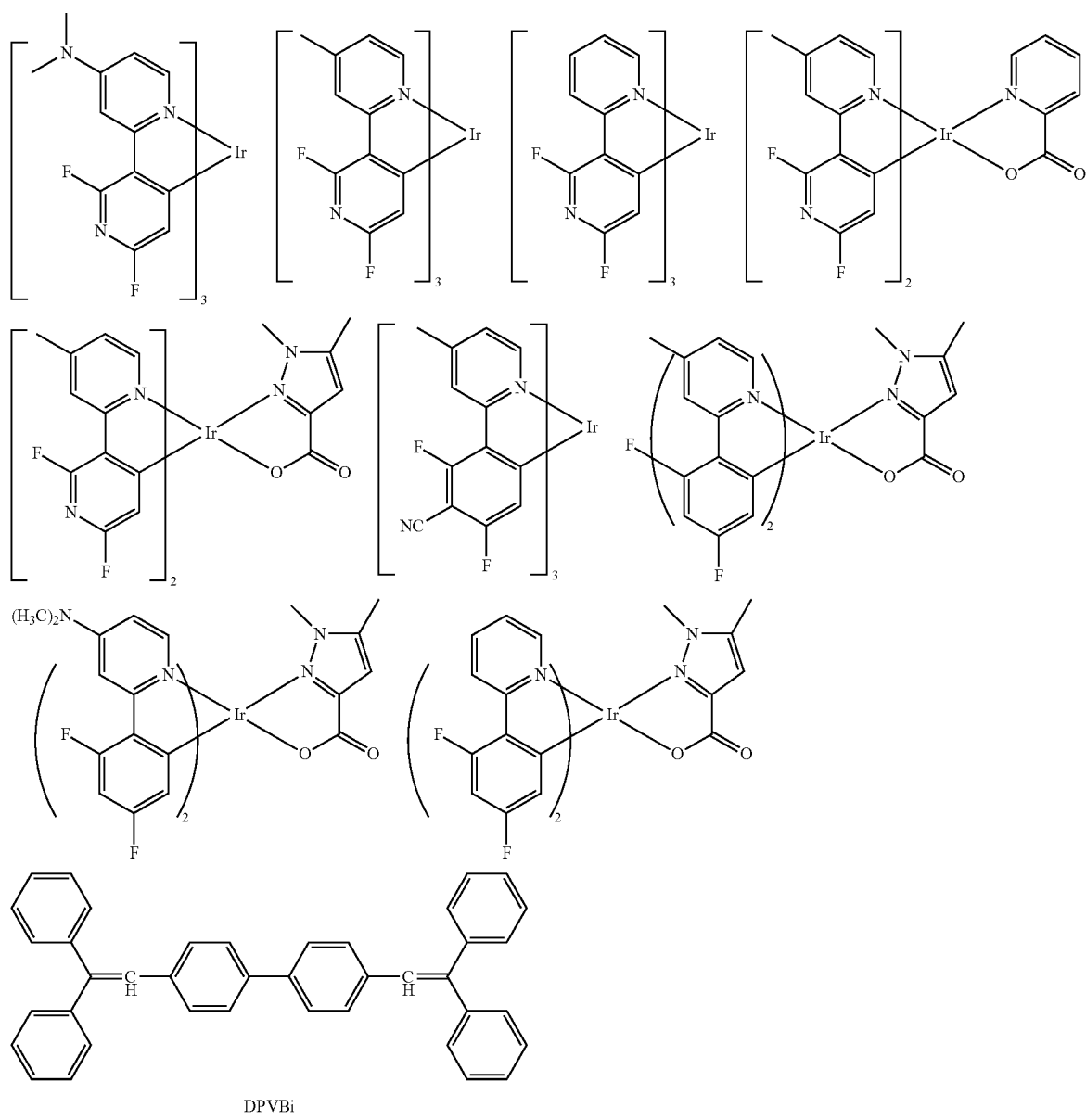

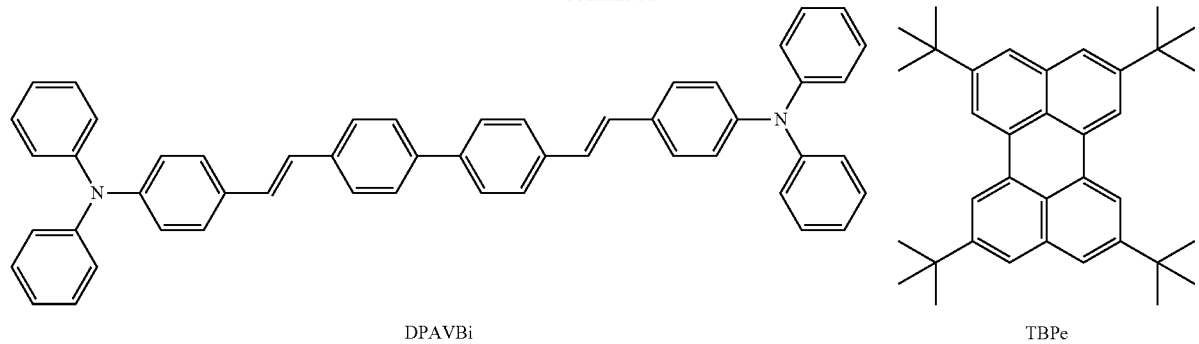
DPAVBi
TBPe
For example, the following compounds may be used (utilized) as a red dopant, without being limited thereto.
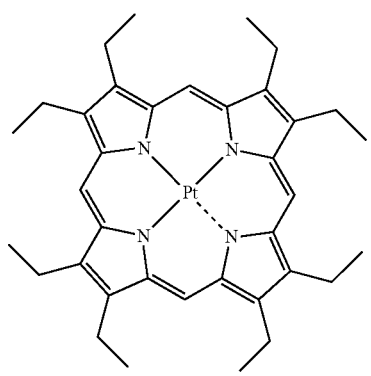
PtOEP
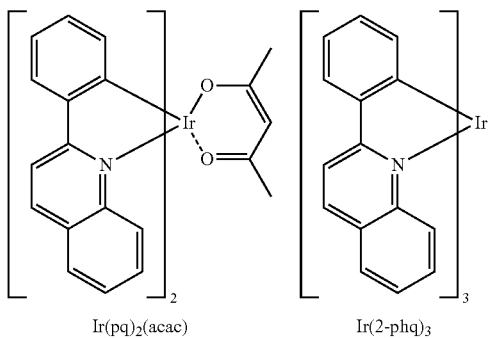
Ir(pq)$_2$(acac)   Ir(2-phq)$_3$
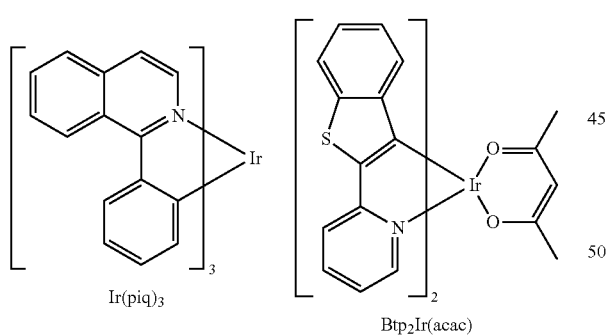
Ir(piq)$_3$   Btp$_2$Ir(acac)
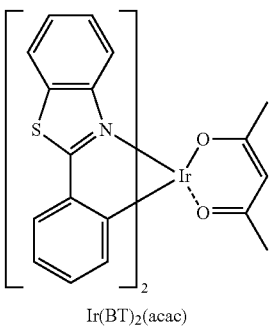
Ir(BT)$_2$(acac)
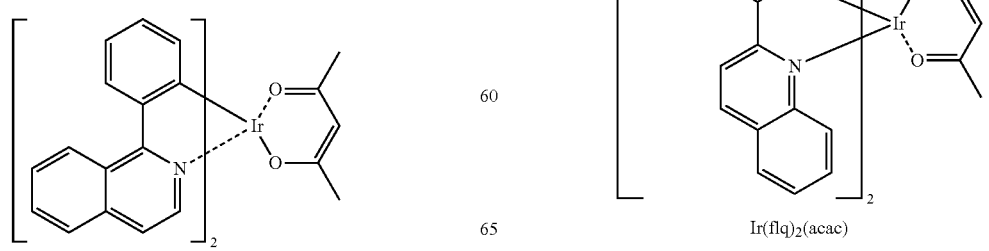
Ir(flq)$_2$(acac)

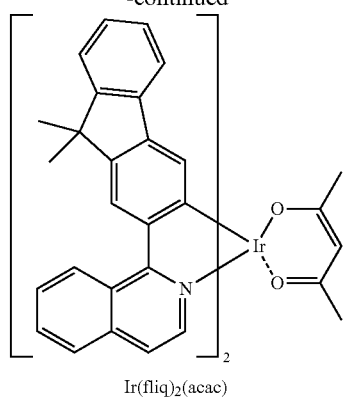
Ir(fliq)₂(acac)
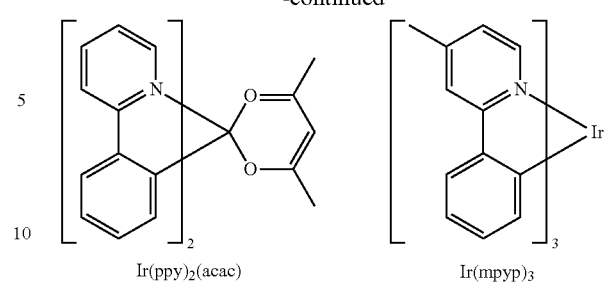
Ir(ppy)₂(acac)   Ir(mpyp)₃
C545T
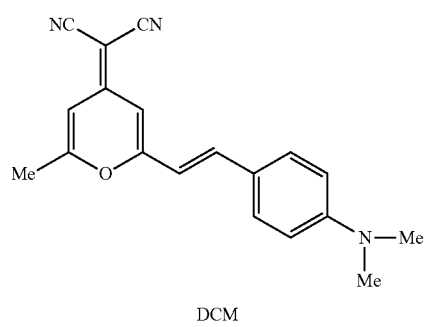
DCM
Meanwhile, the dopant used (utilized) in the EML may be a complex—as shown in formulae D1 to D50 below, without being limited thereto.
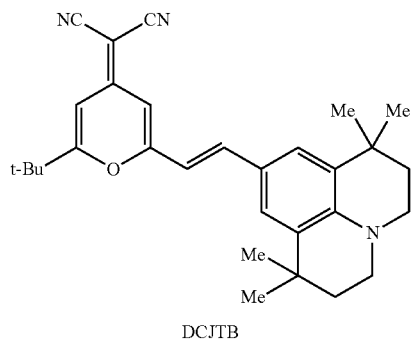
DCJTB
For example, the following compounds may be used (utilized) as a green dopant, without being limited thereto.
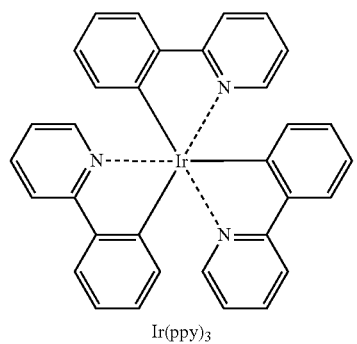
Ir(ppy)₃
D1
D2
D3

-continued
D4
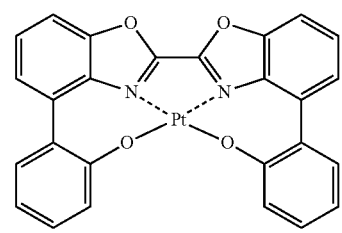
D5
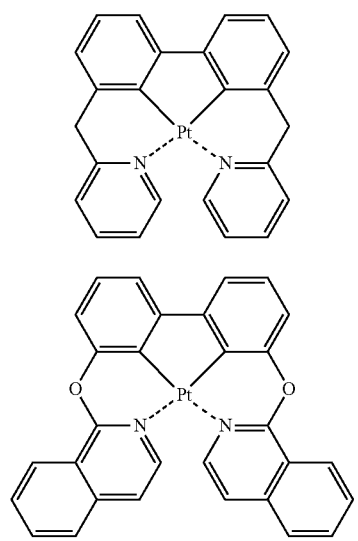
D6
D7
D8
D9
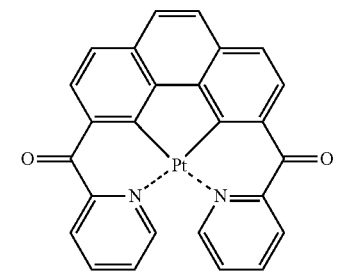
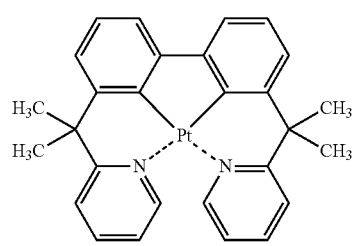
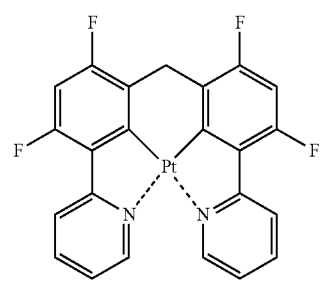
-continued
D10
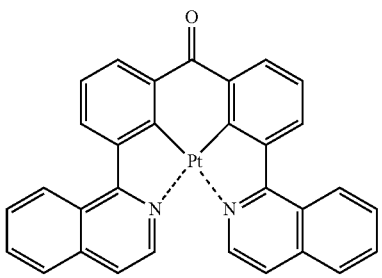
D11
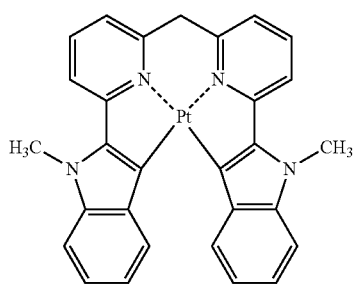
D12
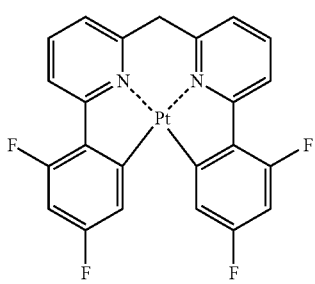
D13
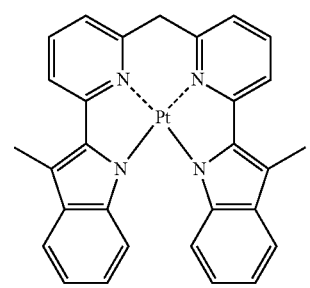
D14
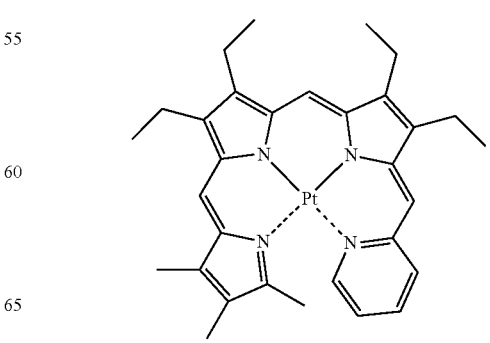

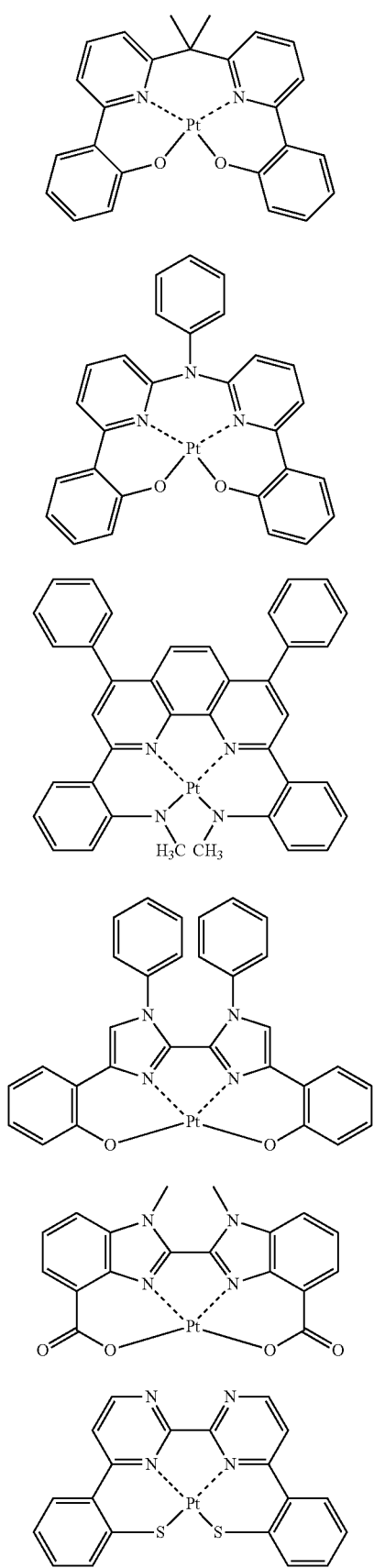
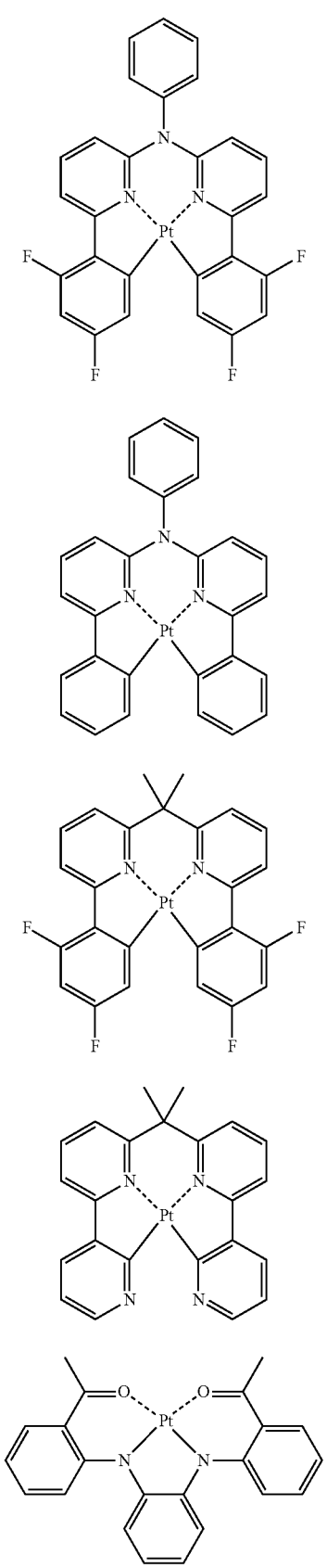

-continued
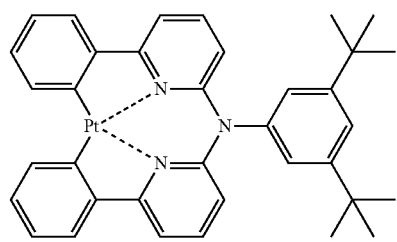
D26
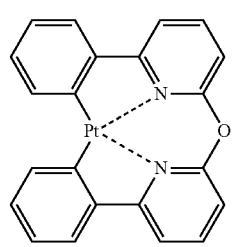
D27
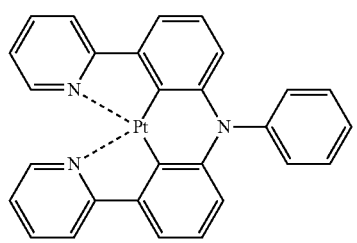
D28
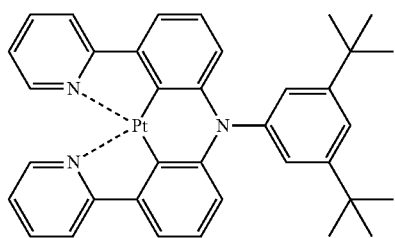
D29
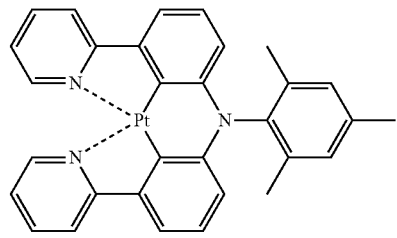
D30
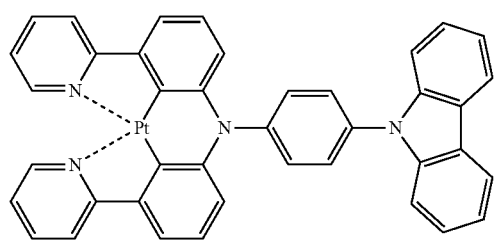
D31
-continued
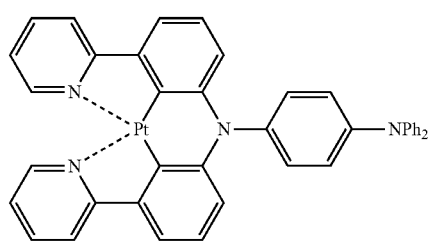
D32
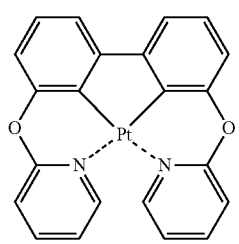
D33
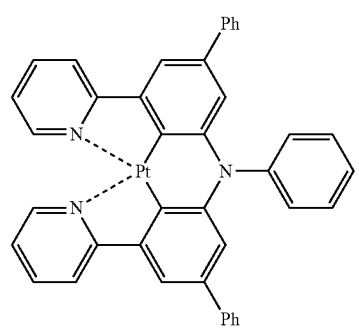
D34
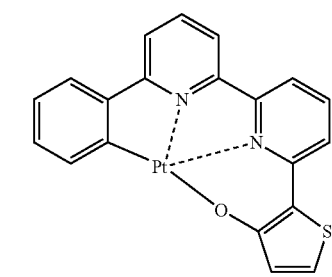
D35
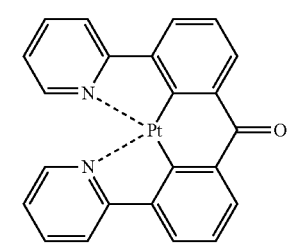
D36

D37
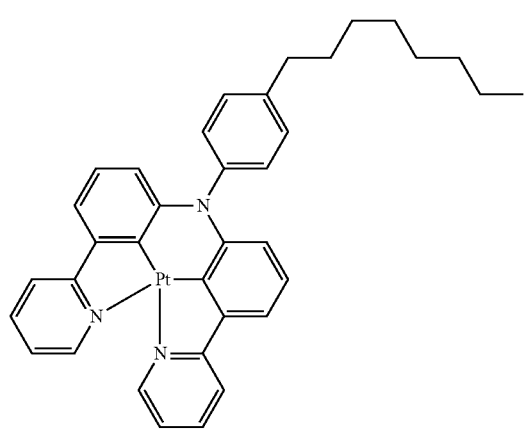
D38
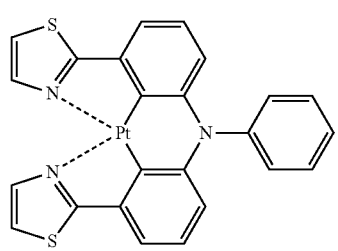
D39
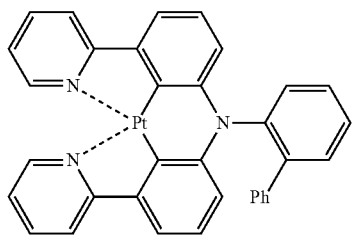
D40
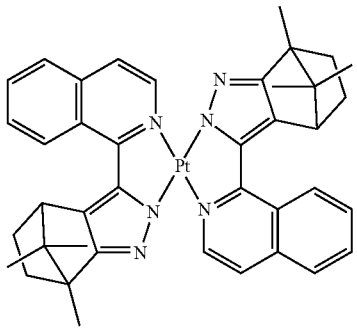
D41
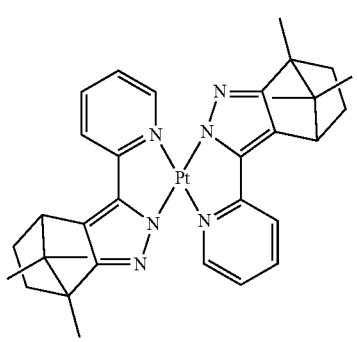
D42
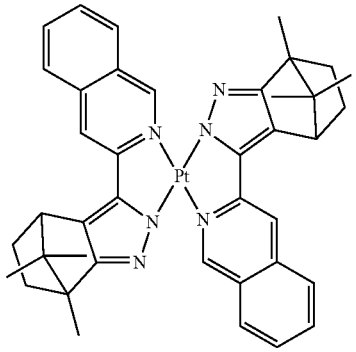
D43
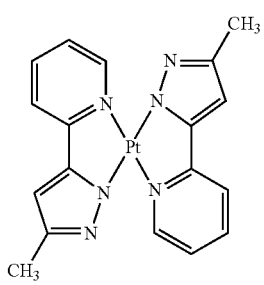
D44
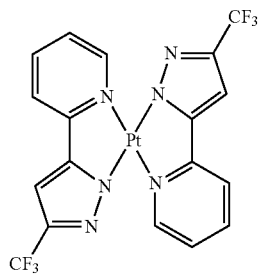
D45
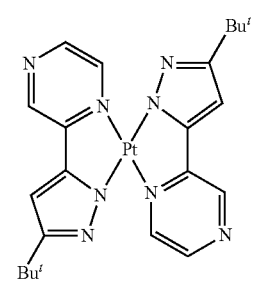
D46
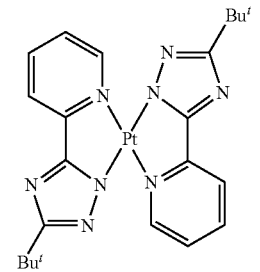

-continued

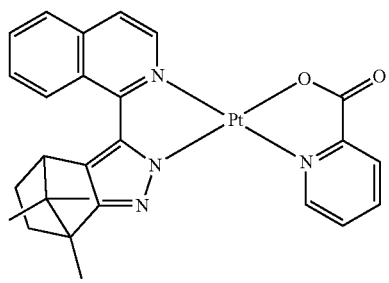
D47

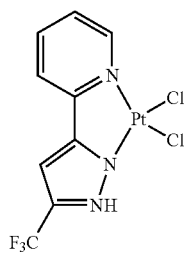
D48

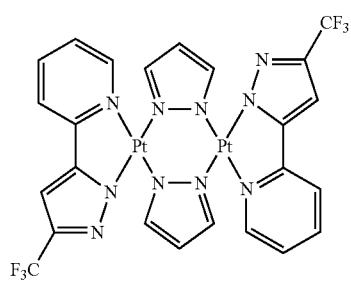
D49

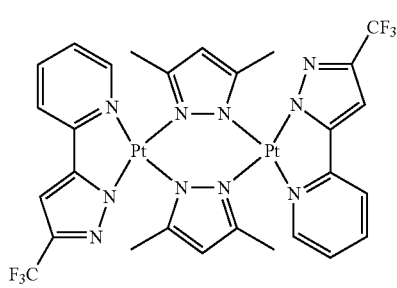
D50

Meanwhile, the dopant used (utilized) in the EML may be a complex as show below, without being limited thereto.

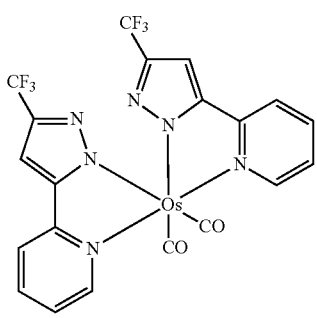

Os(fppz)$_2$(CO)$_2$

-continued

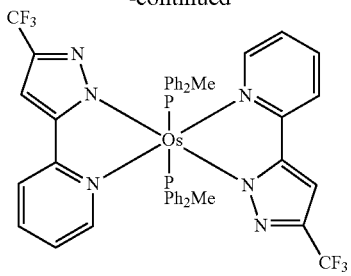

Os(fppz)$_2$(PPh$_2$Me)$_2$

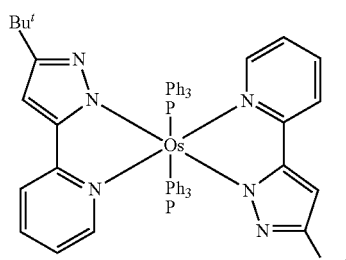

Os(bppz)$_2$(PPh$_3$)$_2$

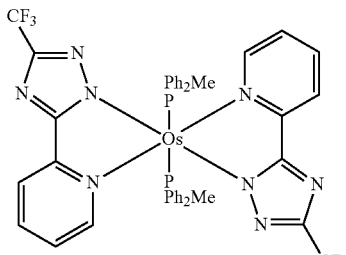

Os(fptz)$_2$(PPh$_2$Me)$_2$

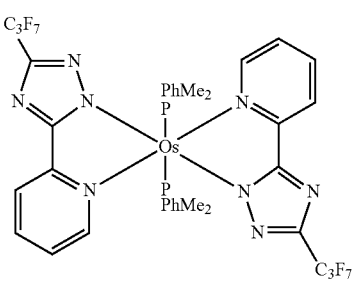

Os(hptz)$_2$(PPhMe$_2$)$_2$

When the EML includes a host and a dopant, the amount of the dopant may be in the range of about 0.01 to about 15 parts by weight based on 100 parts by weight of the host, without being limited thereto.

The thickness of the EML may be about 100 to about 1000 Å, and for example, about 200 to about 600 Å. In one embodiment, when the thickness of the EML is within this range, the EML has excellent light emitting ability without a substantial increase in driving voltage.

Then, the ETL may be formed on the EML by vacuum deposition, spin coating, casting, or the like. When the ETL is formed by using (utilizing) vacuum deposition or spin coating, the deposition and coating conditions may be similar to those used (utilized) to form the HIL, although the deposition and coating conditions may vary according to a compound that is used (utilized) to form the ETL.

A material that is used (utilized) to form the ETL may be any material capable of stably transporting electrons injected from the electron injecting electrode (cathode), and any suitable electron transporting material may be used (utilized). Examples of suitable electron transporting materials include quinoline derivatives, such as tris-(8-hydroxyquinoline)aluminum ($Alq_3$), TAZ, Balq, beryllium bis(benzoquinolin-10-olate) ($Balq_2$), ADN, Compound 201, and Compound 202, without being limited thereto.

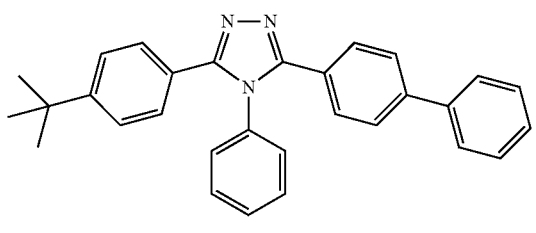

TAZ

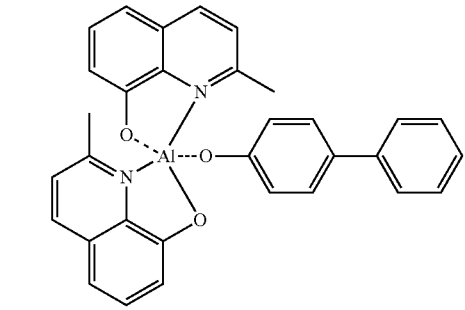

BAlq

Compound 201

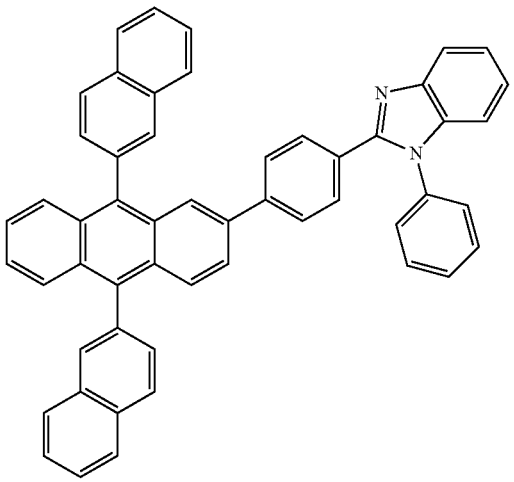

Compound 202

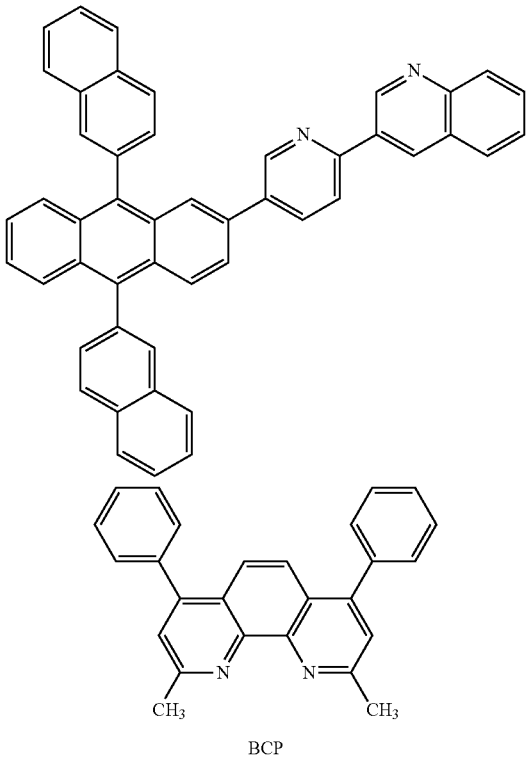

BCP

The thickness of the ETL may be about 100 to about 1000 Å, and for example, about 150 to about 500 Å. In one embodiment, when the thickness of the ETL is within this range, the ETL has excellent hole injecting ability without a substantial increase in driving voltage.

Alternatively, the ETL may further include a metal-containing material in addition to suitable electron transporting organic compounds.

The metal-containing material may include a Li complex. Examples of the Li complex include lithium quinolate (LiQ) and Compound 203 below, but are not limited thereto.

Compound 203

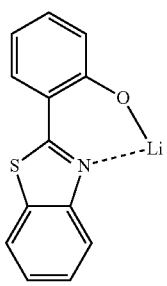

In addition, the EIL may be formed on the ETL using (utilizing) any suitable material that facilitates electron injection from the cathode without being limited thereto.

Examples of suitable electron injecting materials include LiF, NaCl, CsF, $Li_2O$, and BaO. The conditions for deposition of the EIL are similar to those for formation of the HIL, although the deposition conditions may vary according to a compound that is used (utilized) to form the EIL.

The thickness of the EIL may be in the range of about 1 to about 100 Å, for example, in the range of about 3 to about 90 Å. In one embodiment, when the thickness of the HIL is within this range, the HIL has excellent electron injecting ability without a substantial increase in driving voltage.

A second electrode is disposed on the organic layer. The second electrode may be a cathode, which is an electron injecting electrode. A material used (utilized) to form the second electrode may be a metal, an alloy, an electrically conductive compound, which have a low work function, or any mixture thereof. For example, the second electrode may be a transmissive electrode formed of lithium (Li), magnesium (Mg), aluminum (Al), an Al—Li alloy, calcium (Ca), an Mg—In alloy, or an Mg—Ag alloy in a thin film. Meanwhile, in order to manufacture a top-emission organic light-emitting device, a transmissive electrode formed of ITO or IZO may be used (utilized), and various modifications may be applied thereto.

The organic light-emitting device is described with reference to the drawing, but is not limited thereto.

In addition, when a phosphorescent dopant is used (utilized) to form the EML, an HBL may be formed between the HTL and the EML or between the H-functional layer and the EML by vacuum deposition, spin coating, casting, LB deposition, or the like, in order to reduce or prevent diffusion of triplet excitons or holes into the ETL. When the HBL is formed by vacuum deposition or spin coating, the conditions for deposition and coating may be similar to those for the formation of the HIL, although the conditions for the deposition and coating may vary according to the material that is used (utilized) to form the HBL. Any suitable hole blocking materials may be used (utilized), and examples of the suitable hole blocking materials include an oxadiazole derivative, a triazole derivative, and a phenanthroline derivative. For example, BCP may be used (utilized) as the hole blocking material.

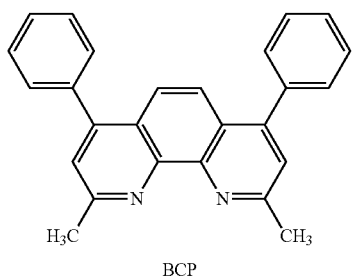 [SMILES: Cc1cc(-c2ccccc2)c2ccc3c(-c4ccccc4)cc(C)nc3c2n1 ; "BCP"]

BCP

The thickness of the HBL may be about 20 to about 1000 Å, and for example, about 30 to about 300 Å. In one embodiment, when the thickness of the HBL is within this range, the HBL has excellent hole blocking ability without a substantial increase in driving voltage.

The organic light-emitting device according to the current embodiment may be applied to various kinds of flat panel display devices, such as passive matrix organic light-emitting display devices or active matrix organic light-emitting display devices. For example, when the organic light-emitting device is applied to an active matrix organic light-emitting display device, the first electrode formed on the substrate may be electrically connected to a source electrode or a drain electrode of a thin-film transistor. The organic light-emitting device may also be applied to a flat panel display device having a double-sided screen.

The EML of the organic light-emitting device according to one embodiment may be formed of the compound represented by Formula 1 according to the above described embodiment by using (utilizing) a deposition method, or a wet method of coating a solution of the compound.

Hereinafter, one or more embodiments will be described in more detail with reference to the following examples. These examples are not intended to limit the purpose and scope of the one or more embodiments of the present invention.

SYNTHESIS EXAMPLES

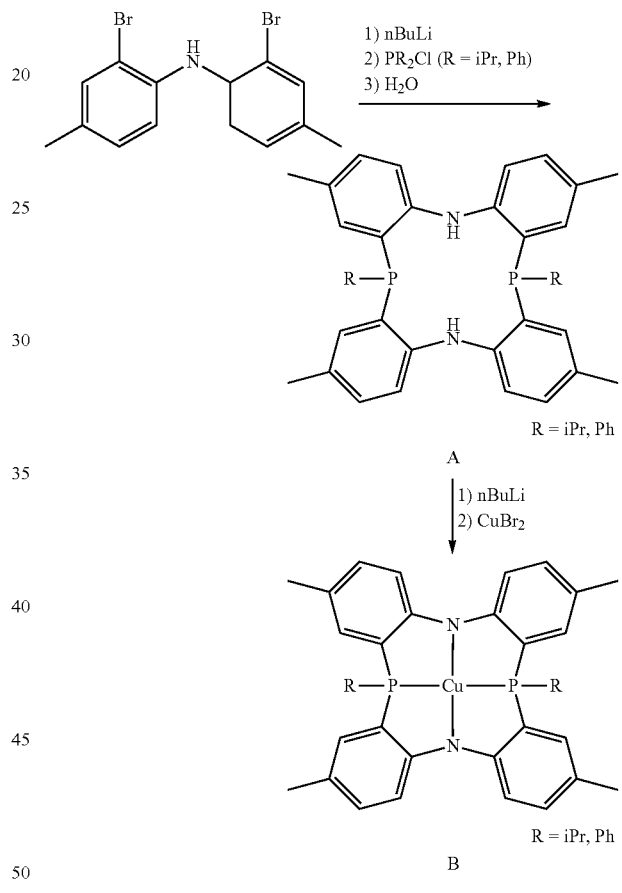

Synthesis Example 1

Synthesis Method A (R=$^i$Pr)

0.757 g (2.13 mmol) of dibromo-di-p-tolylamine was dissolved in 60 mL diethyl ether, and the solution was cooled to −35° C. 4.0 mL (6.4 mmol, 3 eq.) of nBuLi was added thereto, and the reaction mixture was heated to room temperature for 3 hours while stirring using (utilizing) a magnetic stirrer. The reaction mixture was cooled to −90° C., and 0.154 g (1.07 mmol) of P$^i$PrCl$_2$ was added thereto, and then the reaction mixture was heated to room temperature and stirred for 24 hours. The reaction mixture was cooled again to −90° C., and 0.159 g (1.07 mmol) of P$^i$PrCl$_2$ was further added thereto, and then the reaction mixture was heated to room temperature and stirred for 24 hours. The solvent was removed in a vacuum, and a remaining solid was dissolved in 50 mL of toluene. 3 eq. of nitrogen-filled distilled water was added thereto, and the reaction mixture was stirred for 30 minutes. After stirring, the reaction mixture was subjected to filtration using (utilizing) celite, and the solvent was removed from the filtered solution in a vacuum. Impurities were removed therefrom with pentane to obtain 0.074 g of white solid A (12.96%).

$^1$H-NMR (400 MHz, benzene-$d_6$, ppm) δ 7.34 (s, 4H, Ar—H), 7.28 (t, 2H, NH), 6.89 (m, 8H, Ar—H), 2.53 (m, 2H, CH), 2.10 (s, 12H), 1.11 (dd, 12H, $CH_3$), $^{31}$P-NMR (400 MHz, benzene-$d_6$, ppm) δ −36.6, ESI-MS {A+H}$^+$: calcd, 433.23. found, 433.23.; Elemental Analysis $C_{34}H_{40}N_2P_2$: C, 75.81; H, 7.49; N, 5.20.

Synthesis Example 2

Synthesis Method A (R=Ph)

0.568 g (1.60 mmol) of dibromo-di-p-tolylamine was dissolved in 100 mL diethyl ether, and the solution was cooled to −35° C. 2.0 mL (3.2 mmol, 2 eq.) of nBuLi was added thereto, and the reaction mixture was heated to room temperature for 3 hours while stirring using (utilizing) a magnetic stirrer. The reaction mixture was cooled to −35° C., and 0.149 g (0.81 mmol) of $PPhCl_2$ was added thereto, and then the reaction mixture was heated to room temperature and stirred for 24 hours. The reaction mixture was cooled again to −35° C., and 1.0 mL (1.6 mmol, 1 eq.) of nBuLi was further added thereto, and then the reaction mixture was stirred using (utilizing) a magnetic stirred for 3 hours while heating to room temperature. The reaction mixture was cooled again to −100° C., and 0.148 g (0.80 mmol) of $PPhCl_2$ was further added thereto, and then the reaction mixture was heated to room temperature and stirred for 24 hours. The solvent was removed in a vacuum, and a remaining solid was dissolved in 50 mL of toluene. 5 mL of nitrogen-filled distilled water was added thereto, the reaction mixture was stirred for 30 minutes, and the solvent was removed therefrom in a vacuum. A toluene solution of the remaining solid was subjected to filtration using (utilizing) celite, and the solvent was removed therefrom in a vacuum. Impurities were removed therefrom using (utilizing) a solvent including pentane and benzene (9:1) to obtain 0.072 g of white solid A (7.4%).

$^{31}$P-NMR (400 MHz, benzene-$d_6$, ppm) δ −37.6, ESI-MS {A+H}$^+$: calcd, 607.24; found, 607.24. Elemental analysis $C_{40}H_{36}N_2P_2$: C, 79.19; H, 5.98; N, 4.62.

Synthesis Example 3

Synthesis Method B ($N_2P_2$)Cu (R=iPr)

0.095 g (0.18 mmol) of solid A from Synthesis Example 1 was dissolved in 10 mL of THF, and the solution was cooled to −35° C. 0.15 mL (0.38 mmol, 2 eq.) of nBuLi was added thereto, and the reaction mixture was heated to room temperature for 3 hours while stirring using (utilizing) a magnetic stirrer. The reaction mixture was cooled to −35° C., and 0.042 g (0.19 mmol) of $CuBr_2$ dissolved in 5 mL of THF was added thereto, and then the reaction mixture was heated to room temperature and stirred for 24 hours. After stirring, the solvent was removed in a vacuum and the reaction mixture was subjected to filtration in a state of being dissolved in benzene. Benzene was removed from the resultant solution in a vacuum, and impurities were removed therefrom using (utilizing) pentane. As a result, 0.047 g of yellow solid C was obtained (43.5%). UV-vis [THF, nm (L mol$^{-1}$ cm$^{-1}$)]: 476 (292), 428 (950), Elemental analysis $C_{34}H_{38}CuN_2P_2$: C, 68.04; H, 6.38; N, 4.67.

Synthesis Example 4

Synthesis Method B ($N_2P_2$)Cu (R=pH)

0.030 g (0.05 mmol) of solid A from Synthesis Example 2 was dissolved in 10 mL of THF, and the solution was cooled to −35° C. 404 (0.10 mmol, 2 eq.) of nBuLi was added thereto, and the reaction mixture was heated to room temperature for 3 hours while stirring using (utilizing) a magnetic stirrer. The reaction mixture was cooled to −35° C., and 0.015 g (0.07 mmol) of $CuBr_2$ dissolved in 5 mL of THF was added thereto, and then the reaction mixture was heated to room temperature and stirred for 48 hours. After stirring, the solvent was removed in a vacuum and the reaction mixture was subjected to filtration in a state of being dissolved in benzene. Benzene was removed from the resultant solution in a vacuum, and impurities were removed therefrom using (utilizing) a mixture solution of pentane and benzene (9:1). As a result, 0.021 g of yellow solid B was obtained (35.9%). Elemental analysis $C_{40}H_{34}CuN_2P_2$: C, 71.90; H, 5.13; N, 4.19.

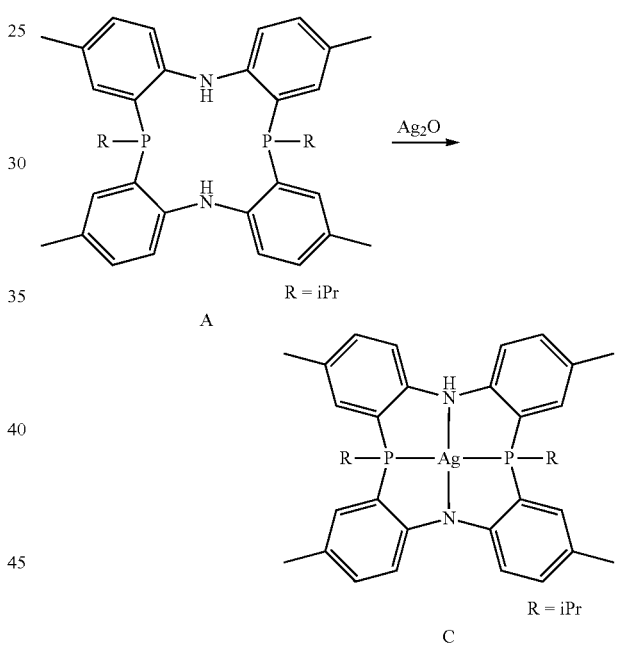

Synthesis Example 5

Synthesis Method C (PNPN(H))Ag 0.116 g (0.05 mmol) of $Ag_2O$ was added to a solution prepared by dissolving 0.030 g (0.05 mmol) of solid A from Synthesis Example 1 in 10 mL of THF, and the reaction mixture was stirred for 48 hours using (utilizing) a magnetic stirrer. After the reaction mixture was subjected to filtration using (utilizing) celite, pentane was added thereto, and the mixture was cooled to −35° C. to obtain solid.

Elemental analysis $C_{34}H_{39}AgN_2P_2$: C, 63.26; H, 6.09; N, 4.34

Example 1

An ITO glass substrates was cut into a size of 50 mm×50 mm×0.5 mm and sonicated with isopropyl alcohol for 15 minutes, and pure water for 15 minutes, followed by exposure to UV ozone for 30 minutes. Then, an HIL was formed on the glass substrate by vacuum-depositing NPB at a deposition rate of 1 Å/sec to a thickness of 600 Å, and an HTL was formed by vacuum-depositing TAPC thereon at a deposition rate of 1 Å/sec to a thickness of 300 Å. Then, an EML was formed on the HTL by co-depositing, in a vacuum, the compound prepared in Synthesis Example 3 and 4,4'-Bis(carbazol-9-yl)biphenyl (CBP) at deposition rates of 0.05 Å/sec and 1 Å/sec respectively to a thickness of 300 Å. Then, an ETL was formed on the EML by vacuum-depositing $Alq_3$ to a thickness of 300 Å. An EIL and a cathode were sequentially formed on the ETL by sequentially vacuum-depositing LiF and Al to thicknesses of 10 Å and 2000 Å, respectively, thereby preparing an organic light-emitting device.

Example 2

An organic light-emitting device having an ITO/NPB (600Å)/TAPC (300Å)/5% compound of Synthesis Example 4+CBP (300Å)/$Alq_3$(300Å)/LiF(10Å)/Al(2000Å) structure was prepared in the same manner as in Example 1, except that the compound prepared in Synthesis Example 4 was used (utilized) as a dopant instead of the compound prepared in Synthesis Example 3.

Example 3

An organic light-emitting device having an ITO/NPB (600Å)/TAPC (300Å)/5% compound of Synthesis Example 3+mCP (300Å)/$Alq_3$(300Å)/LiF(10Å)/Al(2000Å) structure was prepared in the same manner as in Example 1, except that 1,3-bis(N-carbazoyl)benzene (mCP) was used (utilized) as a host instead of CBP.

Example 4

An organic light-emitting device having an ITO/NPB (600Å)/TAPC (300Å)/5% compound of Synthesis Example 4+mCP (300Å)/$Alq_3$(300Å)/LiF(10Å)/Al(2000Å) structure was prepared in the same manner as in Example 3, except that the compound prepared in Synthesis Example 4 was used (utilized) as a dopant instead of the compound prepared in Synthesis Example 3.

Comparative Example 1

An organic light-emitting device having an ITO/NPB (600Å)/TAPC (300Å)/5% $Ir(ppy)_3$+CBP (300Å)/$Alq_3$ (300Å)/LiF(10Å)/Al(2000Å) structure was prepared in the same manner as in Example 1, except that $Ir(ppy)_3$ below was used (utilized) as a dopant instead of the compound prepared in Synthesis Example 3.

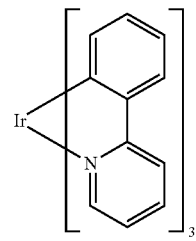

Measurement results of the organic light-emitting devices according to Examples 1 to 4 and Comparative Example 1 are shown in Table 1 below.

The organic light-emitting devices according to Examples 1 to 4 and Comparative Example 1 exhibit high (e.g., maximum) luminous efficiency at 512 nm to 533 nm corresponding to green light emission region.

TABLE 1

|  | External quantum efficiency (@1000 $cd/m^2$) | Voltage (@1000 $cd/m^2$) |
|---|---|---|
| Example 1 | 13.4% | 3.5. |
| Example 2 | 12.1% | 3.8. |
| Example 3 | 10.1% | 4.0. |
| Example 4 | 11% | 3.9. |
| Comparative Example 1 | 11.3% | 3.8. |

As described above, according to the one or more of the above embodiments of the present invention, the organometallic complex of Formula 1 has excellent stability and may be efficiently used (utilized) as a light-emitting material. Accordingly, an organic light-emitting device having high luminous efficiency, low driving voltage, high brightness, and long lifespan may be fabricated using (utilizing) the organometallic complex.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organometallic complex represented by Formula 2 below:

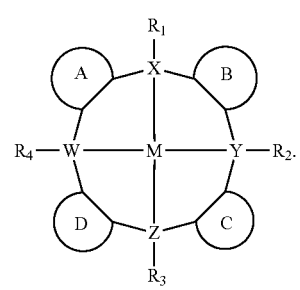

Formula 2 wherein M is a metal selected from silver (Ag), gold (Au) and copper (Cu);

A, B, C, and D are each independently a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group;

each of X and Z is N and each of Y and W is P, or each of X and Z is P and each of Y and W is N;

for each of X, Y, Z and W that is N, a corresponding one of $R_1$ to $R_4$ is a lone electron pair or H, and for each of X, Y, Z and W that is P, a corresponding one of $R_1$ to $R_4$ is =O; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a $C_3$-$C_{60}$ alkylsilyl group; a $C_6$-$C_{60}$ arylsilyl group; or a $C_7$-$C_{60}$ alkylarylsilyl group.

2. The organometallic complex of claim 1, wherein A, B, C, and D are each independently represented by one of Formulae 2a to 2f below:

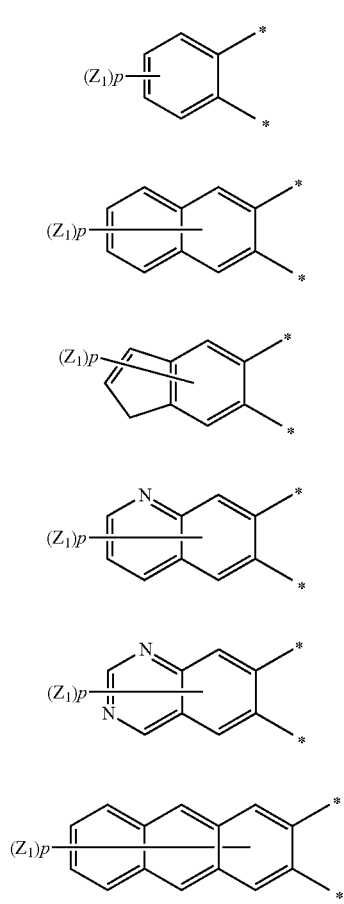

wherein $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxy group, or a carboxy group;

p is an integer from 1 to 8; and

* is a binding site with X, Y, Z or W.

3. The organometallic complex of claim 1, wherein for each of X, Y, Z and W that is N, a corresponding one of $R_1$ to $R_4$ is a lone pair electron, and for each of X, Y, Z and W that is P, a corresponding one of $R_1$ to $R_4$ is independently represented by one of Formulae 3a to 3f below:

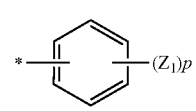
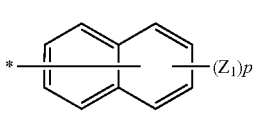
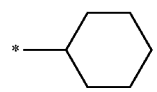
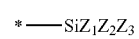

wherein $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxy group, or a carboxy group;

wherein $Z'_1$ to $Z'_3$ are each independently a substituted or unsubstituted $C_1$-$C_{20}$ alkyl group, or a substituted or unsubstituted $C_6$-$C_{20}$ aryl group;

p is an integer from 1 to 7; and

* is a binding site.

4. The organometallic complex of claim 1, wherein M is Cu, and the complex of Formula 2 is a delayed fluorescent material.

5. The organometallic complex of claim 1, wherein the complex of Formula 2 is one selected from the group consisting of the following compounds:

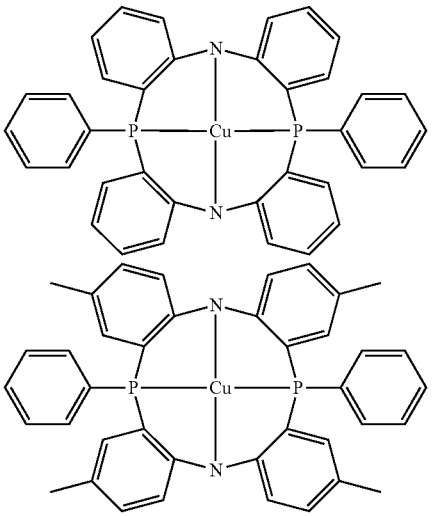

97
-continued
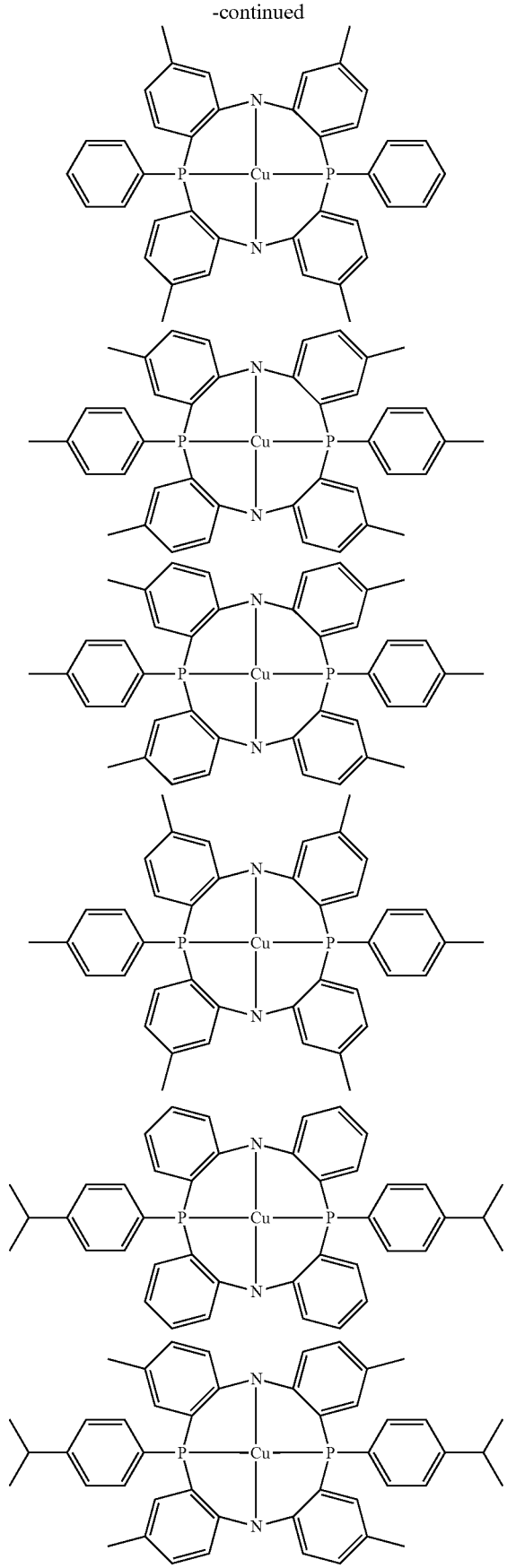
98
-continued
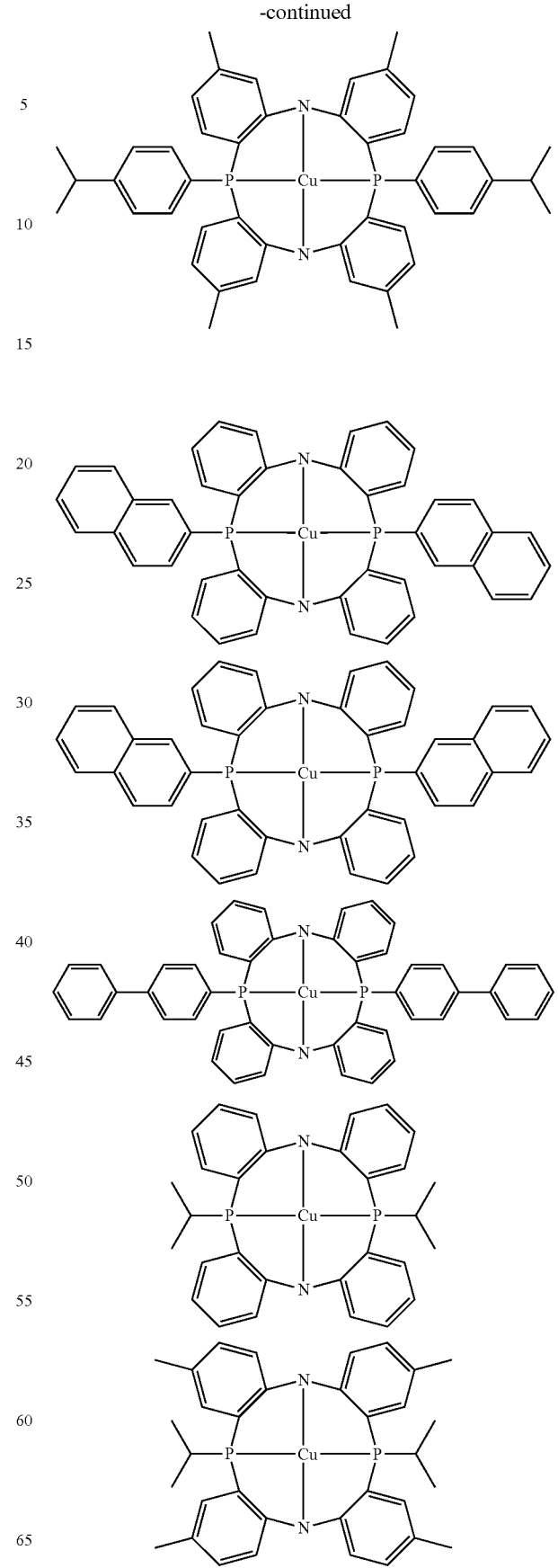

99
-continued
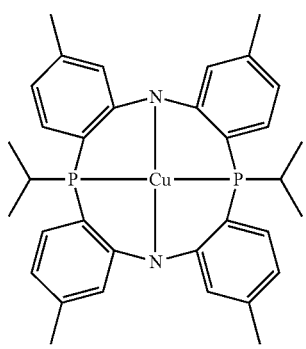
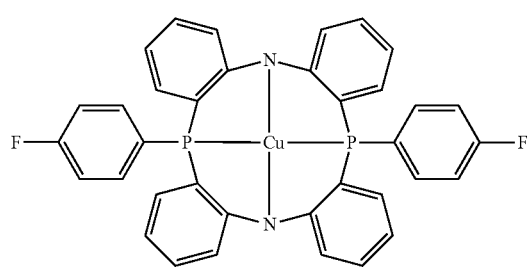
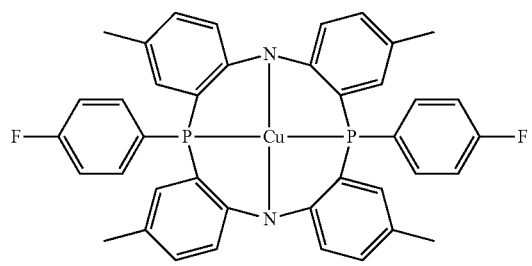
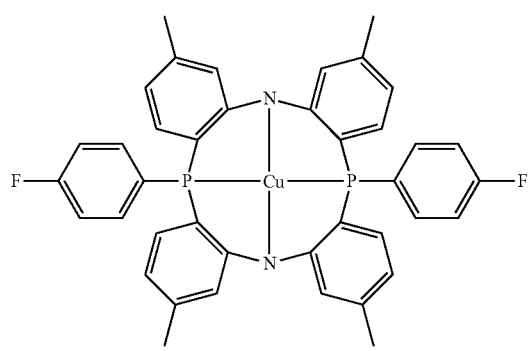
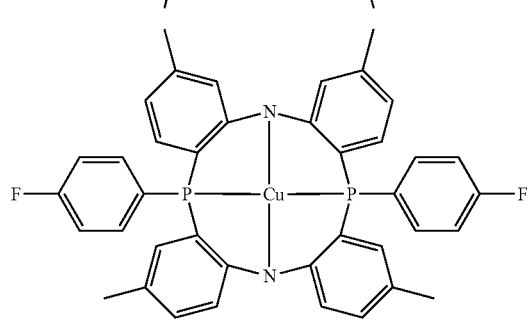
100
-continued
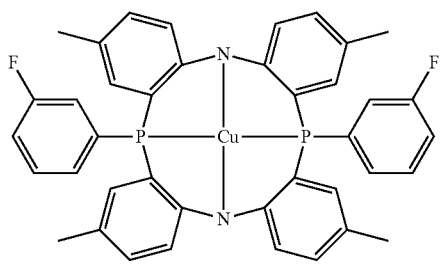
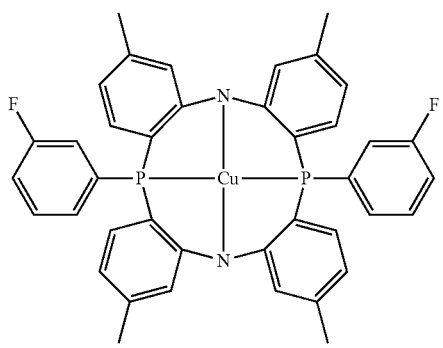
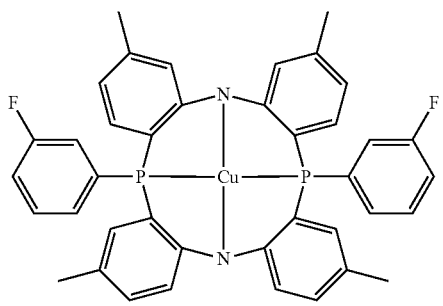
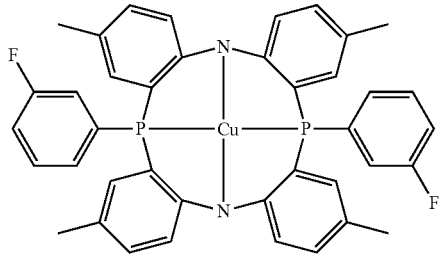
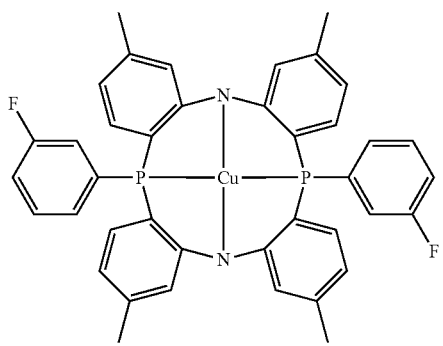

101
-continued
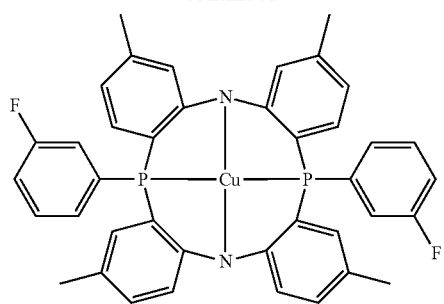
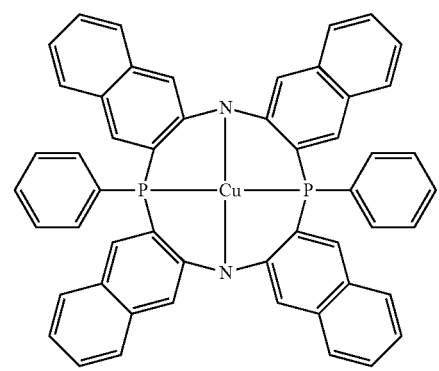
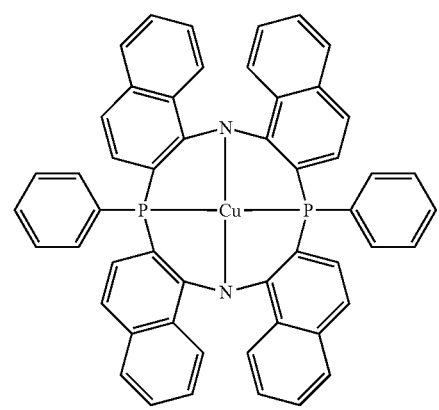
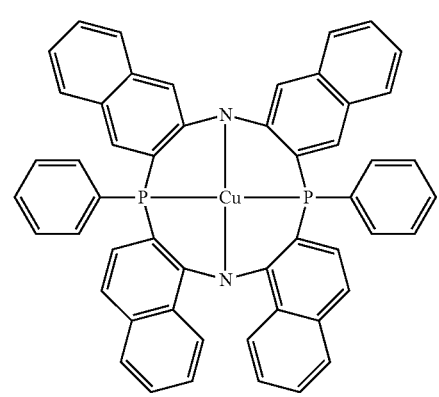
102
-continued
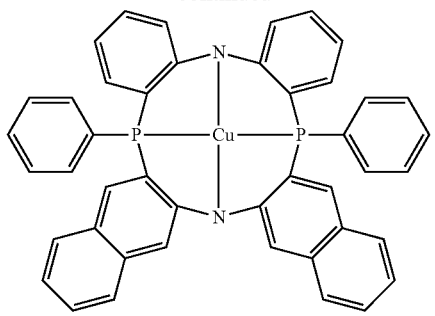
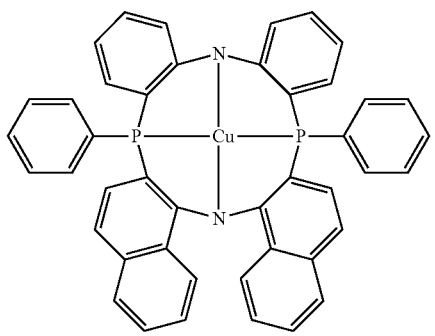
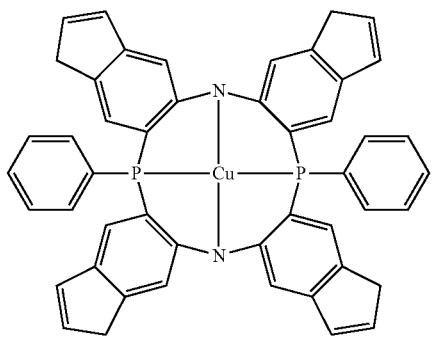
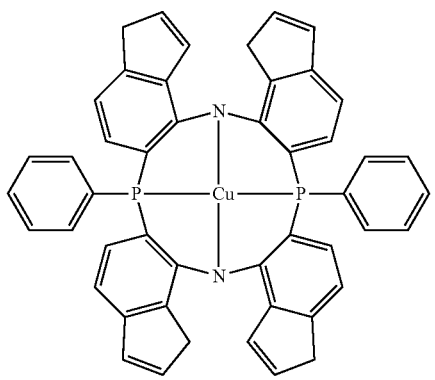
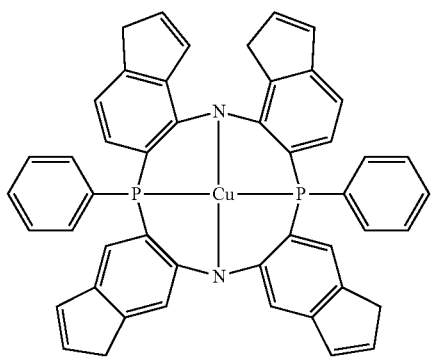

103
-continued
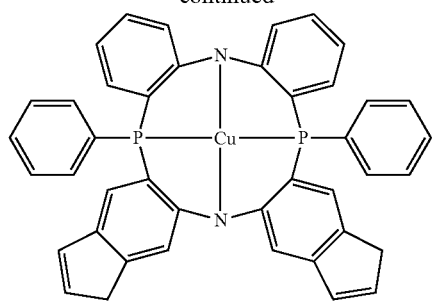
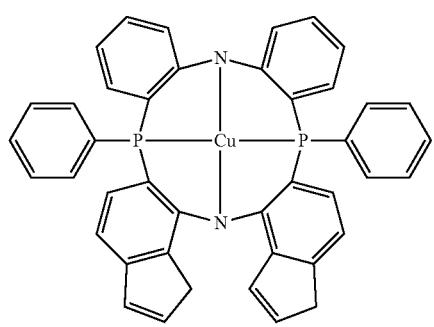
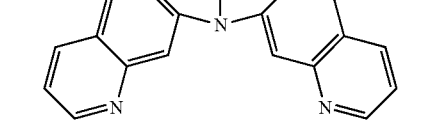
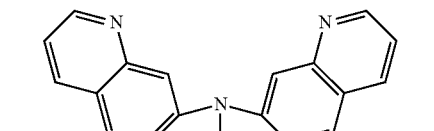
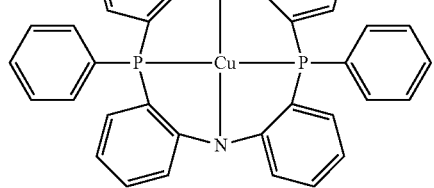
104
-continued
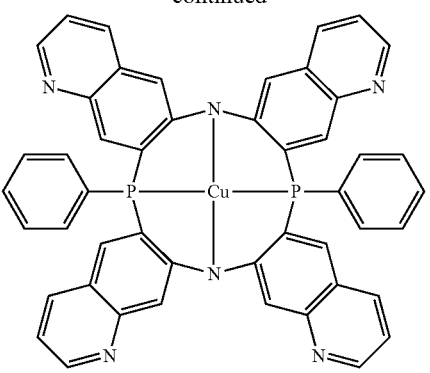
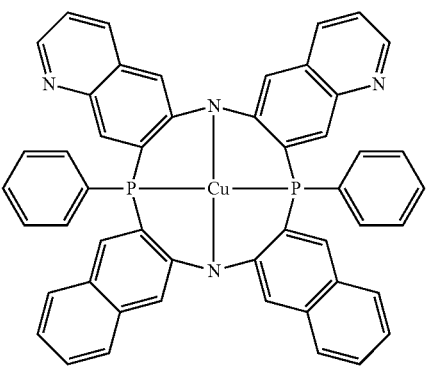
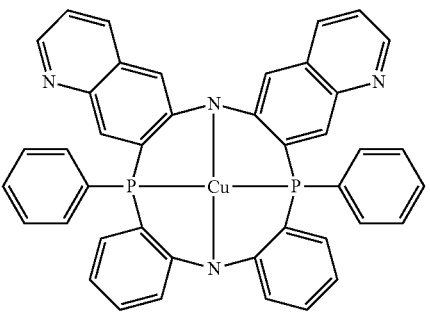
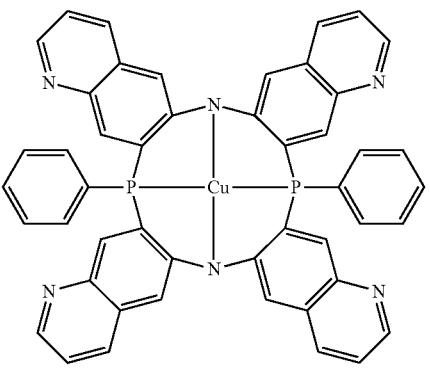

105
-continued
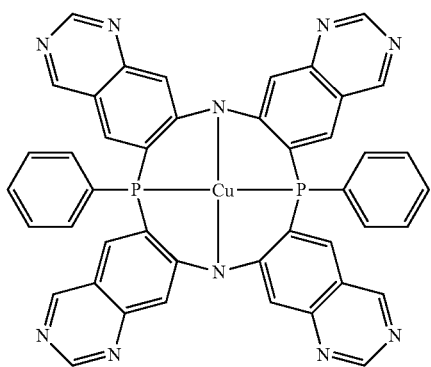
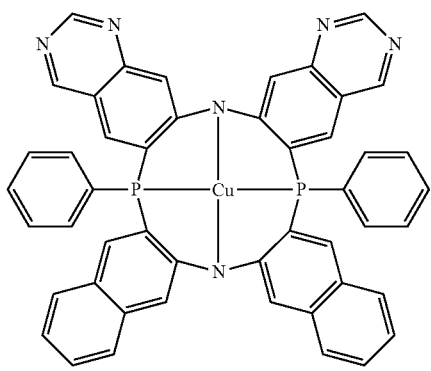
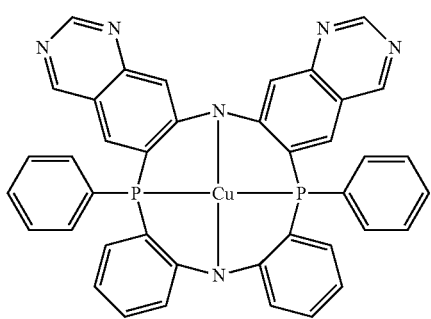
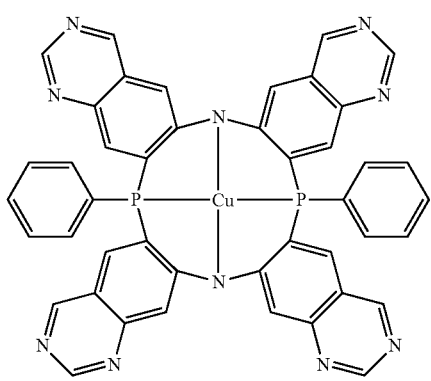
106
-continued
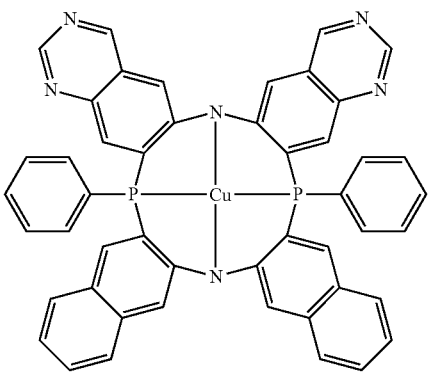
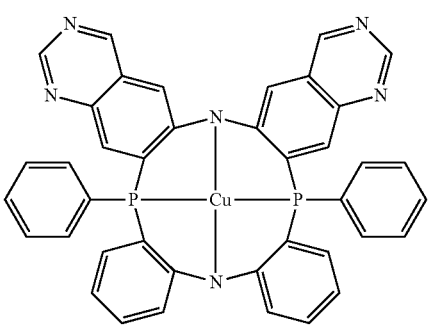
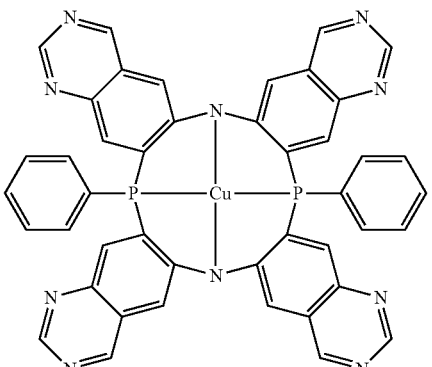
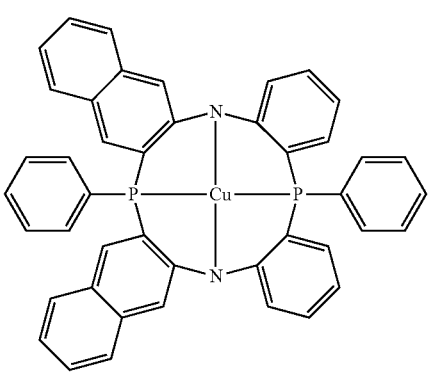

107
-continued
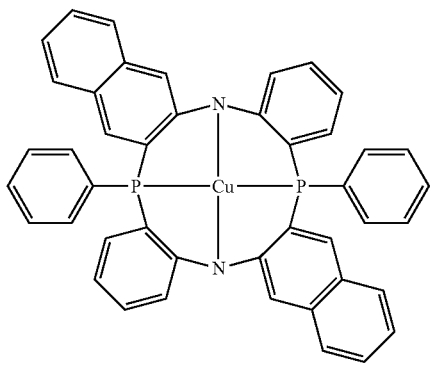
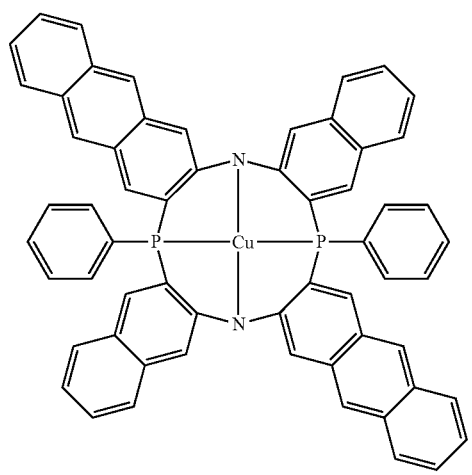
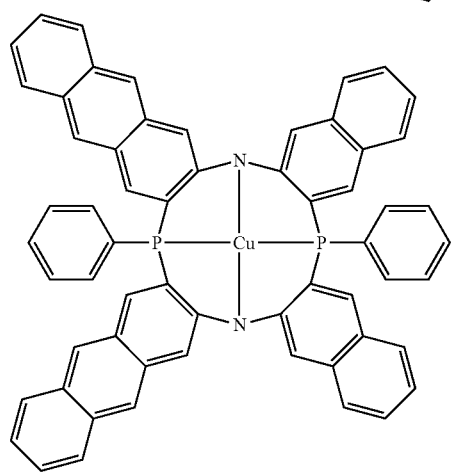
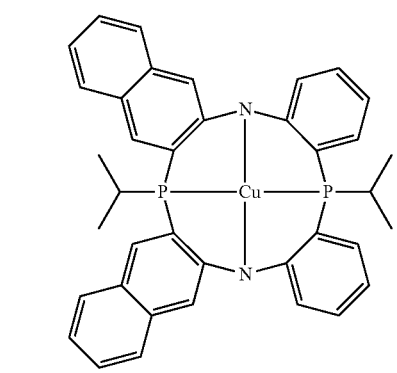
108
-continued
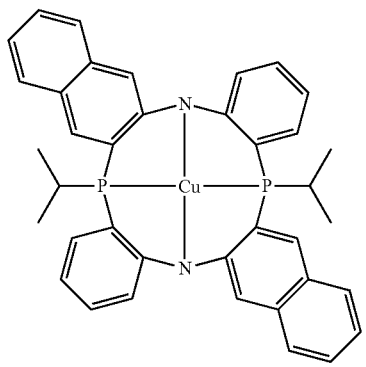
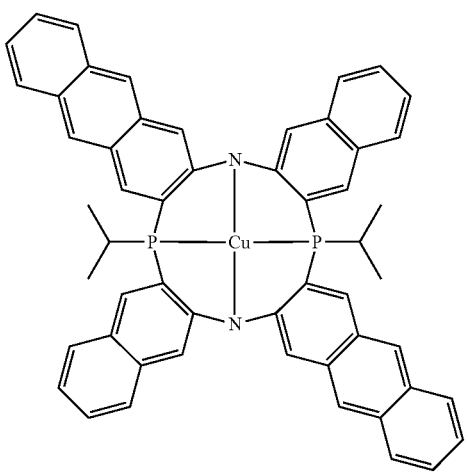
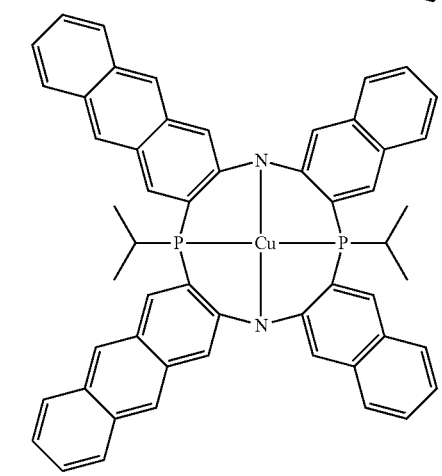
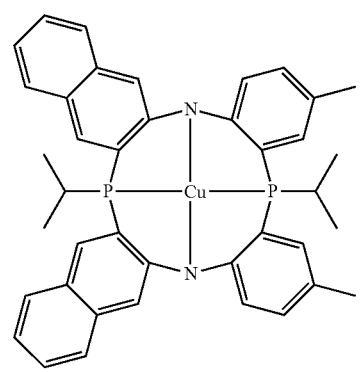

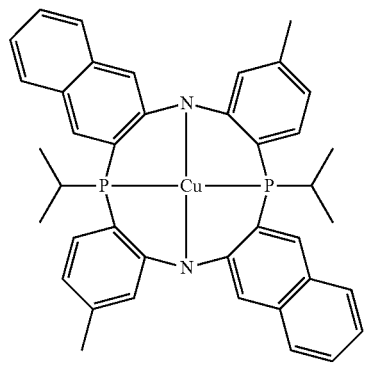
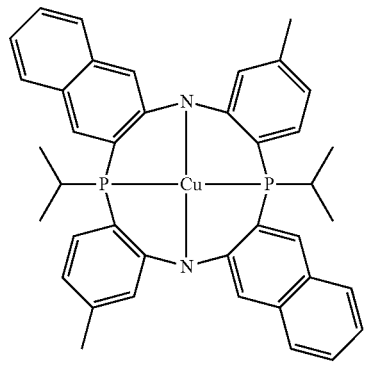
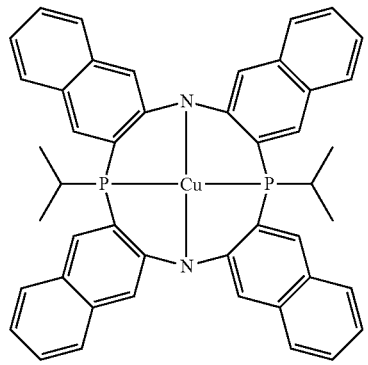
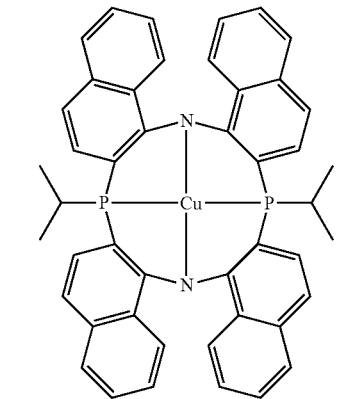
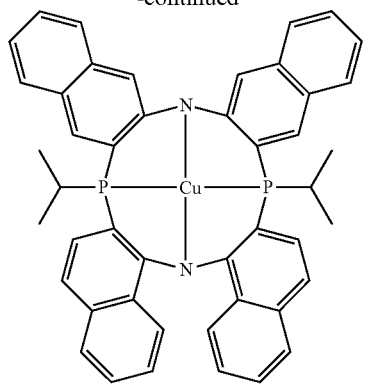
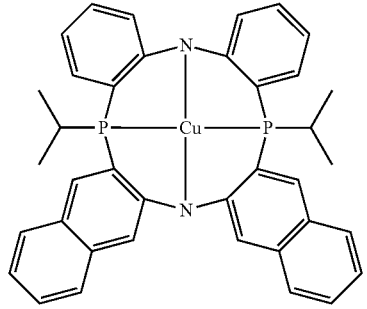
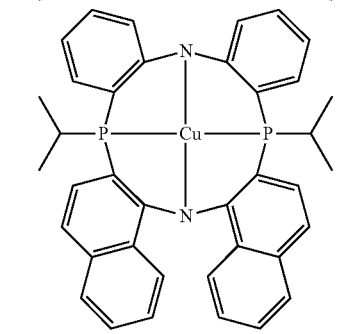
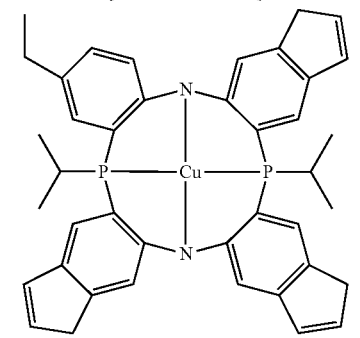
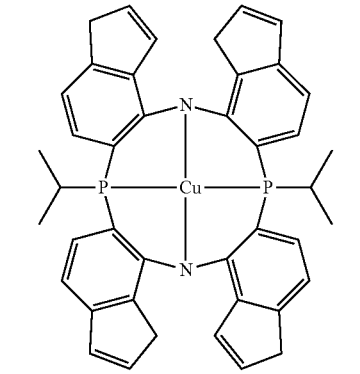

111
-continued
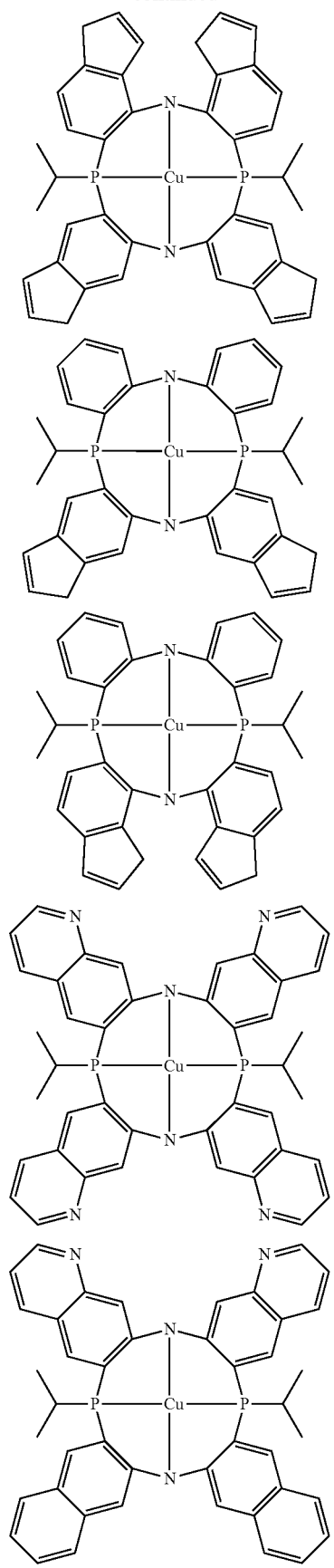
112
-continued
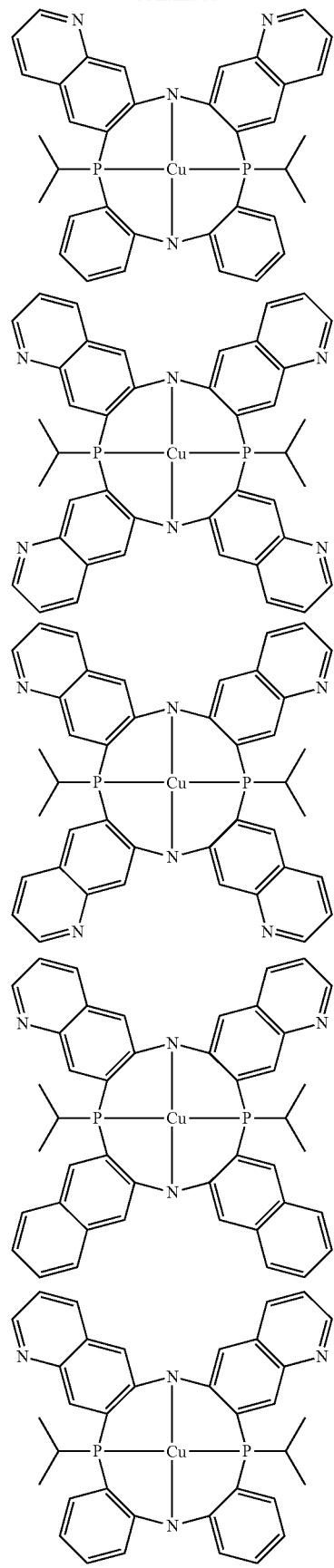

113
-continued
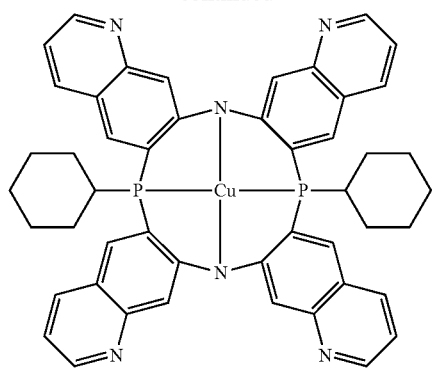
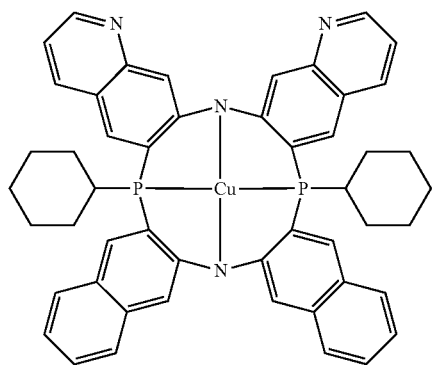
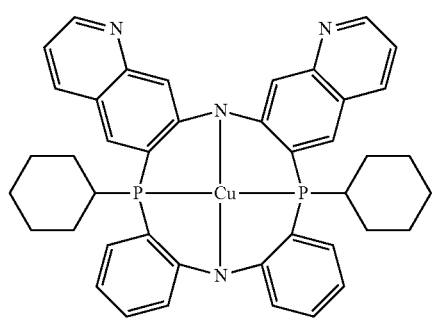
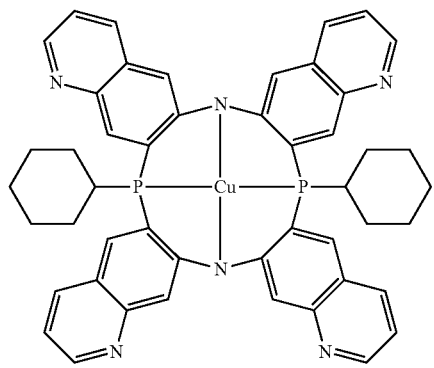
114
-continued
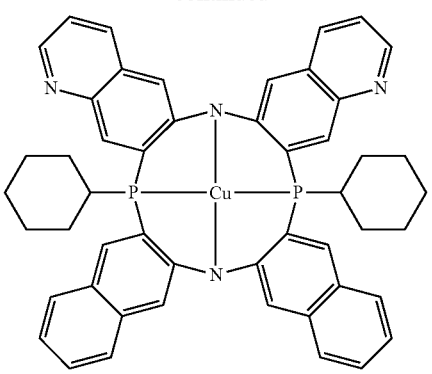
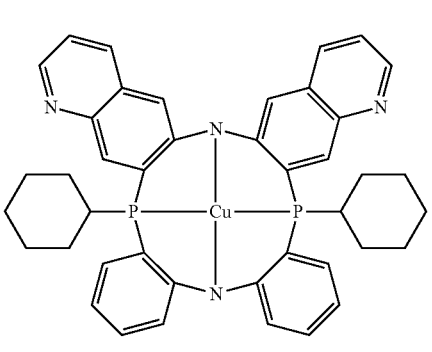
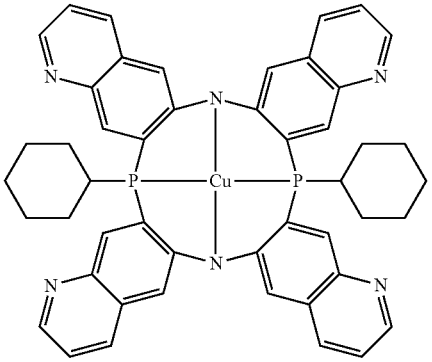
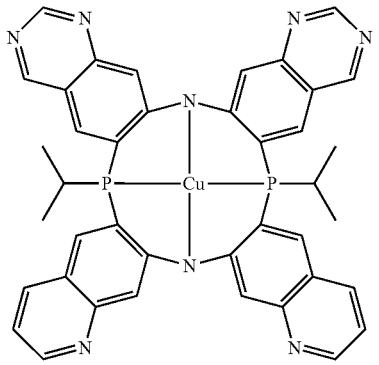

115
-continued
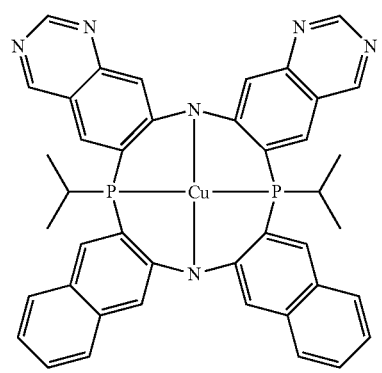
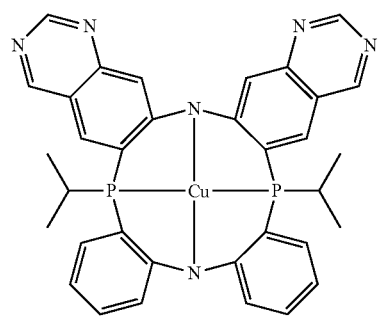
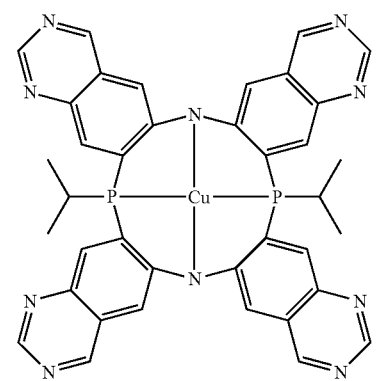
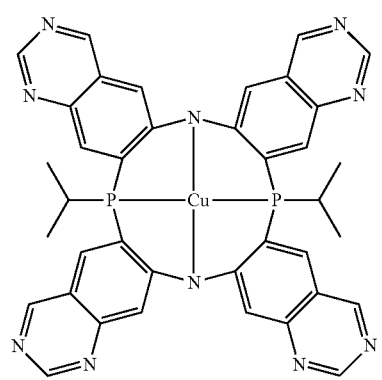
116
-continued
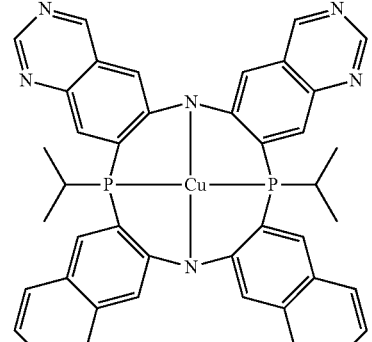
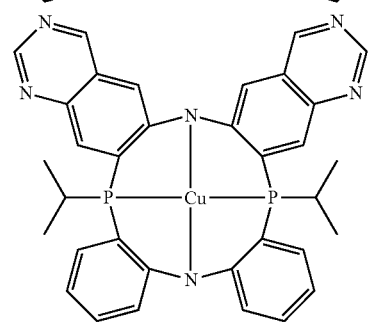
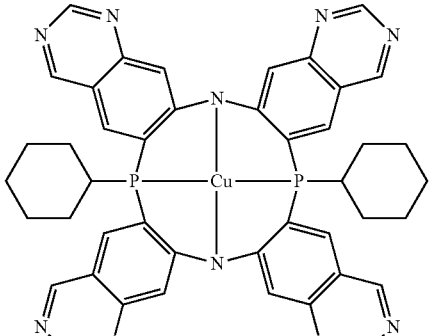
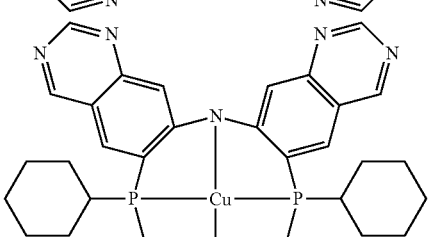
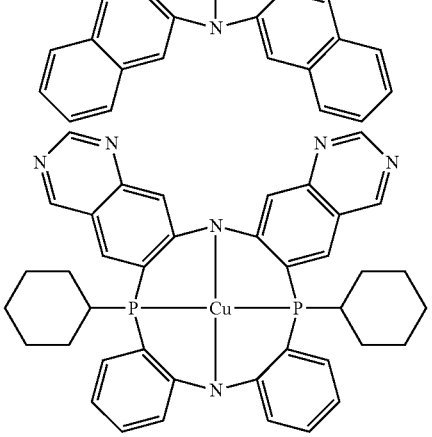

117
-continued
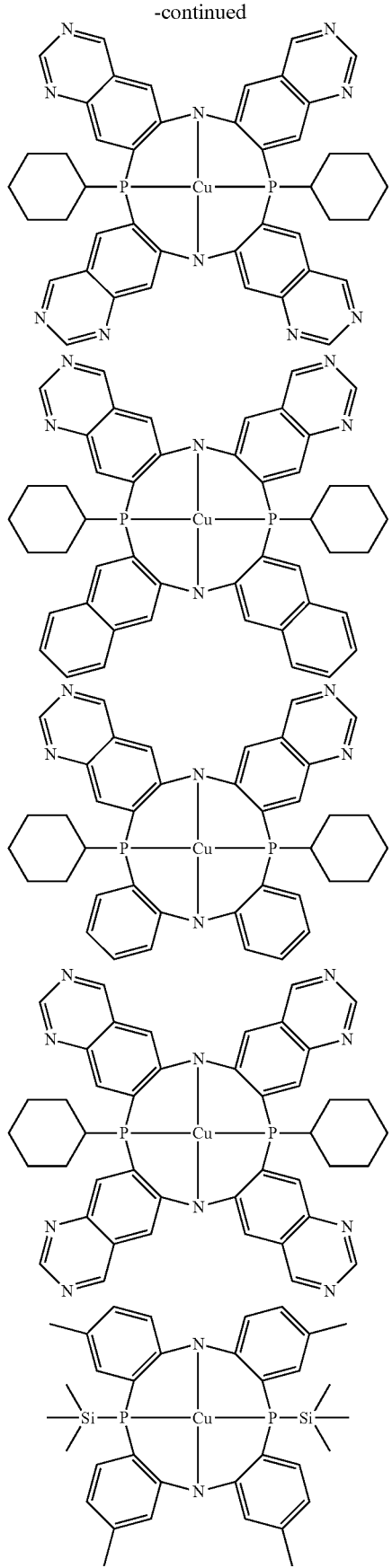
118
-continued
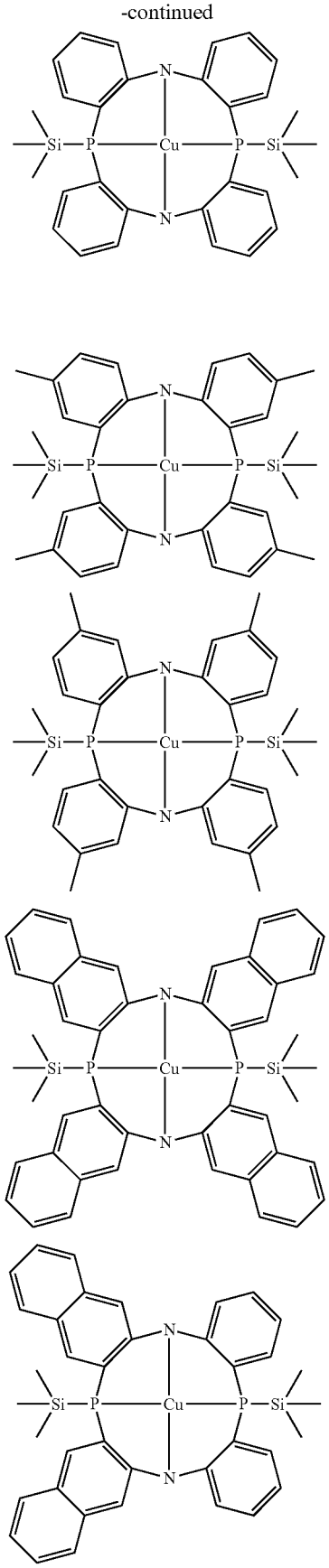

119
-continued
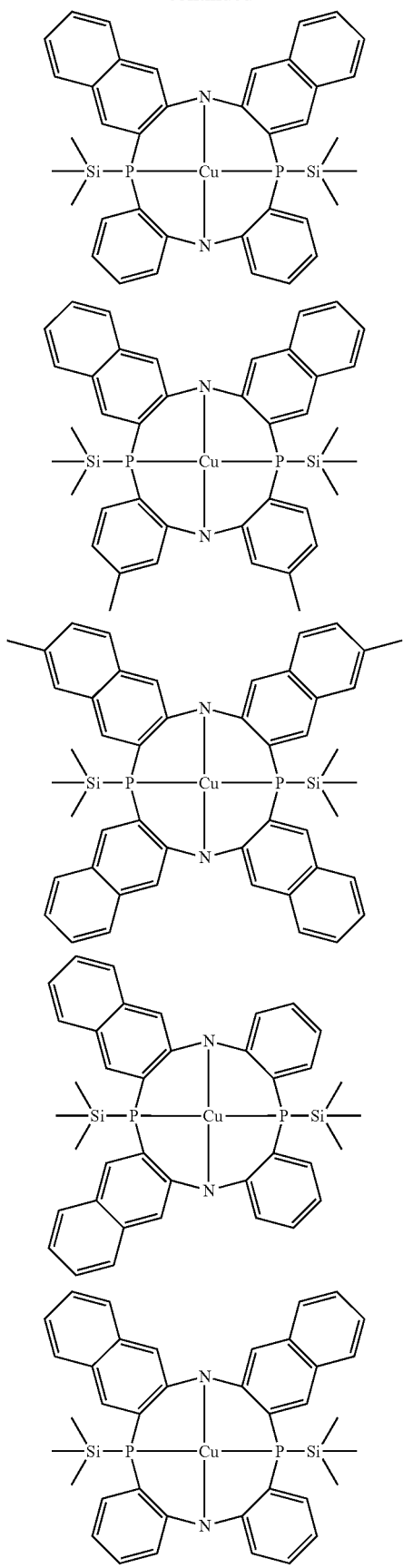
120
-continued
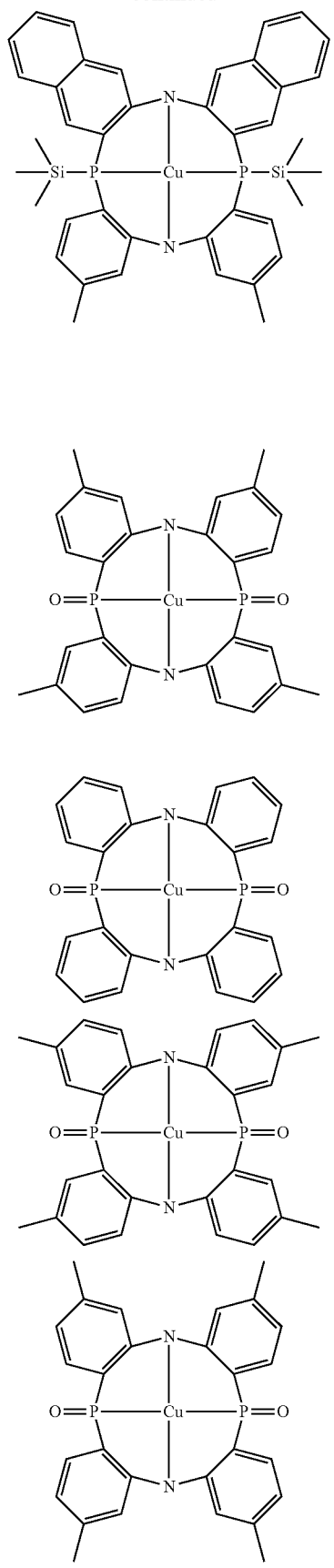

121
-continued
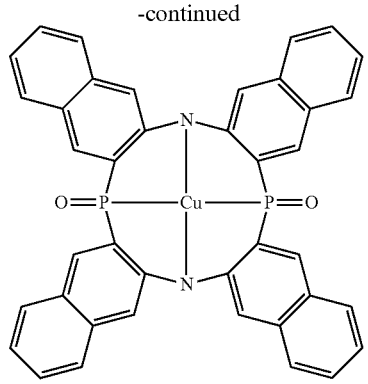
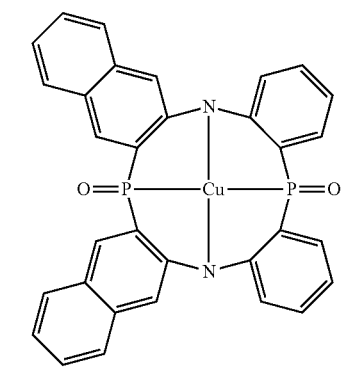
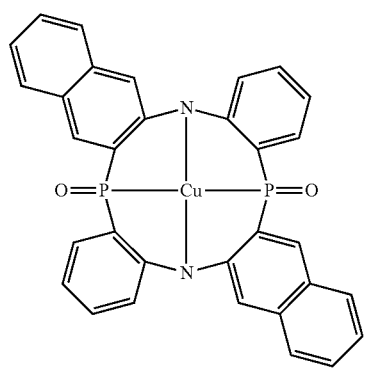
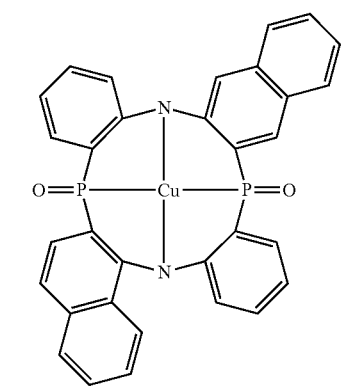
122
-continued
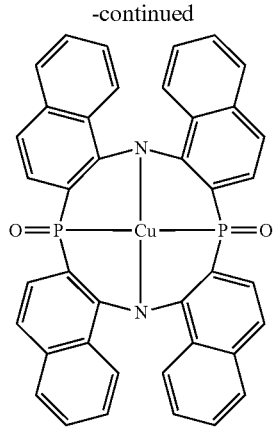
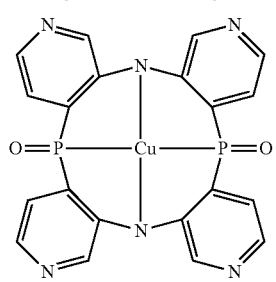
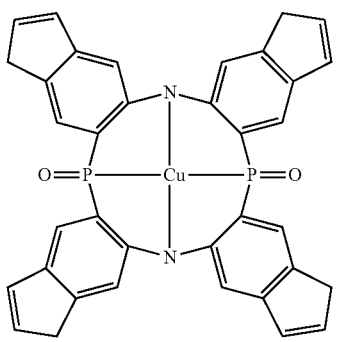
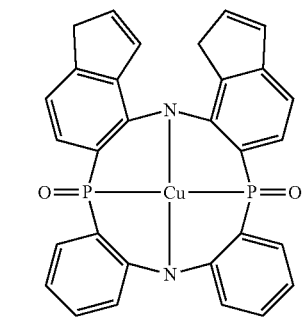
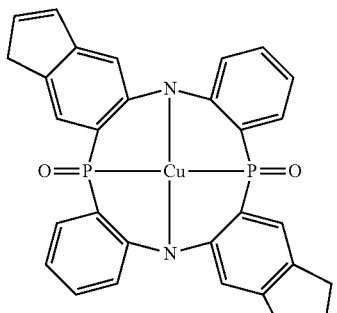

-continued

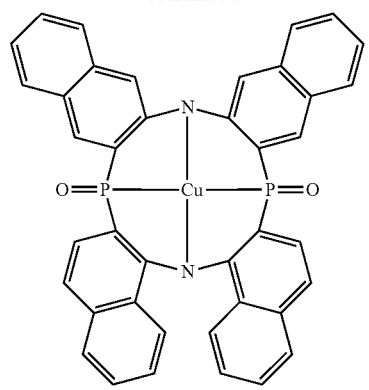
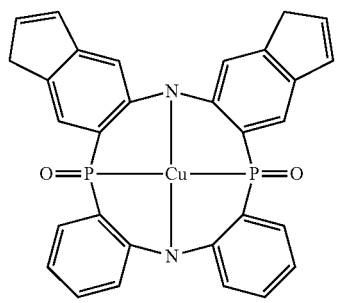
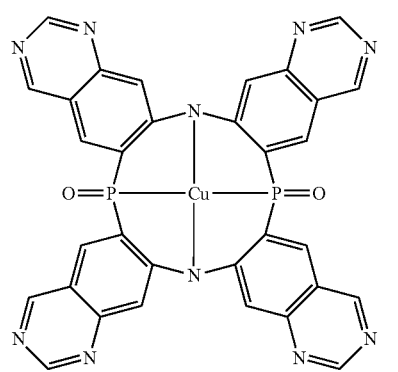
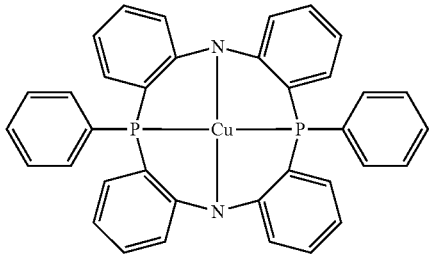
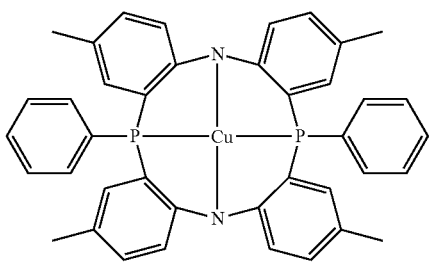

-continued

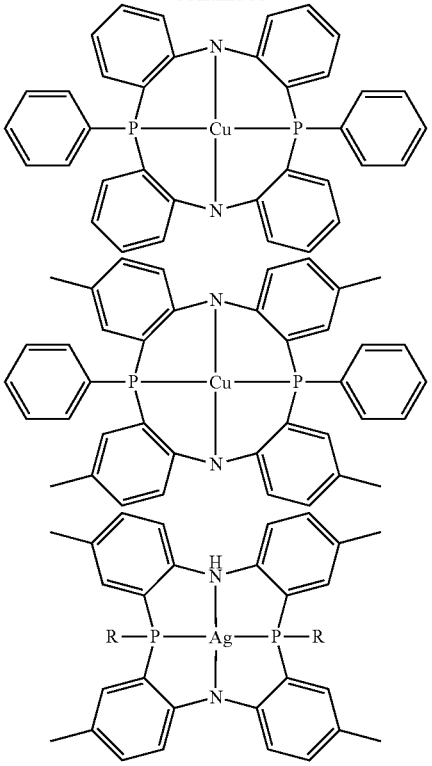

R = iPr wherein iPr represents isopropyl.

6. An organic light-emitting device comprising:
   a first electrode;
   a second electrode; and
   an organic layer between the first electrode and the second electrode,
   wherein the organic layer comprises the organometallic complex according to claim 1.

7. The organic light-emitting device of claim 6, wherein the organic layer comprises an emission layer.

8. The organic light-emitting device of claim 7, wherein the emission layer comprises a compound represented by Formula 3 below:

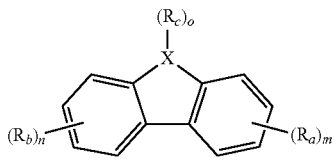

Formula 3 wherein X is C, O, S, or N;
$R_a$, $R_b$, and $R_c$, are each independently a hydrogen atom, a deuterium atom, a halogen atom, a nitro group, a cyano group, a substituted or unsubstituted $C_6$-$C_{20}$ aryl group, a substituted or unsubstituted $C_2$-$C_{60}$ alkenyl group, a substituted or unsubstituted $C_1$-$C_{60}$ heteroaryl group, a substituted or unsubstituted $C_6$-$C_{60}$ arylamino group, or a substituted or unsubstituted $C_6$-$C_{60}$ condensed polycyclic group; and
m and n are each independently an integer from 0 to 4, and when m or n is 2 or greater, a plurality of adjacent $R_a$s or $R_b$s are optionally linked to each other to form a ring;
when X is C, o is 2, when X is O or S, o is 0, and when X is N, o is 1.

9. The organic light-emitting device of claim 8, wherein the plurality of adjacent $R_a$s or $R_b$s are linked to each other to form the ring.

10. The organic light-emitting device of claim 8, wherein $R_a$ and $R_b$ are each independently a hydrogen atom, a deuterium atom, a substituted or unsubstituted $C_2$-$C_{30}$ alkenyl group, a substituted or unsubstituted $C_1$-$C_{30}$ heteroaryl group, a substituted or unsubstituted $C_6$-$C_{30}$ arylamino group, or a compound represented by Formula 4a below:

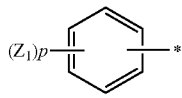
(4a)

wherein $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxy group, or a carboxy group;
p is an integer from 1 to 5; and
\* is a binding site.

11. The organic light-emitting device of claim 8, wherein $R_c$ is represented by one of Formulae 5a to 5c,

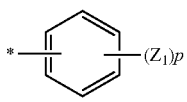
(5a)

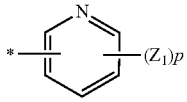
(5b)

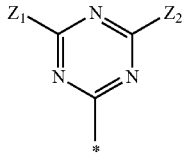
(5c)

wherein $Z_1$ and $Z_2$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_6$-$C_{20}$ arylsilyl group, a substituted or unsubstituted $C_1$-$C_{20}$ heteroaryl group, a substituted or unsubstituted $C_6$-$C_{20}$ condensed polycyclic group, a halogen atom, a cyano group, a nitro group, a hydroxy group, or a carboxy group;
p is an integer from 1 to 5; and
\* is a binding site.

12. The organic light-emitting device of claim 8, wherein X of Formula 3 is N.

13. The organic light-emitting device of claim 8, wherein the compound of Formula 3 is a host.

14. The organic light-emitting device of claim 8, wherein the compound of Formula 3 is represented by one of the following compounds:

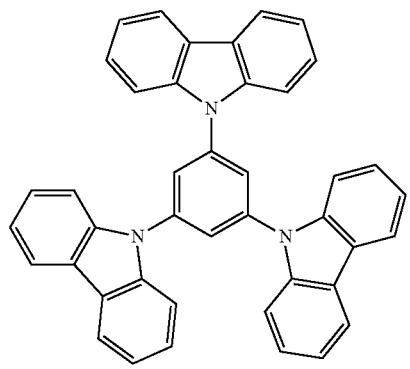
(1)

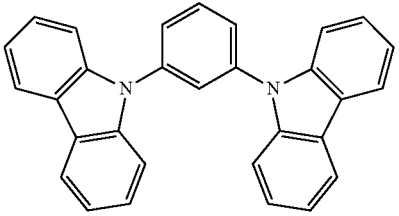
(2)

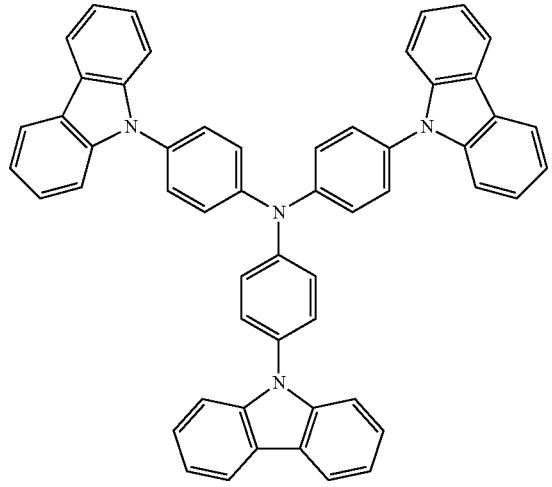
(3)

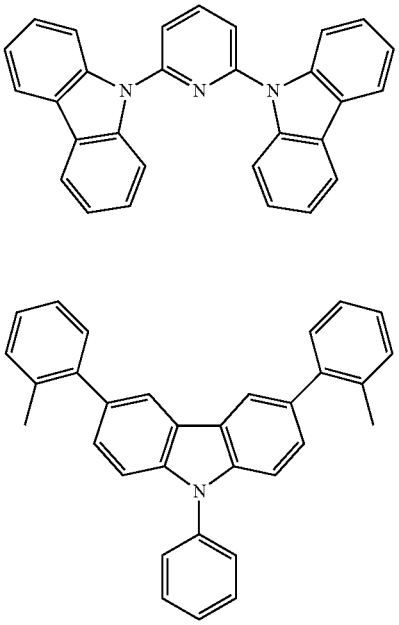
(4)

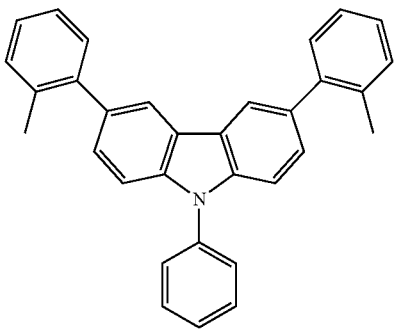
(5)

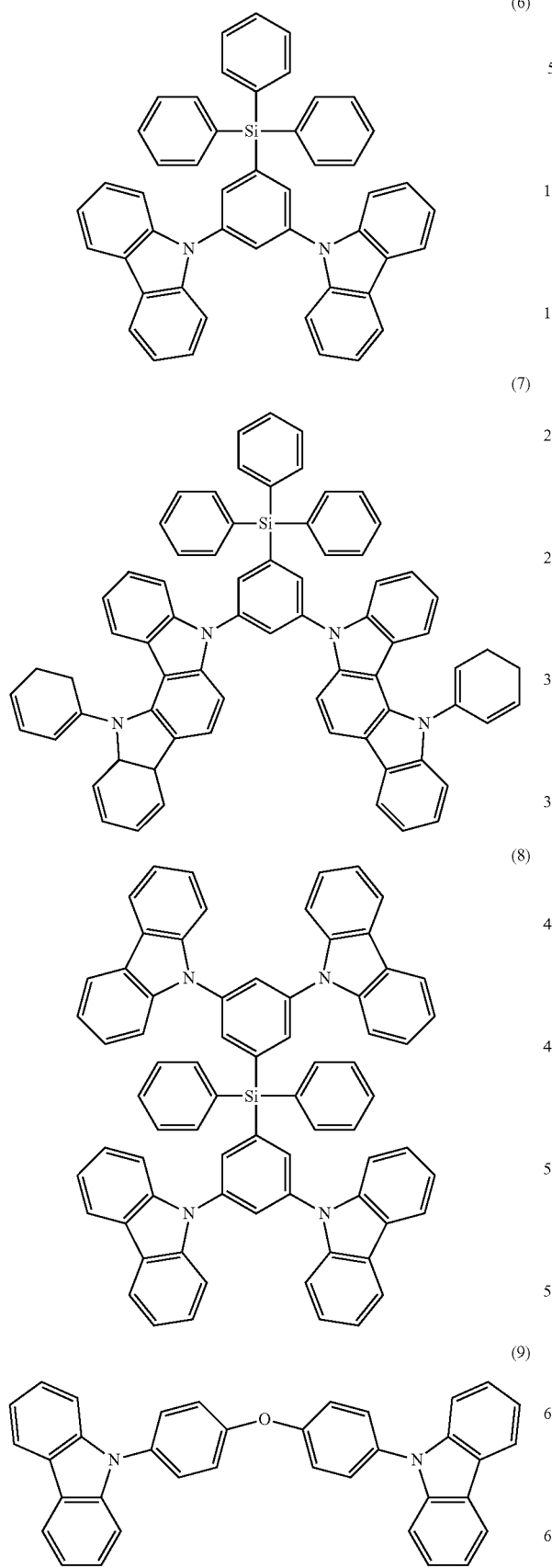
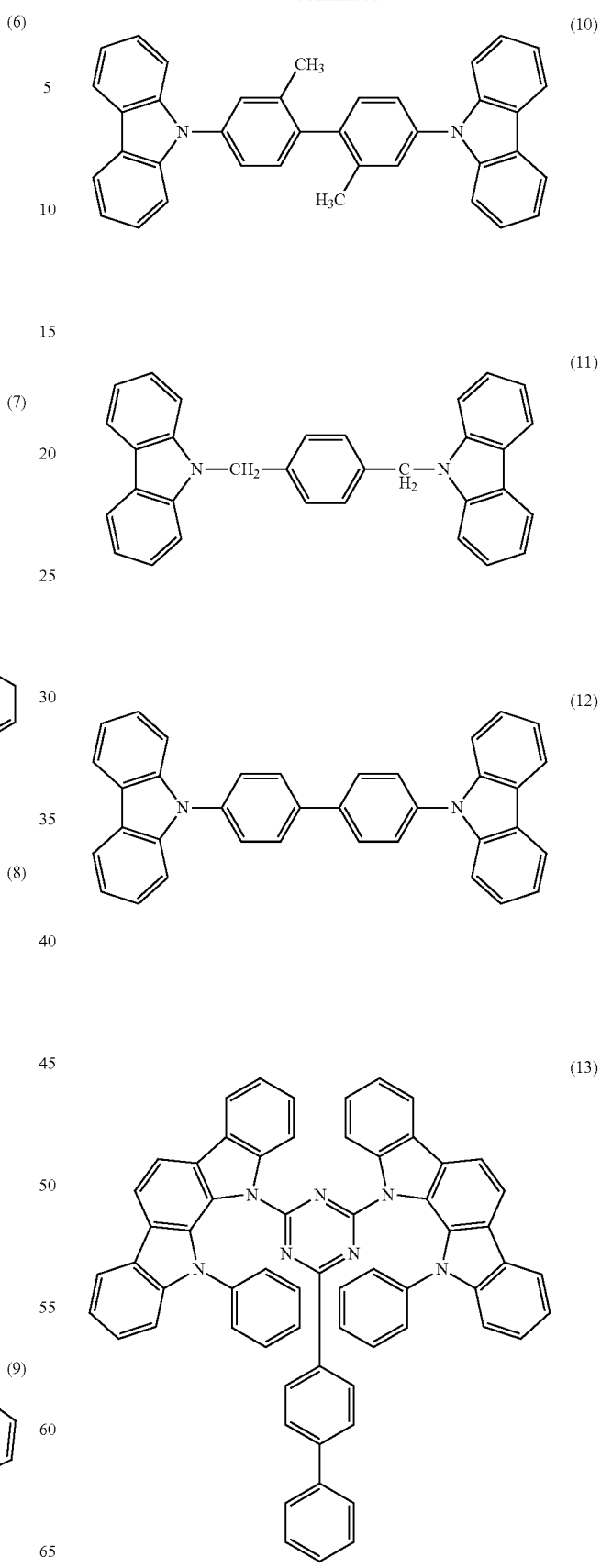

(14) 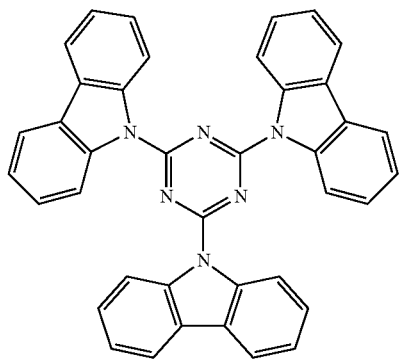
(15) 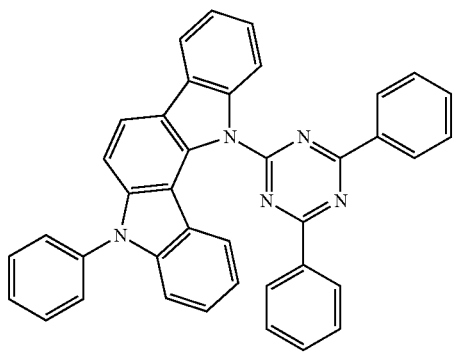
(16) 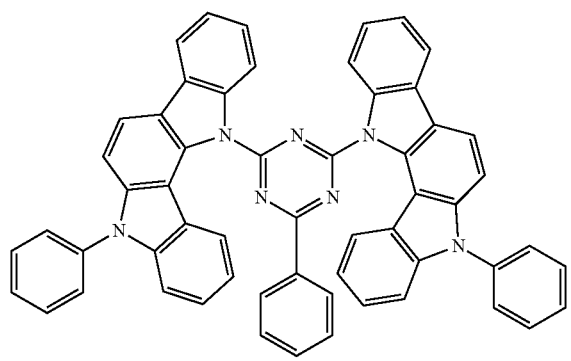
(17) 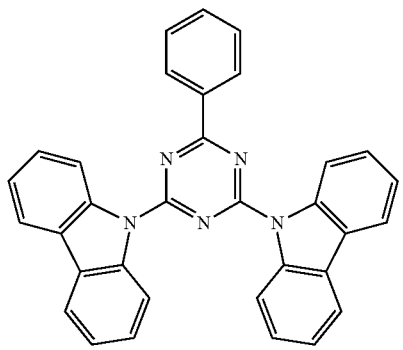
(18) 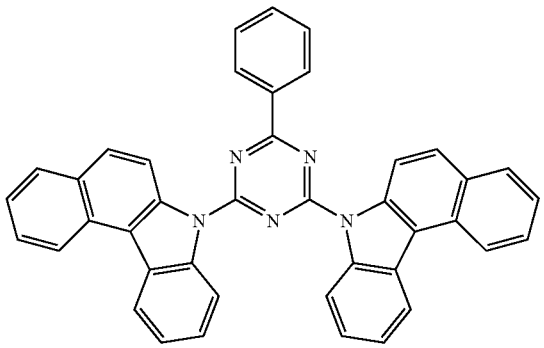
(19) 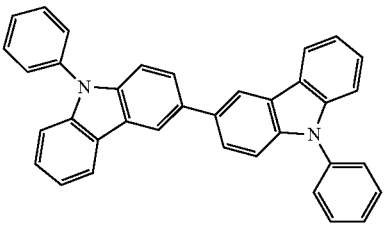
(20) 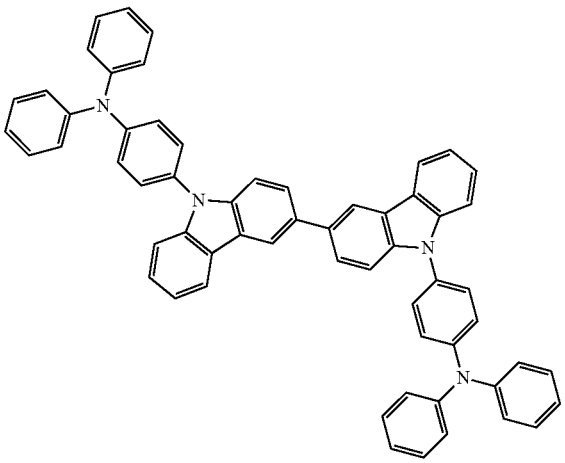
(21) 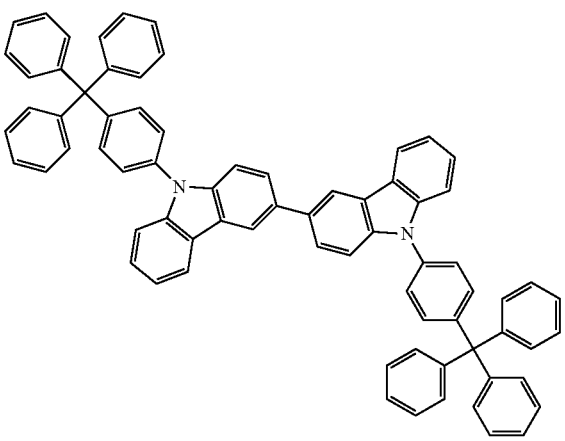

-continued
(22)
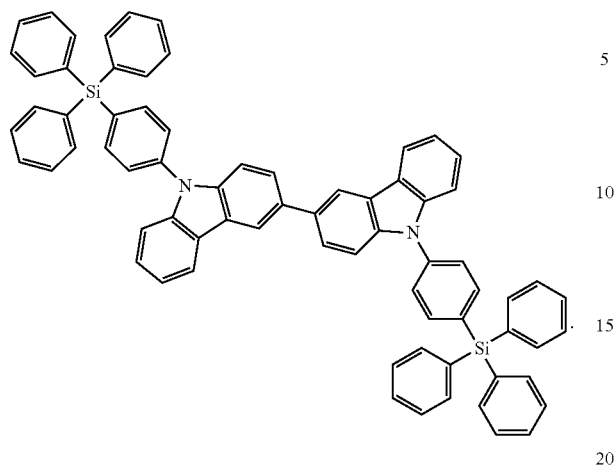
15. A flat panel display device comprising the organic light-emitting device of claim 6, wherein the first electrode of the organic light-emitting device is electrically connected to a source electrode or a drain electrode of a thin-film transistor.
* * * * *